(12) United States Patent
Iwashita et al.

(10) Patent No.: US 9,618,843 B2
(45) Date of Patent: Apr. 11, 2017

(54) RESIST COMPOSITION AND METHOD OF FORMING RESIST PATTERN

(75) Inventors: Jun Iwashita, Kawasaki (JP); Kensuke Matsuzawa, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 74 days.

(21) Appl. No.: 13/424,183

(22) Filed: Mar. 19, 2012

(65) Prior Publication Data

US 2012/0251951 A1    Oct. 4, 2012

(30) Foreign Application Priority Data

Mar. 25, 2011    (JP) .................................. 2011-068798

(51) Int. Cl.
G03F 7/004 (2006.01)
G03F 7/039 (2006.01)
G03F 7/20 (2006.01)

(52) U.S. Cl.
CPC .......... G03F 7/0045 (2013.01); G03F 7/0046 (2013.01); G03F 7/0397 (2013.01); G03F 7/2041 (2013.01)

(58) Field of Classification Search
CPC ............................. G03F 7/0045; G03F 7/0397
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,444,397 B2 | 9/2002 | Hada et al. | |
| 6,949,325 B2 | 9/2005 | Li et al. | |
| 7,074,543 B2 | 7/2006 | Iwai et al. | |
| 7,504,194 B2 * | 3/2009 | Fukuhara et al. | 430/270.1 |
| 2003/0054286 A1 | 3/2003 | Sato et al. | |
| 2005/0003303 A1* | 1/2005 | Watanabe et al. | 430/296 |
| 2007/0122750 A1* | 5/2007 | Yamaguchi et al. | 430/311 |
| 2008/0085464 A1* | 4/2008 | Shibuya et al. | 430/270.1 |
| 2008/0187860 A1 | 8/2008 | Tsubaki et al. | |
| 2008/0305432 A1 | 12/2008 | Kanna | |
| 2009/0130597 A1* | 5/2009 | Seshimo et al. | 430/285.1 |
| 2009/0234155 A1* | 9/2009 | Oh | C07C 25/18 562/100 |
| 2009/0297980 A1 | 12/2009 | Iwashita et al. | |
| 2010/0015552 A1* | 1/2010 | Kawaue | C07C 309/09 430/281.1 |
| 2010/0081080 A1* | 4/2010 | Iwashita et al. | 430/270.1 |
| 2010/0129738 A1* | 5/2010 | Takemura et al. | 430/5 |
| 2010/0136479 A1* | 6/2010 | Yamaguchi | C07C 309/17 430/270.1 |

FOREIGN PATENT DOCUMENTS

EP    1635218 A2 *    3/2006
JP    A-09-208554    8/1997

(Continued)

OTHER PUBLICATIONS

English Translation of JP2010008912.*

(Continued)

*Primary Examiner* — Cynthia H Kelly
*Assistant Examiner* — Anna Malloy
(74) *Attorney, Agent, or Firm* — Knobbe Martens Olson & Bear LLP

(57) ABSTRACT

A resist composition including:
   a base component (A) that exhibits changed solubility in a developing solution by action of acid; and
   an acid generator component (B) that generates acid upon exposure,
   wherein the base component (A) includes a resin component (A1) containing a structural unit (a0) represented by general formula (a0-1) shown below or general formula (a0-2) shown below; and
   the acid generator component (B) includes an acid generator (B1) including a compound represented by general formula (b0-1) or (b0-2) shown below.

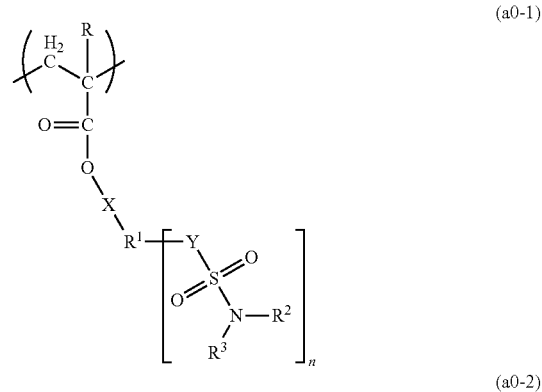

(a0-1)

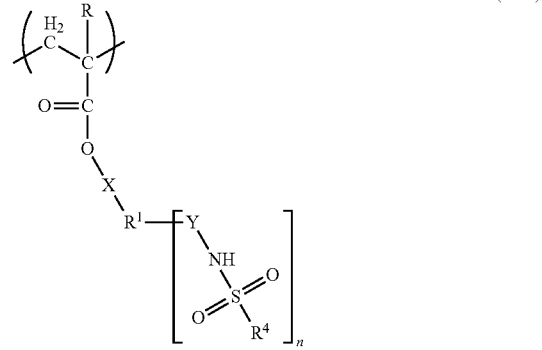

(a0-2)

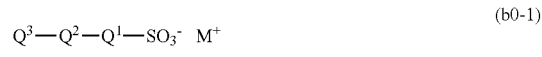

(b0-1)

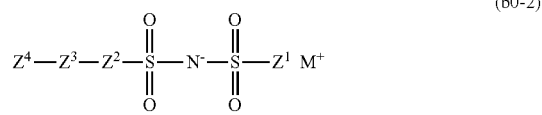

(b0-2)

6 Claims, No Drawings

(56) References Cited

FOREIGN PATENT DOCUMENTS

| | | |
|---|---|---|
| JP | A-11-035551 | 2/1999 |
| JP | A-11-035552 | 2/1999 |
| JP | A-11-035573 | 2/1999 |
| JP | A-11-322707 | 11/1999 |
| JP | A-2000-206694 | 7/2000 |
| JP | A-2002-372784 | 12/2002 |
| JP | A-2003-241385 | 8/2003 |
| JP | A-2004-126013 | 4/2004 |
| JP | A-2005-023304 | 1/2005 |
| JP | A-2005-037888 | 2/2005 |
| JP | A-2005-336452 | 8/2005 |
| JP | A-2006-243309 | 9/2006 |
| JP | A-2006-259582 | 9/2006 |
| JP | A-2006-317803 | 11/2006 |
| JP | 2007086615 A * | 4/2007 |
| JP | A-2008-223000 | 9/2008 |
| JP | A-2008-242271 | 10/2008 |
| JP | A-2008-292975 | 12/2008 |
| JP | 2009237170 A * | 10/2009 |
| JP | 2009244780 A * | 10/2009 |
| JP | A-2009-242361 | 10/2009 |
| JP | A-2009-288441 | 12/2009 |
| JP | 2010008912 A * | 1/2010 |
| JP | A-2010-008912 | 1/2010 |
| JP | A-2010-122421 | 6/2010 |
| JP | A-2010-286831 | 12/2010 |
| WO | WO 2004/074242 A2 | 9/2004 |
| WO | WO 2008/099727 A1 | 8/2008 |

OTHER PUBLICATIONS

English Translation of JP2009237170.*
English Translation of JP2009244780.*
Office Action in Japanese Patent Application No. 2011-068798, mailed Sep. 9, 2014.
Office Action in Taiwanese Patent Application No. 101109698, mailed Aug. 13, 2015.

* cited by examiner

RESIST COMPOSITION AND METHOD OF FORMING RESIST PATTERN

BACKGROUND OF THE INVENTION

Field of the Invention

The present invention relates to a resist composition containing a base component which generates acid upon exposure and also exhibits changed solubility in a developing solution under the action of acid, and a method of forming a resist pattern using the resist composition.

Priority is claimed on Japanese Patent Application No. 2011-068798, filed Mar. 25, 2011, the content of which is incorporated herein by reference.

Description of Related Art

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as extreme ultraviolet radiation (EUV), electron beam (EB) and X ray.

Resist materials for use with these types of exposure light sources require lithography properties such as a high resolution capable of reproducing patterns of minute dimensions, and a high level of sensitivity to these types of exposure light sources.

As a resist material which satisfies these conditions, a chemically amplified resist composition has been used conventionally, which includes an acid generator component that generates acid upon exposure and a base component that exhibits a changed solubility in a developing solution under the action of acid.

Resins (base resins) are typically used as the base components for chemically amplified resist compositions.

For example, in an alkali developing process where an alkali developing solution is used as a developing solution, a chemically amplified resist composition for forming a positive resist pattern typically contains an acid generator component and a resin component that exhibits increased solubility in an alkali developing solution under the action of acid. If the resist film formed using the resist composition is selectively exposed during formation of a resist pattern, then within the exposed portions, acid is generated from the acid generator component, and the action of this acid causes an increase in the solubility of the resin component in an alkali developing solution, making the exposed portions soluble in the alkali developing solution. Therefore, a positive resist pattern in which the unexposed portions are remaining is formed by alkali developing.

As the resin component, a resin that exhibits increased polarity under the action of acid is typically used. When the polarity of the resin is increased, the solubility in an alkali developing solution increases whereas the solubility in an organic solvent is decreased. Therefore, when such a resin is applied to a solvent developing process using a developing solution containing an organic solvent (organic developing solution) instead of an alkali developing process, the solubility of the exposed portions in an organic developing solution is decreased. As a result, in the solvent developing process, the unexposed portions of the resist film are dissolved and removed by the organic developing solution, and a negative resist pattern in which the exposed portions are remaining is formed. This type of solvent developing process for forming a negative resist pattern is sometimes referred to as a "negative developing process" (for example, see Patent Document 1).

Currently, resins that contain structural units derived from (meth)acrylate esters within the main chain (acrylic resins) are now widely used as base resins for chemically amplified resist compositions that use ArF excimer laser lithography, as they exhibit excellent transparency in the vicinity of 193 nm (for example, see Patent Document 2). Here, the term "(meth)acrylate ester" is a generic term that includes either or both of the acrylate ester having a hydrogen atom bonded to the $\alpha$-position and the methacrylate ester having a methyl group bonded to the $\alpha$-position. The term "(meth)acrylate" is a generic term that includes either or both of the acrylate having a hydrogen atom bonded to the $\alpha$-position and the methacrylate having a methyl group bonded to the $\alpha$-position. The term "(meth)acrylic acid" is a generic term that includes either or both of acrylic acid having a hydrogen atom bonded to the $\alpha$-position and methacrylic acid having a methyl group bonded to the $\alpha$-position.

In general, the base resin contains a plurality of structural units for improving lithography properties and the like. For example, when the resin component is a resin that exhibits increased polarity under the action of acid, the resin typically contains a structural unit having an acid decomposable group which is decomposed by the action of an acid generated from the acid generator component to increase the polarity, as well as a structural unit having a polar group such as a hydroxyl group, a structural unit having a lactone structure, and the like. In particular, the structural units having a polar group are widely used, since the compatibility with an alkali developing solution is improved, which contributes to favorable improvements in the resolution.

In recent years, base resins containing a —$SO_2$—NH— structure have been proposed (see, for example, Patent Documents 3 and 4). It is thought that these base resins exhibit excellent transparency in the vicinity of 193 nm wavelength and an adequate level of acidity, thereby contributing to the overall improvement of lithography properties in terms of high sensitivity, resolution and roughness.

As acid generators usable in a chemically amplified resist composition, various types have been proposed including, for example, onium salt-based acid generators; oxime sulfonate-based acid generators; diazomethane-based acid generators; nitrobenzylsulfonate-based acid generators; iminosulfonate-based acid generators; and disulfone-based acid generators. Of these, as an onium salt-based acid generator, iodonium salts containing an iodonium ion as the cation and sulfonium salts containing a sulfonium ion as the cation have been conventionally used. As an anion (acid) that forms a salt with these cations, a fluorinated alkylsulfonic acid ion is generally used (for example, see Patent Document 5). Further, as an anion, those having a —SO₂—N—SO₂ structure have been proposed (for example, see Patent Document 6).

DOCUMENTS OF RELATED ART

Patent Document

[Patent Document 1] Japanese Unexamined Patent Application, First Publication No. 2008-292975
[Patent Document 2] Japanese Unexamined Patent Application, First Publication No. 2003-241385
[Patent Document 3] Japanese Unexamined Patent Application, First Publication No. 2006-243309
[Patent Document 4] Japanese Unexamined Patent Application, First Publication No. 2008-223000
[Patent Document 5] Japanese Unexamined Patent Application, First Publication No. 2005-037888
[Patent Document 6] Japanese Unexamined Patent Application, First Publication No. 2010-008912

SUMMARY OF THE INVENTION

In the future, as further progress is expected to be made in lithography techniques and the application field for lithography techniques is expected to expand, development of a novel material for use in lithography will be desired. For example, further progress in pattern miniaturization will result in ever greater demands for improvements in resist materials in terms of various lithography properties such as the resolution, exposure latitude (EL margin) and roughness reduction.

The term "roughness" refers to surface roughness within the resist pattern, which causes unsatisfactory resist pattern shapes. For example, roughness of the line width (line width roughness (LWR)) can cause various defects such as non-uniformity of the line width of line and space patterns.

Such defects in the shape of the resist pattern may adversely affect the formation of very fine semiconductor devices and the like, and the improvements therefor become more important as the miniaturization of pattern progresses.

The present invention takes the above circumstances into consideration, with an object of providing a resist composition which exhibits excellent lithography properties and is capable of forming a resist pattern of favorable shape, and a method of forming a resist pattern.

A first aspect of the present invention for solving the above problems is a resist composition including a base component (A) that exhibits changed solubility in a developing solution under the action of acid and an acid generator component (B) that generates acid upon exposure, wherein the base component (A) includes a resin component (A1) containing a structural unit (a0) represented by general formula (a0-1) shown below or general formula (a0-2) shown below; and the acid generator component (B) includes an acid generator (B1) including a compound represented by general formula (b0-1) or (b0-2) shown below.

[Chemical Formula 1]

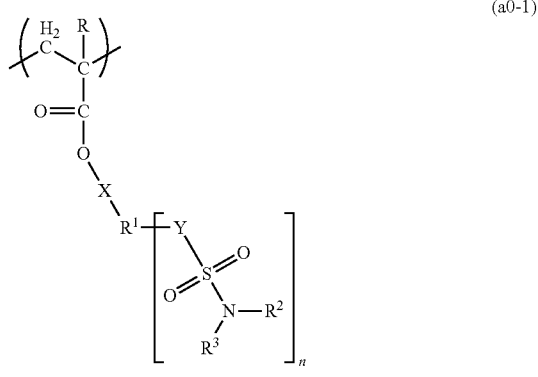

(a0-1)

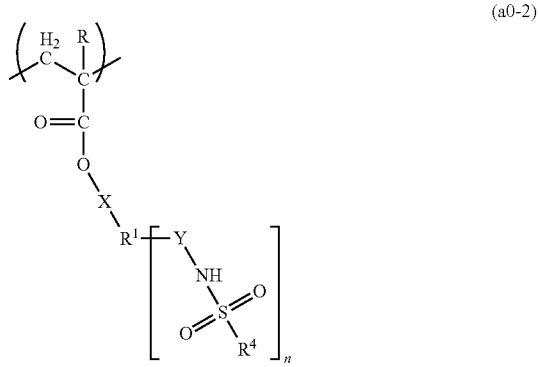

(a0-2)

In the formulas, R represents a hydrogen atom, an alkyl group of 1 to 5 carbon atoms or a halogenated alkyl group of 1 to 5 carbon atoms; X represents a single bond or a divalent linking group; $R^1$ represents a cyclic aliphatic hydrocarbon group with a valency of (n+1) which may contain an oxygen atom or sulfur atom at an arbitrary position; n represents an integer of 1 to 3; Y represents a single bond or an alkylene group which may contain an oxygen atom or sulfur atom at an arbitrary position; each of $R^2$ and $R^3$ independently represents a hydrogen atom, a chain-like or cyclic alkyl group, fluorinated alkyl group or alkoxycarbonyl group which may contain an oxygen atom at an arbitrary position and which may have a substituent; or $R^2$ and $R^3$ may be mutually bonded to form a ring; and $R^4$ represents a chain-like or cyclic alkyl group or fluorinated alkyl group which may have a substituent.

[Chemical Formula 2]

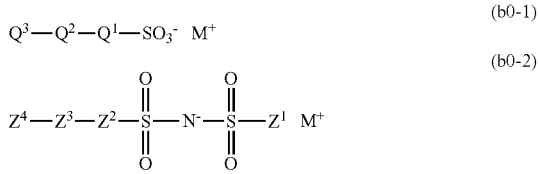

In the formulas, $Q^1$ represents a fluorinated alkylene group of 1 to 4 carbon atoms which may have a substituent; $Q^2$ represents a divalent linking group containing an oxygen atom; $Q^3$ represents a ring structure-containing hydrocarbon group of 3 to 30 carbon atoms which may have a substituent; $M^+$ represents an organic cation; $Z^1$ represents an alkyl group of 1 to 10 carbon atoms which may have a substituent or a fluorinated alkyl group of 1 to 10 carbon atoms which may have a substituent; $Z^2$ represents a fluorinated alkylene group of 1 to 4 carbon atoms which may have a substituent; $Z^3$ represents a single bond or a divalent linking group; and $Z^4$ represents a monovalent organic group.

A second aspect of the present invention is a method of forming a resist pattern, including: applying a resist composition of the first aspect to a substrate to form a resist film on the substrate; conducting exposure of the resist film; and developing the resist film to form a resist pattern.

In the present description and claims, the term "exposure" is used as a general concept that includes irradiation with any form of radiation.

The term "structural unit" refers to a monomer unit that contributes to the formation of a polymeric compound (namely, a resin, polymer or copolymer).

The term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon group, unless otherwise specified. The same applies for the alkyl group within an alkoxy group.

A "halogenated alkyl group" is a group in which part or all of the hydrogen atoms of an alkyl group are substituted with a halogen atom, and a "halogenated alkylene group" is a group in which part or all of the hydrogen atoms of an alkylene group are substituted with a halogen atom. Examples of the halogen atom include a fluorine atom, a chlorine atom, a bromine atom and an iodine atom.

A "fluorinated alkyl group" is a group in which part or all of the hydrogen atoms of an alkyl group have been substituted with a fluorine atom, and a "fluorinated alkylene group" is a group in which part or all of the hydrogen atoms of an alkylene group have been substituted with a fluorine atom.

According to the present invention, there are provided a resist composition which exhibits excellent lithography properties and is capable of forming a resist pattern of favorable shape, and a method of forming a resist pattern.

DETAILED DESCRIPTION OF THE INVENTION

Resist Composition

The resist composition of the present invention includes a base component (A) (hereafter, referred to as "component (A)") which exhibits changed solubility in a developing solution under the action of acid, and an acid generator component (B) (hereafter, referred to as "component (B)") which generates acid upon exposure.

If a resist film is formed using these resist compositions and the resist film is selectively exposed, acid is generated from the component (B) within the exposed portions, and the action of this acid changes the solubility of the component (A) in a developing solution, whereas the solubility of the component (A) in a developing solution remains unchanged in the unexposed portions. Accordingly, the difference in solubility in a developing solution is developed between the exposed portions and the unexposed portions. Therefore, by developing this resist film, the exposed portions are dissolved and removed, and hence, a positive resist pattern can be formed when the resist composition is a positive resist composition, whereas the unexposed portions are dissolved and removed, and hence, a negative resist pattern can be formed when the resist composition is a negative resist composition.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

The resist composition of the present invention may be either a positive resist composition or a negative resist composition.

Further, in the formation of a resist pattern, the resist composition of the present invention can be applied to an alkali developing process using an alkali developing solution in the developing treatment, or a solvent developing process using a developing solution containing an organic solvent (organic developing solution) in the developing treatment.

<Component (A)>

The resist composition of the present invention includes, as the component (A) (base component which exhibits changed solubility in a developing solution under the action of acid), a resin component (A1) (hereafter, referred to as "component (A1)") containing a specific structural unit (a0) represented by general formula (a0-1) shown below or general formula (a0-2) shown below.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compounds which can be used as the base component can be broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. In the present description and claims, the term "resin" refers to a polymer having a molecular weight of 1,000 or more.

The molecular weight of polymers refers to the weight average molecular weight in terms of the polystyrene equivalent value determined by gel permeation chromatography (GPC).

The component (A) may exhibit increased solubility in a developing solution under the action of acid or may exhibit decreased solubility in a developing solution under the action of acid.

When the resist composition of the present invention is a resist composition which forms a negative resist pattern in an alkali developing process (or forms a positive resist pattern in a solvent developing process), as the component (A), a base component that is soluble in an alkali developing solution (hereafter, sometimes referred to as "alkali-soluble base component") is preferably used, and a cross-linker component is further blended thereto. As the alkali-soluble base component, a resin (i.e., an alkali-soluble resin) is usually used.

The alkali-soluble base component usually contains an alkali-soluble group such as a hydroxyl group, a carboxy group and an amino group. As the cross-linker component, those having a reactive group which may react with the alkali-soluble group by the action of acid, such as a methylol group and an alkoxymethyl group, may be used. Therefore, if a resist film is formed using these resist compositions and the resist film is selectively exposed, acid is generated from the component (B) within the exposed portions, and the action of this acid causes cross-linking between the alkali-soluble base component and the cross-linker component, thereby reducing the number of alkali-soluble groups in the alkali-soluble base component, and consequently causing the reduction of polarity, an increase in molecular weight, or the like. As a result, the solubility in an alkali developing solution is decreased (the solubility in an organic developing solution is increased). Accordingly, during resist pattern formation, when a resist film formed by applying the resist composition onto a substrate is selectively exposed, the exposed portions change to being substantially insoluble in an alkali developing solution (and substantially soluble in an organic developing solution), whereas the unexposed portions remain substantially soluble in an alkali developing solution (and substantially insoluble in an organic developing solution). As a result, by developing using an alkali developing solution, a negative resist pattern can be formed. Further, if an organic developing solution is used as a developing solution, a positive resist pattern can be formed.

As the cross-linker component, typically, an amino-based cross-linking agent such as a glycoluril having a methylol group or alkoxymethyl group, or a melamine-based cross-linking agent is preferable, as it enables formation of a favorable resist pattern with minimal swelling. The amount of the cross-linker component added is preferably within a range from 1 to 50 parts by weight, relative to 100 parts by weight of the alkali-soluble resin.

When the alkali-soluble base component exhibits self crosslinking properties (for example, when the alkali-soluble base component contains a group which may react with an alkali-soluble group under the action of acid), it is not necessary to blend a cross-linker component.

When the resist composition of the present invention is a resist composition which forms a positive resist pattern in an alkali developing process and forms a negative resist pattern in a solvent developing process, as the component (A), a resin component that exhibits increased polarity by the action of acid (hereafter, sometimes referred to as "component (A-1)") is preferably used. Because the polarity of the component (A-1) changes before and after the exposure, by using the component (A-1), an excellent development contrast can be achieved, not only in an alkali developing process, but also in a solvent developing process.

More specifically, in the case of applying an alkali developing process, the component (A-1) is substantially insoluble in an alkali developing solution prior to exposure, but when acid is generated from the component (B) upon exposure, the action of this acid causes an increase in the polarity of the component (A-1), thereby increasing the solubility of the component (A-1) in an alkali developing solution. Therefore, in the formation of a resist pattern, by conducting selective exposure of a resist film formed by applying the resist composition onto a substrate, the exposed portions change from an insoluble state to a soluble state in an alkali developing solution, whereas the unexposed portions remain insoluble in an alkali developing solution, and hence, a positive resist pattern can be formed by alkali developing. On the other hand, in the case of a solvent developing process, the component (A-1) exhibits high solubility in an organic developing solution prior to exposure, and when acid is generated from the component (B) upon exposure, the polarity of the component (A-1) is increased by the action of the generated acid, thereby decreasing the solubility of the component (A-1) in an organic developing solution. Therefore, in the formation of a resist pattern, by conducting selective exposure of a resist film formed by applying the resist composition onto a substrate, the exposed portions change from a soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

In the present invention, the component (A) preferably includes the component (A-1). Therefore, the component (A1) is preferably a resin component that exhibits increased polarity by the action of acid.

[Component (A1)]
(Structural Unit (a0))

The component (A1) contains a structural unit (a0) represented by general formula (a0-1) shown below or general formula (a0-2) shown below.

[Chemical Formula 3]

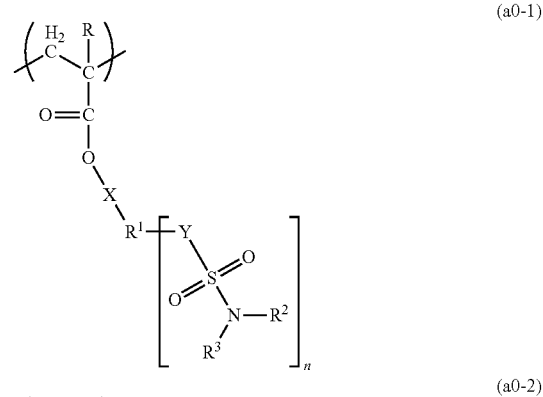

(a0-1)

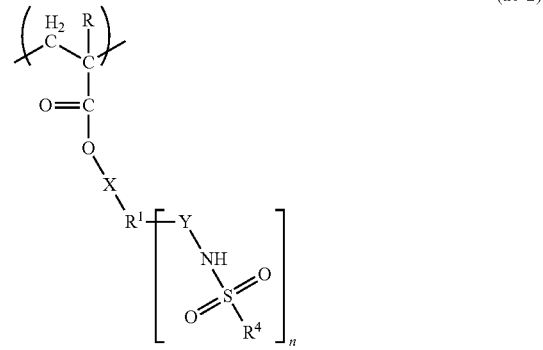

(a0-2)

In the formulas, R represents a hydrogen atom, an alkyl group of 1 to 5 carbon atoms or a halogenated alkyl group of 1 to 5 carbon atoms; X represents a single bond or a divalent linking group; $R^1$ represents a cyclic aliphatic hydrocarbon group with a valency of (n+1) which may contain an oxygen atom or sulfur atom at an arbitrary position; n represents an integer of 1 to 3; Y represents a single bond or an alkylene group which may contain an oxygen atom or sulfur atom at an arbitrary position; each of $R^2$ and $R^3$ independently represents a hydrogen atom, a chain-like or cyclic alkyl group, fluorinated alkyl group or alkoxycarbonyl group which may contain an oxygen atom at an arbitrary position and which may have a substituent; or $R^2$ and $R^3$ may be mutually bonded to form a ring; and $R^4$ represents a chain-like or cyclic alkyl group or fluorinated alkyl group which may have a substituent.

In formulas (a0-1) and (a0-2), as the alkyl group of 1 to 5 carbon atoms for R, a linear or branched alkyl group is preferable, and examples thereof include a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group of 1 to 5 carbon atoms for R include groups in which some or all of the hydrogen atoms of the aforementioned alkyl group of 1 to 5 carbon atoms are substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formulas (a0-1) and (a0-2), the divalent linking group for X is not particularly limited, and preferable examples thereof include a divalent hydrocarbon group which may have a substituent and a divalent linking group containing a hetero atom.

The term "divalent hydrocarbon group which may have a substituent" refers to a divalent hydrocarbon group in which part or all of the hydrogen atoms may be substituted with a substituent (a group or an atom other than hydrogen).

The hydrocarbon group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8 carbon atoms, and still more preferably 1 to 5 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxo group (=O).

Examples of the aliphatic hydrocarbon group containing a ring in the structure thereof include alicyclic hydrocarbon groups (groups in which two hydrogen atoms have been removed from an aliphatic hydrocarbon ring), groups in which this type of alicyclic hydrocarbon group is bonded to the terminal of a linear or branched aliphatic hydrocarbon group, or groups in which this type of alicyclic hydrocarbon group is interposed within the chain of a linear or branched aliphatic hydrocarbon group. Examples of the linear or branched aliphatic hydrocarbon group include the same aliphatic hydrocarbon groups as those described above.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic alicyclic hydrocarbon group, a group in which two hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxo group (=O).

The aromatic hydrocarbon group is a hydrocarbon group having an aromatic ring.

The aromatic hydrocarbon group as the divalent hydrocarbon group for X preferably has 3 to 30 carbon atoms, more preferably 5 to 30 carbon atoms, still more preferably 5 to 20 carbon atoms, still more preferably 6 to 15 carbon atoms, and most preferably 6 to 10 carbon atoms. Here, the number of carbon atoms within a substituent(s) is not included in the number of carbon atoms of the aromatic hydrocarbon group.

Specific examples of the aromatic rings included in the aromatic hydrocarbon groups, include aromatic hydrocarbon rings such as benzene, biphenyl, fluorene, naphthalene, anthracene and phenanthrene; and aromatic heterocycles in which part of the carbon atoms constituting the aforementioned aromatic hydrocarbon ring has been substituted with a hetero atom. Examples of the hetero atoms within aromatic heterocycles include an oxygen atom, a sulfur atom and a nitrogen atom.

Specific examples of the aromatic hydrocarbon groups include groups in which two hydrogen atoms have been removed from the aforementioned aromatic hydrocarbon ring (arylene groups); and groups in which one of the hydrogen atoms of a group (i.e., an aryl group in which one hydrogen atom has been removed from the aforementioned aromatic hydrocarbon ring) has been substituted with an alkylene group (for example, groups in which one hydrogen atom has been further removed from the aryl group within an arylalkyl group, such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring within the aromatic hydrocarbon group may be substituted with a substituent. Examples of substituents include an alkyl group, an alkoxy group, a halogen atom, a halogenated alkyl group, a hydroxyl group and an oxo group (=O).

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

With respect to a "divalent linking group containing a hetero atom", a hetero atom is an atom other than carbon and hydrogen, and examples thereof include an oxygen atom, a nitrogen atom, a sulfur atom and a halogen atom.

Specific examples of the divalent linking group containing a hetero atom include non-hydrocarbon linking groups such as —O—, —C(=O)—, —C(=O)—O—, a carbonate bond (—O—C(=O)—O—), —S(=O)$_2$, —S(=O)$_2$—O—, —NH—, —NR$^{04}$— (R$^{04}$ represents a substituent such as an alkyl group or an acyl group), —NH—C(=O)— and =N—; and a combination of at least one of these non-hydrocarbon groups with a divalent hydrocarbon group. As examples of the divalent hydrocarbon group, the same groups as those described above for the divalent hydrocarbon group which may have a substituent can be given, and a linear or branched aliphatic hydrocarbon group is preferable.

The divalent linking group for X may or may not have an acid decomposable portion in the structure thereof. The term "acid decomposable portion" refers to a portion having a bond which may be cleaved during the action of acid generated upon exposure (for example, the acid generated from the component (B)).

Examples of the acid decomposable portion include those having a carbonyloxy group and a tertiary carbon atom bonded to the oxygen atom (—O—) at the terminal thereof. When an acid acts on this acid decomposable portion, the bond between the oxygen atom and the tertiary carbon atom is cleaved.

When X has such an acid decomposable portion, the acid generated from the component (B) during exposure decomposes the acid decomposable portion in X, thereby increasing the polarity of the component (A1). Therefore, even when the component (A1) is constituted only of the structural unit (a0), the component (A1) exhibits a property of increasing the polarity by the action of acid.

Among the examples described above, as X, a linear or branched alkylene group, a divalent alicyclic hydrocarbon group, a divalent linking group containing a hetero atom, or a single bond is preferable, a linear or branched alkylene group, a divalent linking group containing a hetero atom, or a single bond is more preferable, and a single bond is particularly desirable.

When X represents a linear or branched alkylene group, the alkylene group preferably has 1 to 10 carbon atoms, more preferably 1 to 6 carbon atoms, still more preferably 1 to 4 carbon atoms, and most preferably 1 to 3 carbon atoms. More specifically, the same linear alkylene groups and branched alkylene groups as those listed above as the "linear or branched aliphatic hydrocarbon group" within the description for the aforementioned "divalent hydrocarbon group which may have a substituent" can be used.

When X represents a divalent alicyclic hydrocarbon group, as the alicyclic hydrocarbon group, the same alicyclic hydrocarbon groups as those listed above as the "aliphatic hydrocarbon group containing a ring in the structure thereof" within the description for the aforementioned "divalent hydrocarbon group which may have a substituent" can be used.

As the alicyclic hydrocarbon group, a group in which two or more hydrogen atoms have been removed from cyclopentane, cyclohexane, norbornane, isobornane, adamantane, tricyclodecane or tetracyclododecane is particularly desirable.

When X represents a divalent linking group containing a hetero atom, preferred examples of the linking groups include —O—, —C(=O)—O—, —C(=O)—, —O—C(=O)—O—, —C(=O)—NH—, —NH— (H may be replaced with a substituent such as an alkyl group, an acyl group or the like), —S—, —S(=O)$_2$—, —S(=O)$_2$—O—, groups represented by general formula —Y$^{21}$—O—Y$^{22}$—, —[Y$^{21}$—C(=O)—O]$_{m'}$—Y$^{22}$— or —Y$^{21}$—O—C(=O)—Y$^{22}$— [in the formulas, each of Y$^{21}$ and Y$^{22}$ independently represents a divalent hydrocarbon group which may have a substituent, O represents an oxygen atom, and m' represents an integer of 0 to 3].

When X represents —NH—, this H may be substituted with a substituent such as an alkyl group or an acyl group. The substituent (an alkyl group, an acyl group or the like) preferably has 1 to 10 carbon atoms, more preferably 1 to 8 carbon atoms, and most preferably 1 to 5 carbon atoms.

In formula —Y$^{21}$—O—Y$^{22}$—, —[Y$^{21}$—C(=O)—O]$_{m'}$—Y$^{22}$— or —Y$^{21}$—O—C(=O)—Y$^{22}$—, each of Y$^{21}$ and Y$^{22}$ independently represents a divalent hydrocarbon group which may have a substituent. Examples of the divalent hydrocarbon groups include the same groups as those described above for the "divalent hydrocarbon group which may have a substituent".

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m'}$—Y$^{22}$—, m' represents an integer of 0 to 3, preferably an integer of 0 to 2, more preferably 0 or 1, and most preferably 1. In other words, it is particularly desirable that the group represented by the formula —[Y$^{21}$—C(=O)—]$_{m'}$—Y$^{22}$— be a group represented by the formula —Y$^{21}$—C(=O)—O—Y$^{22}$—. Of these, groups represented by the formula —(CH$_2$)$_{a'}$—C(=O)—O—(CH$_2$)$_{b'}$— are preferred. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group for X containing a hetero atom, an organic group constituted of a combination of at least one non-hydrocarbon group with a divalent hydrocarbon group is preferable. Among the examples described above, linear groups containing an oxygen atom as a hetero atom, e.g., groups containing an ether bond or ester bond are preferred, groups represented by the above formula —$Y^{21}$—O—$Y^{22}$—, —$[Y^{21}$—C(=O)—O$]_m$—$Y^{22}$— or —$Y^{21}$—O—C(=O)—$Y^{22}$— are more preferred, and groups represented by the above formula —$[Y^{21}$—C(=O)—O$]_m$—$Y^{22}$— or —$Y^{21}$—O—C(=O)—$Y^{22}$— are most preferred.

In formulas (a0-1) and (a0-2), n is an integer of 1 to 3, preferably 1 or 2, and most preferably 1.

$R^1$ represents a cyclic aliphatic hydrocarbon group with a valency of (n+1) which may contain an oxygen atom or sulfur atom at an arbitrary position.

Here, the expression "contain an oxygen atom or sulfur atom" means that an oxygen atom (—O—) or sulfur atom (—S—) is inserted within the carbon chain (within the ring skeleton in the case of a cyclic structure).

The cyclic aliphatic hydrocarbon group preferably has 3 to 20 carbon atoms, and more preferably 5 to 12 carbon atoms.

The cyclic aliphatic hydrocarbon group may be either saturated or unsaturated, but is preferably saturated.

The cyclic aliphatic hydrocarbon group may be either a monocyclic group or a polycyclic group. In terms of raising the glass transition temperature (Tg) to improve lithography properties and further improving the etching resistance, a polycyclic group is preferable, and a bi-, tri- or tetra-cyclic group is more preferable.

As the monocyclic aliphatic hydrocarbon group, a group in which (n+1) hydrogen atoms have been removed from a monocycloalkane is preferable. The monocycloalkane preferably has 3 to 6 carbon atoms, and specific examples thereof include cyclopentane and cyclohexane.

As the polycyclic aliphatic hydrocarbon group, a group in which (n+1) hydrogen atoms have been removed from a polycycloalkane such as a bicycloalkane, tricycloalkane or tetracycloalkane is preferable. The polycycloalkane preferably has 7 to 12 carbon atoms, and specific examples thereof include norbornane (bicyclo[2.2.1]heptane), adamantane, tricyclodecane (tricyclo[5.2.1.0$^{2,6}$]decane) and tetracyclo[6.2.1.1(3,6).0(2,7)]dodecane. For example, when n is 1, specific preferable examples of $R^1$ include a cyclopropanediyl group, a cyclobuta-1,2-diyl group, a cyclobuta-1,3-diyl group, a cyclopenta-1,2-diyl group, a cyclopenta-1,3-diyl group, a cyclohexa-1,2-diyl group, a cyclohexa-1,3-diyl group, a cyclohexa-1,4-diyl group, a bicyclo[2.2.1]hepta-2,3-diyl group, a bicyclo[2.2.1]hepta-2,5-diyl group, a 7-oxabicyclo[2.2.1]hepta-2,5-diyl group, a bicyclo[2.2.1]hepta-2,6-diyl group, a 7-oxabicyclo[2.2.1]hepta-2,6-diyl group, a 7-thiobicyclo[2.2.1]hepta-2,6-diyl group, a tricyclo[5.2.1.0$^{2,6}$]deca-3,8-diyl group, a tricyclo[5.2.1.0$^{2,6}$]deca-4,8-diyl group, a tricyclo[5.2.1.0$^{2,6}$]deca-5,8-diyl group, a 10-oxatricyclo[5.2.1.0$^{2,6}$]deca-3,8-diyl group, a 10-oxatricyclo[5.2.1.0$^{2,6}$]deca-4,8-diyl group, a 10-oxatricyclo[5.2.1.0$^{2,6}$]deca-5,8-diyl group, an adamanta-1,3-diyl group and an adamanta-1,2-diyl group.

In formulas (a0-1) and (a0-2), Y represents a single bond or an alkylene group which may contain an oxygen atom (—O—) or sulfur atom (—S—) at an arbitrary position.

The alkylene group may be linear, branched or cyclic.

When the alkylene group is linear or branched, the number of carbon atoms thereof is preferably 1 to 20, more preferably 1 to 10, and still more preferably 1 to 7.

When the alkylene group is cyclic, the number of carbon atoms thereof is preferably 3 to 20, and more preferably 3 to 16.

The cyclic alkylene group may be either a polycyclic group or a monocyclic group. As the monocyclic alkylene group, a group in which two hydrogen atoms have been removed from a monocycloalkane of 3 to 6 carbon atoms is preferable. Examples of the monocycloalkane include cyclopentane and cyclohexane. As the polycyclic alkylene group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

Y is most preferably a single bond.

In formula (a0-1), each of $R^2$ and $R^3$ independently represents a hydrogen atom, a chain-like or cyclic alkyl group, fluorinated alkyl group or alkoxycarbonyl group which may contain an oxygen atom (—O—) at an arbitrary position and which may have a substituent.

The chain-like alkyl group may be either linear or branched.

The chain-like alkyl group preferably has 1 to 10 carbon atoms, more preferably 1 to 7 carbon atoms, and still more preferably 1 to 5 carbon atoms. Specific examples include a methyl group, an ethyl group, an n-propyl group, an i-propyl group, an n-butyl group, an i-butyl group, a t-butyl group, a 2-methyl-2-butyl group, a 3-methyl-2-butyl group, a 1-pentyl group, a 2-pentyl group and a 3-pentyl group.

The cyclic alkyl group preferably has 3 to 20 carbon atoms, more preferably 4 to 15 carbon atoms, and still more preferably 5 to 12 carbon atoms.

The cyclic alkyl group may be either a polycyclic group or a monocyclic group. As the monocyclic alkyl group, a group in which two hydrogen atoms have been removed from a monocycloalkane of 3 to 6 carbon atoms is preferable. Examples of the monocycloalkane include cyclopentane and cyclohexane. As the polycyclic alkylene group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane. Specific preferable examples thereof include a cyclopropyl group, a cyclobutyl group, a cyclopentyl group, a cyclohexyl group, a bicyclo[2.2.1]hept-2-yl group, a 1-adamantyl group and a 2-adamantyl group.

The chain-like or cyclic alkyl group may contain an oxygen atom (—O—) at an arbitrary position and may have a substituent for substituting a hydrogen atom of the alkyl group.

Examples of the chain-like or cyclic alkyl group containing an oxygen atom include an alkoxy group and a alkoxyalkyl group. Further, as the cyclic alkyl group containing an oxygen atom, a group in which one carbon atom has been removed from a cyclic ether such as tetrahydropyran (hereafter, sometimes referred to as a "cyclic ether group") can also be used.

Examples of the substituent for substituting a hydrogen atom of the chain-like or cyclic alkyl group include an alkyl group, a fluorine atom, a fluorinated alkyl group, and an oxo group (=O). Of these, the alkyl group and fluorinated alkyl group as the substituent preferably has 1 to 5 carbon atoms.

When the alkyl group is a chain-like (linear or branched) alkyl group, the alkyl group may have a cyclic alkyl group as a substituent.

When the alkyl group is a cyclic alkyl group, the alkyl group may have a chain-like alkyl group as a substituent.

When the resist composition of the present invention is a resist composition which forms a positive resist pattern in an alkali developing process and forms a negative resist pattern in a solvent developing process, the chain-like or cyclic alkyl group may be an acid dissociable group.

An "acid dissociable group" is a group exhibiting acid dissociability in which at least the bond between the acid dissociable group and the atom adjacent to this acid dissociable group (in this case, the nitrogen atom to which $R^2$ and $R^3$ are bonded) may be cleaved by the action of acid (for example, the acid generated from the component (B) upon exposure).

As the acid dissociable group for the chain-like or cyclic alkyl group which may contain an oxygen atom at an arbitrary position and which may have a substituent, alkyl groups in which the atom bonded to the adjacent atom (in this case, the nitrogen atom to which $R^2$ and $R^3$ are bonded) is a tertiary carbon atom and acetal-type acid dissociable groups can be used.

Examples of the alkyl groups in which the atom bonded to the adjacent atom is a tertiary carbon atom include branched tertiary alkyl groups which may have a cyclic alkyl group as a substituent, and groups in which, on the ring skeleton of a cyclic alkyl group, an alkyl group is bonded to the carbon atom which is bonded to an atom adjacent to the cyclic alkyl group (in this case, the nitrogen atom to which $R^2$ and $R^3$ are bonded) to form a tertiary carbon atom.

Examples of the branched tertiary alkyl groups include groups represented by a formula $—C(R^{71})(R^{72})(R^{73})$ (in the formula, each of $R^{71}$ to $R^{73}$ independently represents a linear alkyl group of 1 to 5 carbon atoms). The group represented by the formula $—C(R^{71})(R^{72})(R^{73})$ preferably has 4 to 8 carbon atoms, and specific examples include a tert-butyl group, a 2-methyl-2-butyl group, a 2-methyl-2-pentyl group and a 3-methyl-3-pentyl group.

Examples of the branched tertiary alkyl groups having a cyclic alkyl group as a substituent include groups (ii) (and specific examples thereof include groups represented by general formulas (2-1) to (2-6)) listed as acid dissociable groups which will be described later in connection with the structural unit (a1).

Examples of the groups in which, on the ring skeleton of a cyclic alkyl group, an alkyl group is bonded to the carbon atom which is bonded to an atom adjacent to the cyclic alkyl group to form a tertiary carbon atom include groups (i) (and specific examples thereof include groups represented by general formulas (1-1) to (1-9)) listed as acid dissociable groups which will be described later in connection with the structural unit (a1).

As the acetal-type acid dissociable group, a chain-like or cyclic alkoxy group, a cyclic ether, or the like can be used, and specific examples thereof include the same acetal-type acid dissociable groups as those listed as acid dissociable groups which will be described later in connection with the structural unit (a1).

As the fluorinated alkyl group for $R^2$ and $R^3$, groups in which part or all of the hydrogen atoms within the alkyl group for $R^2$ and $R^3$ have been substituted with fluorine atoms can be used.

The fluorinated alkyl group for $R^2$ and $R^3$ is preferably chain-like, and may be either linear or branched. As the fluorinated alkyl group, a trifluoromethyl group is particularly desirable.

As the alkyl group within the alkoxycarbonyl group for $R^2$ and $R^3$, the same alkyl groups as those described above for $R^2$ and $R^3$ can be used.

As the alkoxycarbonyl group, a chain-like alkoxycarbonyl group is preferable, and examples thereof include a methoxycarbonyl group, an ethoxycarbonyl group, a propyloxycarbonyl group, a butoxycarbonyl group and a pentyloxycarbonyl group. Of these, chain-like tertiary alkoxycarbonyl groups such as a tert-butyloxycarbonyl group and a tert-pentyloxycarbonyl group are preferred.

The aforementioned $R^2$ and $R^3$ groups may be mutually bonded to form a ring.

This ring may be either a monocyclic ring or a polycyclic ring, and a monocyclic ring is preferred. When the ring is a monocyclic ring, the ring including the nitrogen atom is preferably a 3- to 10-membered ring, and most preferably a 5- to 7-membered ring.

More specifically, examples of the ring to be formed include those in which a $—CH_2—$ group constituting the ring skeleton of the saturated hydrocarbon ring has been substituted with a $—NH—$ group, and also a hydrogen atom has been removed from this $—NH—$ group. The saturated hydrocarbon ring preferably has 3 to 20 carbon atoms, and more preferably 3 to 12 carbon atoms. Specific examples of the saturated hydrocarbon ring include a monocycloalkane such as cyclopropane, cyclobutane, cyclopentane or cyclohexane; and a polycycloalkane such as adamantane, norbornane, isobornane, tricyclodecane or tetracyclododecane.

The ring may contain an oxygen atom as an atom to constitute the ring skeleton in addition to carbon atoms and nitrogen atoms.

A substituent may be bonded to this ring. Examples of the substituent include an alkyl group, a fluorine atom, a fluorinated alkyl group, and an oxo group ($=O$). Of these, the alkyl group and fluorinated alkyl group as the substituent preferably has 1 to 5 carbon atoms.

When $R^2$ and $R^3$ are mutually bonded to form a ring, preferred examples of the group represented by the formula $—N(R^2)(R^3)$ include a pyrrolidinyl group, a piperidino group, and a 4-methylpiperidino group.

In the present invention, it is preferable that at least one of $R^2$ and $R^3$ represent a hydrogen atom, and it is more preferable that both $R^2$ and $R^3$ represent a hydrogen atom, or one of $R^2$ and $R^3$ represent a hydrogen atom and the other represent an alkyl group which may contain an oxygen atom at an arbitrary position or a fluorinated alkyl group. It is particularly desirable that both $R^2$ and $R^3$ represent a hydrogen atom, or one of $R^2$ and $R^3$ represent a hydrogen atom and the other represent a fluorinated alkyl group.

When the resist composition of the present invention is a resist composition which forms a negative resist pattern in an alkali developing process (or forms a positive resist pattern in a solvent developing process), the $—SO_2—N(R^2)(R^3)$ group in which at least one of $R^2$ and $R^3$ represent a hydrogen atom functions as an alkali-soluble group and may form a crosslink with a cross-linker component.

When the resist composition of the present invention is a resist composition which forms a positive resist pattern in an alkali developing process and forms a negative resist pattern in a solvent developing process, the $—SO_2—N(R^2)(R^3)$ group in which at least one of $R^2$ and $R^3$ represent a hydrogen atom functions as a polar group and increases the polarity of the component (A1). An increase in the polarity, especially an increase in the polarity following the exposure, enhances the compatibility with a developing solution and contributes to favorable improvements in the resolution and the like, particularly in the case of alkali developing process.

When the resist composition of the present invention is a resist composition which forms a positive resist pattern in an alkali developing process and forms a negative resist pattern in a solvent developing process, it is also preferable that one or both of (and preferably either one of) $R^2$ and $R^3$ represent a chain-like or cyclic alkyl group which may contain an oxygen atom at an arbitrary position and which may have a substituent and is also serving as an acid dissociable group, or an alkoxycarbonyl group. In this case, the acid generated from the component (B) during exposure dissociates the alkyl group or alkoxycarbonyl group to form a —$SO_2NH_2$ group, thereby increasing the polarity of the component (A1). Therefore, even when the component (A1) is constituted only of the structural unit (a0), the component (A1) exhibits a property of increasing the polarity by the action of acid.

In formula (a0-2), $R^4$ represents a hydrogen atom, a chain-like or cyclic alkyl group or fluorinated alkyl group which may contain an oxygen atom (—O—) at an arbitrary position and which may have a substituent. Examples of the chain-like or cyclic alkyl group and fluorinated alkyl group include the same chain-like or cyclic alkyl groups and fluorinated alkyl groups as those described above for $R^2$ and $R^3$.

As $R^4$, a fluorinated alkyl group is preferable, and a trifluoromethyl group is particularly desirable.

As the structural unit represented by the aforementioned general formula (a0-1), structural units represented by general formulas (a0-1-1) to (a0-1-4) shown below are preferred, and structural units represented by general formula (a0-1-2) are particularly desirable.

As the structural unit represented by the aforementioned general formula (a0-2), structural units represented by general formulas (a0-2-1) to (a0-2-4) shown below are preferred, and structural units represented by general formula (a0-2-4) are particularly desirable.

[Chemical Formula 4]

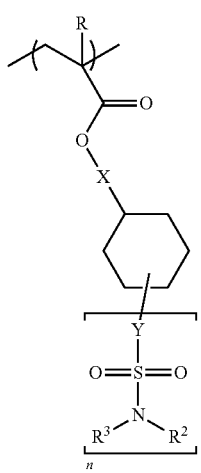

(a0-1-1)

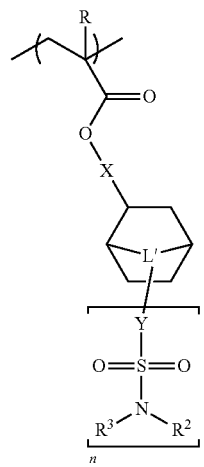

(a0-1-2)

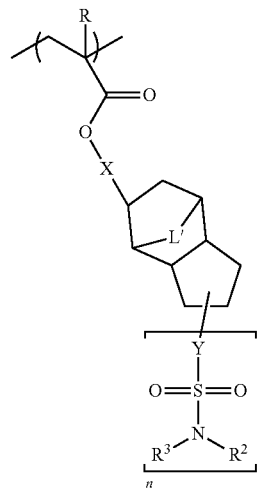

(a0-1-3)

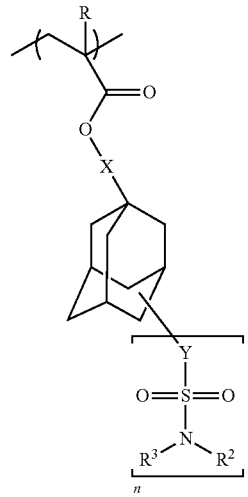

(a0-1-4)

(a0-2-1)

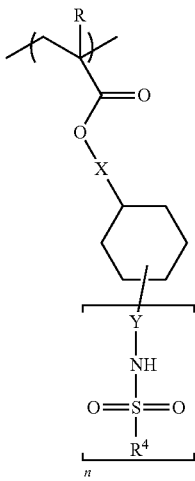

(a0-2-2)

(a0-2-3)

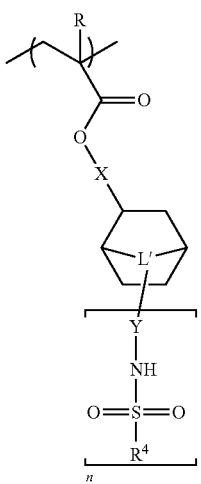

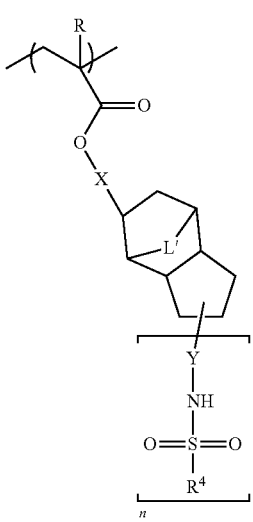

(a0-2-4)

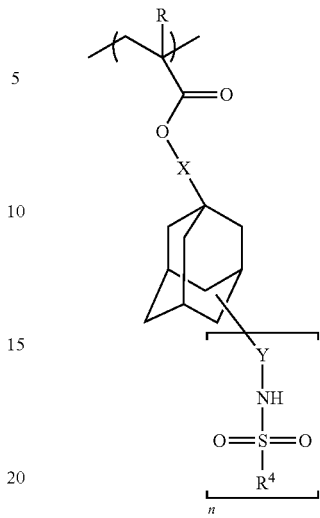

In the formulas, R, X, Y, $R^2$, $R^3$, $R^4$ and n are the same as defined above; and L' represents an oxygen atom, a sulfur atom, or an alkylene group of 1 to 5 carbon atoms which may contain an oxygen atom or sulfur atom at an arbitrary position.

In the formulas, R, X, Y, $R^2$, $R^3$, $R^4$ and n are the same as defined above for R, X, Y, $R^2$, $R^3$, $R^4$ and n in the aforementioned formulas (a0-1) and (a0-2).

As the alkylene group of 1 to 5 carbon atoms represented by and L', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is inserted at the terminal of the alkylene group or between the carbon atoms of the alkylene group. Specific examples of such alkylene groups include —O—$CH_2$—, —$CH_2$—O—$CH_2$—, —$CH_2$—O—$(CH_2)_2$—, —S—$CH_2$—, —$CH_2$—S—$CH_2$— and —$CH_2$—S—$(CH_2)_2$—.

L' is preferably an alkylene group of 1 to 5 carbon atoms or —O—, and still more preferably a methylene group or —O—.

Of the various possibilities described above, as the structural units represented by general formulas (a0-1-1) to (a0-1-4), those in which X and Y represent a single bond are preferred. Further, those in which the —N($R^2$)($R^3$) group in the formula represents —$NH_2$, —NH($CH_3$), —NH($CF_3$), a pyrrolidinyl group, a piperidino group or a 4-methylpiperidino group are preferred, and those in which the —N($R^2$)($R^3$) group in the formula represents —$NH_2$ or —NH($CF_3$) are particularly desirable.

Of the various possibilities described above, as the structural units represented by general formulas (a0-2-1) to (a0-2-4), those in which X and Y represent a single bond are preferred. Furthermore, those in which $R^4$ represents a fluorinated alkyl group are preferred, and those in which $R^4$ represents a trifluoromethyl group are particularly desirable.

As the structural unit (a0) contained in the component (A1), one type of structural unit may be used, or two or more types may be used.

In the component (A1), the amount of the structural unit (a0) is not particularly limited and can be appropriately set, taking into consideration the application of the resist composition, various lithography properties, and the like.

For example, when the resist composition of the present invention is a resist composition which forms a negative resist pattern in an alkali developing process (or forms a positive resist pattern in a solvent developing process), the amount of the structural unit (a0) within the component (A1) is preferably from 20 to 90 mol %, and more preferably from 30 to 90 mol %. When the amount of the structural unit (a0) is at least 20 mol %, the resolution can be improved. When the amount of the structural unit (a0) is not more than 90 mol %, the exposure latitude can be improved.

When the resist composition of the present invention is a resist composition which forms a positive resist pattern in an alkali developing process (or forms a negative resist pattern in a solvent developing process), the amount of the structural unit (a0) within the component (A1) is preferably from 1 to 70 mol %, and more preferably from 5 to 60 mol %. When the amount of the structural unit (a0) is within the abovementioned range, the effects of the present invention are improved.

If desired, the component (A1) may also include a structural unit other than the structural unit (a0). There are no particular limitations on the other structural unit, and any of the known structural units that constitute a base resin of the chemically amplified resists can be appropriately selected, depending on the lithography properties, the type of developing solution used in the lithography process (i.e., an alkali developing solution or an organic developing solution), the type of resist pattern to be formed (i.e., a positive resist pattern or a negative resist pattern), and the like.

For example, with respect to the resist composition which forms a negative resist pattern in an alkali developing process (or forms a positive resist pattern in a solvent developing process), as a base resin of the resist composition, alkali-soluble resins can be used, including, for example, a resin having a structural unit derived from at least one of α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; an acrylic resin or polycycloolefin resin which may have the hydrogen atom bonded to the carbon atom on the α-position substituted with a substituent and contains a sulfoneamide group, as disclosed in U.S. Pat. No. 6,949,325; an acrylic resin which may have the hydrogen atom bonded to the carbon atom on the α-position substituted with a substituent and contains a fluorinated alcohol, as disclosed in U.S. Pat. No. 6,949,325, Japanese Unexamined Patent Application, First Publication No. 2005-336452 or Japanese Unexamined Patent Application, First Publication No. 2006-317803; and a polycycloolefin resin containing a fluorinated alcohol, as disclosed in Japanese Unexamined Patent Application, First Publication No. 2006-259582.

Here, among the acrylic acids which may have the hydrogen atom bonded to the carbon atom on the α-position substituted with a substituent, the term "α-(hydroxyalkyl) acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

The component (A1) can be prepared by replacing part of the structural units constituting these alkali-soluble resins with the structural unit (a0).

With respect to the resist composition which forms a positive resist pattern in an alkali developing process and forms a negative resist pattern in a solvent developing process, as the base resin of the resist composition, as described above, the component (A-1) (i.e., a resin component that exhibits increased polarity by the action of acid) is preferably used.

There are no particular limitations on the type of structural units that constitute the component (A-1), and, for example, a structural unit derived from a compound containing an ethylenic double bond ($C=C$) can be used.

Here, the term "structural unit derived from a compound containing an ethylenic double bond" refers to a structural unit having a structure in which the ethylenic double bond within the compound containing an ethylenic double bond is cleaved to form a single bond.

Examples of the compounds containing an ethylenic double bond include acrylic acid which may have the hydrogen atom bonded to the carbon atom on the α-position substituted with a substituent, or the esters thereof; acrylamides which may have the hydrogen atom bonded to the carbon atom on the α-position substituted with a substituent, or the derivatives thereof; styrenes which may have the hydrogen atom bonded to the carbon atom on the α-position substituted with a substituent, or the derivatives thereof; and vinylnaphthalenes which may have the hydrogen atom bonded to the carbon atom on the α-position substituted with a substituent, or the derivatives thereof. Of these, an acrylate ester which may have the hydrogen atom bonded to the carbon atom on the α-position substituted with a substituent is preferable.

Here, an "acrylate ester" refers to a compound in which the terminal hydrogen atom of the carboxy group of acrylic acid ($CH_2=CH-COOH$) has been substituted with an organic group.

In the present description, an acrylate ester which may have the hydrogen atom bonded to the carbon atom on the α-position substituted with a substituent is sometimes referred to as an α-substituted acrylate ester. Further, acrylate esters and α-substituted acrylate esters are sometimes collectively referred to as "(α-substituted) acrylate esters".

With respect to the α-substituted acrylate esters, examples of the substituent bonded to the carbon atom on the α-position include a halogen atom, an alkyl group of 1 to 5 carbon atoms, a halogenated alkyl group of 1 to 5 carbon atoms and a hydroxyalkyl group. With respect to the "structural unit derived from an acrylate ester", the "α-position (the carbon atom on the α-position)" refers to the carbon atom having the carbonyl group bonded thereto, unless specified otherwise.

Examples of the halogen atom for the substituent on the α-position include a fluorine atom, a chlorine atom, a bromine atom and an iodine atom.

Specific examples of the alkyl group of 1 to 5 carbon atoms for the substituent on the α-position include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group of 1 to 5 carbon atoms for the substituent on the α-position include groups in which some or all of the hydrogen atoms of the aforementioned alkyl group of 1 to 5 carbon atoms are substituted with halogen atoms. Examples of the halogen atom include a fluorine atom, a chlorine atom, a bromine atom and an iodine atom, and a fluorine atom is particularly desirable.

As the hydroxyalkyl group for the substituent on the α-position, hydroxyalkyl groups of 1 to 5 carbon atoms are preferred, and specific examples thereof include groups in which some or all of the hydrogen atoms of the aforementioned alkyl group of 1 to 5 carbon atoms are substituted with hydroxy groups.

In the present invention, it is preferable that a hydrogen atom, an alkyl group of 1 to 5 carbon atoms or a halogenated alkyl group of 1 to 5 carbon atoms is bonded to the carbon atom on the α-position of the α-substituted acrylate esters; more preferably a hydrogen atom, an alkyl group of 1 to 5 carbon atoms or a fluorinated alkyl group of 1 to 5 carbon atoms, and most preferably a hydrogen atom or a methyl group in terms of industrial availability.

Although there are no particular limitations on the organic group contained in the (α-substituted) acrylate esters, examples thereof include characteristic groups such as an acid dissociable group, a —$SO_2$— containing cyclic group, a lactone-containing cyclic group, a polar group-containing hydrocarbon group and a non-acid-dissociable, aliphatic polycyclic group, and characteristic group-containing groups containing these characteristic groups within the structure thereof, as those listed in relation to the structural units (a1) to (a4) which will be described later. Examples of the characteristic group-containing groups include groups in which a divalent linking group is bonded to the aforementioned characteristic groups. As examples of the divalent linking group, the same divalent linking groups as those listed for $Y^2$ in general formula (a1-0-2) which will be described later in connection with the structural unit (a1) can be given.

As examples of the "acrylamides or the derivatives thereof", acrylamides which may have the hydrogen atom bonded to the carbon atom on the α-position substituted with a substituent (hereafter, sometimes referred to as "(α-substituted) acrylamide"); and compounds in which one or both of the terminal hydrogen atom of the amino group of (α-substituted) acrylamides has been substituted with a substituent can be given.

As the substituent which may be bonded to the carbon atom on the α-position of acrylamides or the derivatives thereof, the same substituents as those described above for the substituent bonded to the carbon atom on the α-position of the aforementioned α-substituted acrylate esters can be used.

As the substituent for substituting one or both of the terminal hydrogen atom of the amino group of (α-substituted) acrylamides, an organic group is preferred. The organic group is not particularly limited, and, for example, the same organic groups as those contained in the aforementioned (α-substituted) acrylate esters can be used.

Examples of the compounds in which one or both of the terminal hydrogen atom of the amino group of (α-substituted) acrylamides has been substituted with a substituent include compounds in which —C(═O)—O— bonded to the carbon atom on the α-position in the aforementioned (α-substituted) acrylate esters has been substituted with —C(═O)—N($R^b$)—[in the formula, $R^b$ represents a hydrogen atom or an alkyl group of 1 to 5 carbon atoms].

In the formula, the alkyl group for $R^b$ is preferably a linear or branched alkyl group.

As examples of the "styrenes or the derivatives thereof", styrenes which may have the hydrogen atom bonded to the carbon atom on the α-position substituted with a substituent and which may have the hydrogen atom bonded to the benzene ring substituted with a substituent other than the hydroxyl group (hereafter, sometimes referred to as "(α-substituted) styrene"); hydroxystyrenes which may have the hydrogen atom bonded to the carbon atom on the α-position substituted with a substituent and which may have the hydrogen atom bonded to the benzene ring substituted with a substituent other than the hydroxyl group (hereafter, sometimes referred to as "(α-substituted) hydroxystyrene"); and compounds in which the hydrogen atom of the hydroxyl group of (α-substituted) hydroxystyrenes has been substituted with an organic group can be given.

A hydroxystyrene is a compound which has one vinyl group and at least one hydroxyl group bonded to a benzene ring. The number of hydroxyl groups bonded to the benzene ring is preferably 1 to 3, and most preferably 1. The bonding position of the hydroxyl group on the benzene ring is not particularly limited. When there is one hydroxyl group, a para-4th position from the bonding position of the vinyl group is preferable. When there are two or more hydroxyl groups, a desired combination of the bonding positions can be used.

As the substituent which may be bonded to the carbon atom on the α-position of styrenes or the derivatives thereof, the same substituents as those described above for the substituent bonded to the carbon atom on the α-position of the aforementioned α-substituted acrylate esters can be used.

As the substituent other than the hydroxyl group which may be bonded to the benzene ring of styrenes or the derivatives thereof, there are no particular limitations, and examples thereof include a halogen atom, an alkyl group of 1 to 5 carbon atoms and a halogenated alkyl group of 1 to 5 carbon atoms. Examples of the halogen atom include a fluorine atom, a chlorine atom, a bromine atom and an iodine atom, and a fluorine atom is particularly desirable.

The organic group for the compounds in which the hydrogen atom of the hydroxyl group of (α-substituted) hydroxystyrenes has been substituted with an organic group is not particularly limited, and, for example, the same organic groups as those described above as the organic groups contained in the aforementioned (α-substituted) acrylate esters can be used.

As examples of the "vinylnaphthalenes or the derivatives thereof", vinylnaphthalenes which may have the hydrogen atom bonded to the carbon atom on the α-position substituted with a substituent and which may have the hydrogen atom bonded to the naphthalene ring substituted with a substituent other than the hydroxyl group (hereafter, sometimes referred to as "(α-substituted) vinylnaphthalene"); vinyl(hydroxynaphthalenes) which may have the hydrogen atom bonded to the carbon atom on the α-position substituted with a substituent and which may have the hydrogen atom bonded to the naphthalene ring substituted with a substituent other than the hydroxyl group (hereafter, sometimes referred to as "(α-substituted) vinyl(hydroxynaphthalene)"); and compounds in which the hydrogen atom of the hydroxyl group of (α-substituted) vinyl(hydroxynaphthalenes) has been substituted with a substituent can be given.

A vinyl(hydroxynaphthalene) is a compound which has one vinyl group and at least one hydroxyl group bonded to a naphthalene ring. The vinyl group may be bonded to the 1st or 2nd position of the naphthalene ring. The number of hydroxyl groups bonded to the naphthalene ring is preferably 1 to 3, and most preferably 1. The bonding position of the hydroxyl group on the naphthalene ring is not particularly limited. When the vinyl group is bonded to the 1st or 2nd position of the naphthalene ring, the hydroxyl group is preferably bonded to either one of the 5th to 8th position of the naphthalene ring. In particular, when the number of hydroxyl group is 1, the hydroxyl group is preferably bonded to either one of the 5th to 7th position of the naphthalene ring, and more preferably the 5th or 6th position. When there are two or more hydroxyl groups, a desired combination of the bonding positions can be used.

As the substituent which may be bonded to the carbon atom on the α-position of vinylnaphthalenes or the derivatives thereof, the same substituents as those described above for the substituent bonded to the carbon atom on the α-position of the aforementioned α-substituted acrylate esters can be used.

As examples of the substituent other than the hydroxyl group which may be bonded to the naphthalene ring of vinylnaphthalenes or the derivatives thereof, the same substituents as those described above for the substituent other than the hydroxyl group which may be bonded to the benzene ring of the aforementioned (α-substituted) hydroxystyrenes can be given.

The organic group for the compounds in which the hydrogen atom of the hydroxyl group of (α-substituted) vinyl(hydroxynaphthalenes) has been substituted with an organic group is not particularly limited, and, for example, the same organic groups as those described above as the organic groups contained in the aforementioned (α-substituted) acrylate esters can be used.

Specific examples of the structural units derived from (α-substituted) acrylic acids or the esters thereof include structural units represented by general formula (1) shown below.

Specific examples of the structural units derived from (α-substituted) acrylamides or the derivatives thereof include structural units represented by general formula (II) shown below.

Specific examples of the structural units derived from (α-substituted) styrenes or the derivatives thereof include structural units represented by general formula (III) shown below.

Specific examples of the structural units derived from (α-substituted) vinylnaphthalenes or the derivatives thereof include structural units represented by general formula (IV) shown below.

[Chemical Formula 5]

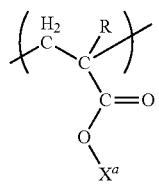

(I)

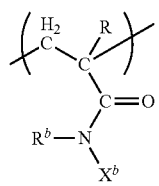

(II)

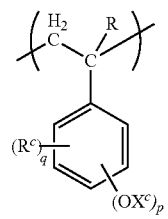

(III)

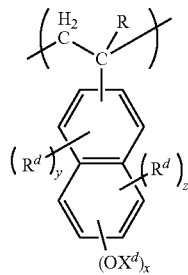

(IV)

In the formulas, R represents a hydrogen atom, an alkyl group of 1 to 5 carbon atoms or a halogenated alkyl group of 1 to 5 carbon atoms; each of $X^a$ to $X^d$ independently represents a hydrogen atom or an organic group; $R^b$ represents a hydrogen atom or an alkyl group of 1 to 5 carbon atoms; each of $R^c$ and $R^d$ independently represents a halogen atom, an alkyl group of 1 to 5 carbon atoms or a halogenated alkyl group of 1 to 5 carbon atoms; p represents an integer of 0 to 3 and q represents an integer of 0 to 5, with the proviso that p+q is 0 to 5; the plurality of $R^c$ may be either the same or different from each other when q is an integer of 2 or more; x represents an integer of 0 to 3, y represents an integer of 0 to 3 and z represents an integer of 0 to 4, with the proviso that x+y+z is 0 to 7; and the plurality of $R^d$ may be either the same or different from each other when y+z is an integer of 2 or more.

When the component (A1) is a resin component that exhibits increased polarity by the action of acid, the component (A1) preferably contains an acid decomposable group that exhibits increased polarity by the action of acid.

The term "acid decomposable group" refers to a group exhibiting acid decomposability in which at least a part of the bond within the structure of this acid decomposable group may be cleaved by the action of an acid (acid generated from the component (B) upon exposure). The acid decomposable groups will be described later in more detail in connection with the structural unit (a1).

When the structural unit (a0) contains an acid decomposable group (for example, when X in general formula (a0-1) or (a0-2) contains an acid decomposable portion within the structure thereof, or when either one or both of $R^2$ and $R^3$ in general formula (a0-1) represents an acid dissociable group), the component (A1) may be constituted only of the structural unit (a0), or may further contain the structural unit (a1) containing an acid decomposable group that exhibits increased polarity by the action of acid.

When the component (A1) does not contain the structural unit (a0) with an acid dissociable group, it is necessary that the component (A1) further contain the structural unit (a1) in addition to the structural unit (a0).

(Structural Unit (a1))

The structural unit (a1) is a structural unit containing an acid decomposable group that exhibits increased polarity by the action of acid.

As described above, the term "acid decomposable group" refers to a group exhibiting acid decomposability in which at least a part of the bond within the structure of this acid decomposable group may be cleaved by the action of acid.

Examples of acid decomposable groups which exhibit increased polarity by the action of an acid include groups which are decomposed by the action of an acid to form a polar group.

Examples of the polar group include a carboxy group, a hydroxyl group, an amino group and a sulfo group (—SO₃H). Among these, a polar group containing —O—H in the structure thereof (hereafter, sometimes referred to as "OH-containing polar group") is preferable, a carboxy group or a hydroxyl group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

An "acid dissociable group" is a group exhibiting acid dissociability in which at least the bond between the acid dissociable group and the atom adjacent to this acid dissociable group may be cleaved by the action of an acid (acid generated from the component (B) upon exposure). It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. Because of the increase in polarity, in those cases where an alkali developing process is employed, the solubility in an alkali developing solution is relatively increased. On the other hand, in those cases where a solvent developing process is employed, the solubility in an organic developing solution containing an organic solvent is decreased.

The acid dissociable group is not particularly limited, and any of the groups that have been conventionally proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known. Here, the term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom, thereby forming a carboxy group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, tertiary alkyl ester-type acid dissociable groups, aliphatic cyclic group-containing tertiary alkyl ester-type acid dissociable groups and aromatic cyclic group-containing tertiary alkyl ester-type acid dissociable groups.

With respect to the aliphatic branched, tertiary alkyl ester-type acid dissociable groups, the term "aliphatic branched" refers to a branched structure having no aromaticity. The "aliphatic branched, tertiary alkyl ester-type acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of the aliphatic branched, tertiary alkyl ester-type acid dissociable groups include groups represented by a formula —C($R^{71}$)($R^{72}$)($R^{73}$) (in the formula, each of $R^{71}$ to $R^{73}$ independently represents a linear alkyl group of 1 to 5 carbon atoms). The group represented by the formula —C($R^{71}$)($R^{72}$)($R^{73}$) preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

The aliphatic cyclic group within the aliphatic cyclic group-containing tertiary alkyl ester-type acid dissociable groups may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxo group (=O).

The basic ring of the "aliphatic cyclic group" exclusive of substituents is not limited to be constituted from only carbon and hydrogen (not limited to hydrocarbon rings), but is preferably a hydrocarbon ring. Further, the "hydrocarbon ring" may be either saturated or unsaturated, but is preferably saturated.

The aliphatic cyclic group may be either a monocyclic group or a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Further, in these aliphatic cyclic hydrocarbon groups, part of the carbon atoms constituting the ring may be replaced with an ethereal oxygen atom (—O—).

Examples of the aliphatic cyclic group-containing tertiary alkyl ester-type acid dissociable groups include the following groups (i) and (ii).

(i) a group which forms a tertiary carbon atom on the ring structure of a monovalent aliphatic cyclic group in which a substituent (a group or an atom other than hydrogen) is bonded to the carbon atom to which an atom adjacent to the acid dissociable, dissolution inhibiting group (e.g., "—O—" within "—C(=O)—O— group") is bonded; and (ii) a group which have a monovalent aliphatic cyclic group, and a branched alkylene group containing a tertiary carbon atom that is bonded to the monovalent aliphatic cyclic group.

In a group of type (i) described above, as the substituent bonded to the carbon atom to which an atom adjacent to the acid dissociable group is bonded on the ring skeleton of the aliphatic cyclic group, an alkyl group can be mentioned. Examples of these alkyl groups include the same groups as those described below for $R^{14}$ in formulas (1-1) to (1-9) shown below.

Specific examples of the group (i) include groups represented by general formulas (1-1) to (1-9) shown below.

Specific examples of the group (ii) include groups represented by general formulas (2-1) to (2-6) shown below.

[Chemical Formula 6]

(1-1)

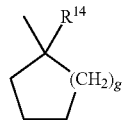
(1-2)

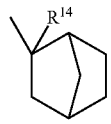
(1-3)

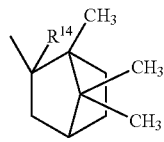
(1-4)

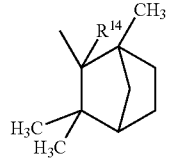
(1-5)

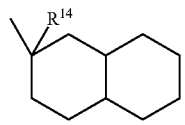
(1-6)

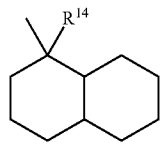
(1-7)

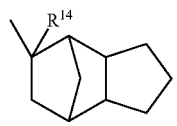
(1-8)

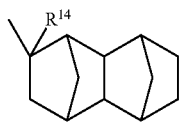
(1-9)

In the formulas above, $R^{14}$ represents an alkyl group; and g represents an integer of 0 to 8.

[Chemical Formula 7]

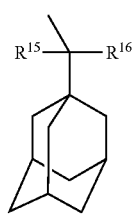
(2-1)

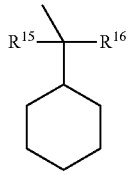
(2-2)

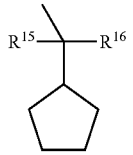
(2-3)

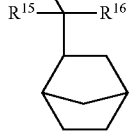
(2-4)

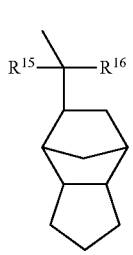
(2-5)

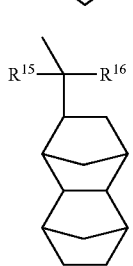
(2-6)

In the formulas above, each of $R^{15}$ and $R^{16}$ independently represents an alkyl group.

In formulas (1-1) to (1-9), the alkyl group for $R^{14}$ may be linear, branched or cyclic, and is preferably linear or branched.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably an integer of 1 to 3, and still more preferably 1 or 2.

In formulas (2-1) to (2-6), as the alkyl group for $R^{15}$ and $R^{16}$, the same alkyl groups as those described above for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom, a fluorinated alkyl group, and an oxo group (=O).

The aromatic cyclic group within the aromatic cyclic group-containing tertiary alkyl ester-type acid dissociable groups may be either a monocyclic group or a polycyclic group. Examples of the aromatic cyclic group include aryl groups such as a phenyl group, a biphenyl group, a fluorenyl group, a naphthyl group, an anthryl group, and a phenanthryl group; and heteroaryl groups in which some of the carbon atoms constituting the ring(s) of the aryl groups are substituted with hetero atoms such as an oxygen atom, a sulfur atom, and a nitrogen atom. Of these, aryl groups are preferred.

The aromatic cyclic group may have part or all of the hydrogen atoms substituted with a substituent. Examples of the substituent include an alkyl group of 1 to 5 carbon atoms, a fluorine atom, and a fluorinated alkyl group of 1 to 5 carbon atoms.

Examples of the aromatic cyclic group-containing tertiary alkyl ester-type acid dissociable groups include the following group (iii).

(iii) a group which has a branched alkylene group containing a tertiary carbon atom, and a monovalent aromatic cyclic group to which the tertiary carbon atom is bonded.

Specific examples of the group (iii) include groups represented by general formula (3) shown below.

[Chemical Formula 8]

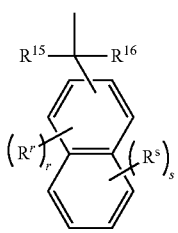

(3)

In the formula, each of $R^{15}$ and $R^{16}$ independently represents an alkyl group; each of $R^r$ and $R^s$ independently represents a halogen atom, an alkyl group of 1 to 5 carbon atoms or a halogenated alkyl group of 1 to 5 carbon atoms; r represents an integer of 0 to 3; and s represents an integer of 0 to 4.

In formula (3), as the alkyl group for $R^{15}$ and $R^{16}$, the same alkyl groups as those described above for $R^{15}$ and $R^{16}$ in formulas (2-1) to (2-6) can be used. Among these, a methyl group, an ethyl group or an isopropyl group is preferable, and a methyl group is particularly desirable.

Examples of the halogen atom for $R^r$ and $R^s$ include a fluorine atom, a chlorine atom, a bromine atom and an iodine atom, and a fluorine atom is particularly desirable.

As the alkyl group of 1 to 5 carbon atoms for $R^r$ and $R^s$, a linear or branched alkyl group is preferable, and examples thereof include a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group of 1 to 5 carbon atoms for $R^r$ and $R^s$ include groups in which some or all of the hydrogen atoms of the aforementioned alkyl group of 1 to 5 carbon atoms are substituted with halogen atoms.

r represents an integer of 0 to 3, preferably an integer of 0 to 2, more preferably 0 or 1, and most preferably 0 from an industrial viewpoint.

s represents an integer of 0 to 4, preferably an integer of 0 to 2, more preferably 0 or 1, and most preferably 0 from an industrial viewpoint.

An "acetal-type acid dissociable group" generally substitutes a hydrogen atom at the terminal of an OH-containing polar group such as a carboxyl group or hydroxyl group, so as to be bonded with an oxygen atom. When acid is generated upon exposure, the generated acid acts to break the bond between the acetal-type acid dissociable group and the oxygen atom to which the acetal-type, acid dissociable group is bonded, thereby forming an OH-containing polar group such as a carboxyl group or a hydroxyl group.

Examples of acetal-type acid dissociable groups include groups represented by general formula (p1) shown below.

[Chemical Formula 9]

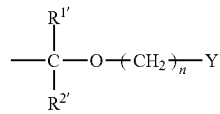

(p1)

In the formula, each of $R^{1'}$ and $R^{2'}$ independently represents a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1), n is preferably an integer of 0 to 2, more preferably 0 or 1, and most preferably 0.

As the alkyl group for $R^{1'}$ and $R^{2'}$, the same alkyl groups as those described above as the substituent on the α-position of the aforementioned acrylate ester can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable group (p1) is a group represented by general formula (p1-1) shown below.

[Chemical Formula 10]

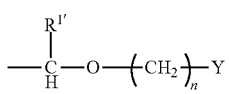

(p1-1)

In the formula, R$^{1'}$, n and Y are the same as defined above.

As the alkyl group for Y, the same alkyl groups as those described above for the substituent which is bonded to the carbon atom on the α-position of the aforementioned acrylate ester can be used.

As the aliphatic cyclic group for Y, any of the aliphatic monocyclic/polycyclic groups which have been proposed for conventional ArF resists and the like can be appropriately selected for use. For example, the same aliphatic cyclic groups as those described above in connection with the "aliphatic cyclic group-containing tertiary alkyl ester-type acid dissociable group" can be used.

Further, as the acetal-type, acid dissociable group, groups represented by general formula (p2) shown below can also be used.

[Chemical Formula 11]

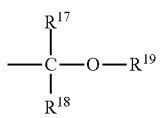

(p2)

In the formula, R$^{17}$ and R$^{18}$ each independently represent a linear or branched alkyl group or a hydrogen atom; and R$^{19}$ represents a linear, branched or cyclic alkyl group; or each of R$^{17}$ and R$^{19}$ may independently represents a linear or branched alkylene group, wherein R$^{17}$ is bonded to R$^{19}$ to form a ring.

The alkyl group for R$^{17}$ and R$^{18}$ preferably has 1 to 15 carbon atoms, and may be either linear or branched. As the alkyl group, an ethyl group or a methyl group is preferable, and a methyl group is most preferable.

It is particularly desirable that either one of R$^{17}$ and R$^{18}$ be a hydrogen atom, and the other be a methyl group.

R$^{19}$ represents a linear, branched or cyclic alkyl group which preferably has 1 to 15 carbon atoms, and may be any of linear, branched or cyclic.

When R$^{19}$ represents a linear or branched alkyl group, it is preferably an alkyl group of 1 to 5 carbon atoms, more preferably an ethyl group or methyl group, and most preferably an ethyl group.

When R$^{19}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

Among these, a group in which one or more hydrogen atoms have been removed from adamantane is preferable.

In general formula (p2) above, R$^{17}$ and R$^{19}$ may each independently represent a linear or branched alkylene group (preferably an alkylene group of 1 to 5 carbon atoms), and the R$^{19}$ group may be bonded to the R$^{17}$ group.

In such a case, a cyclic group is formed by R$^{17}$, R$^{19}$, the oxygen atom having R$^{19}$ bonded thereto, and the carbon atom having the oxygen atom and R$^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

As the structural unit (a1), as long as an acid decomposable group is contained, there are no particular limitations on the structure of other part, although preferred examples thereof include a structural unit (a11) derived from an acrylate ester which may have the hydrogen atom bonded to the carbon atom on the α-position substituted with a substituent and contains an acid decomposable group; a structural unit (a12) derived from a hydroxystyrene which may have the hydrogen atom bonded to the carbon atom on the α-position substituted with a substituent and which may have the hydrogen atom bonded to the benzene ring substituted with a substituent other than the hydroxyl group, and in which the hydrogen atom of the hydroxyl group is substituted with an acid dissociable group or a substituent containing an acid dissociable group; and a structural unit (a13) derived from a vinyl(hydroxynaphthalene) which may have the hydrogen atom bonded to the carbon atom on the α-position substituted with a substituent and which may have the hydrogen atom bonded to the naphthalene ring substituted with a substituent other than the hydroxyl group, and in which the hydrogen atom of the hydroxyl group is substituted with an acid dissociable group or a substituent containing an acid dissociable group.

As the acid decomposable group and acid dissociable group for the structural units (a11) to (a13), the same groups as those described above can be used.

Of the various possibilities described above, as the structural unit (a1), the structural unit (a11) is preferred.

{Structural Unit (a11)}

The structural unit (a11) is a structural unit derived from an acrylate ester which may have the hydrogen atom bonded to the carbon atom on the α-position substituted with a substituent and contains an acid decomposable group.

Specific examples of the structural unit (a11) include a structural unit represented by general formula (a1-0-1) shown below and a structural unit represented by general formula (a1-0-2) shown below.

[Chemical Formula 12]

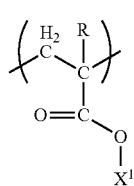

(a1-0-1)

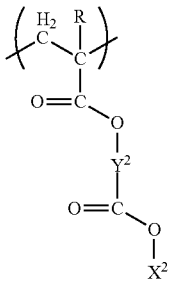
(a1-0-2)

In the formulas, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In general formula (a1-0-1), the alkyl group and the halogenated alkyl group for R are respectively the same as defined for the alkyl group and the halogenated alkyl group for the substituent which may be bonded to the carbon atom on the α-position of the aforementioned (α-substituted) acrylate ester.

R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a1-0-2), R is the same as defined above.

$X^2$ is the same as defined for $X^1$ in general formula (a1-0-1).

The divalent linking group for $Y^2$ is not particularly limited, and preferable examples thereof include a divalent hydrocarbon group which may have a substituent and a divalent linking group containing a hetero atom.

With respect to the divalent hydrocarbon group, the hydrocarbon group "has a substituent" means that part or all of the hydrogen atoms within the hydrocarbon group is substituted with a substituent (a group or an atom other than hydrogen).

The divalent hydrocarbon group for the linking group may be either an aliphatic hydrocarbon group or an aromatic hydrocarbon group. An "aliphatic hydrocarbon group" refers to a hydrocarbon group that has no aromaticity. The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8 carbon atoms, and still more preferably 1 to 5 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2$$CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxo group (=O).

Examples of the aliphatic hydrocarbon group containing a ring in the structure thereof include alicyclic hydrocarbon groups (groups in which two hydrogen atoms have been removed from an aliphatic hydrocarbon ring), groups in which this type of alicyclic hydrocarbon group is bonded to the terminal of a linear or branched aliphatic hydrocarbon group, or groups in which this type of alicyclic hydrocarbon group is interposed within the chain of a linear or branched aliphatic hydrocarbon group. Examples of the linear or branched aliphatic hydrocarbon group include the same aliphatic hydrocarbon groups as those described above.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which two hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxo group (=O).

The aromatic hydrocarbon group is a hydrocarbon group having an aromatic ring.

The aromatic hydrocarbon group as the divalent hydrocarbon group for $Y^2$ preferably has 3 to 30 carbon atoms, more preferably 5 to 30 carbon atoms, still more preferably 5 to 20 carbon atoms, still more preferably 6 to 15 carbon atoms, and most preferably 6 to 10 carbon atoms. Here, the number of carbon atoms within a substituent(s) is not included in the number of carbon atoms of the aromatic hydrocarbon group.

Specific examples of the aromatic rings included in the aromatic hydrocarbon groups, include aromatic hydrocarbon rings such as benzene, biphenyl, fluorene, naphthalene, anthracene and phenanthrene; and aromatic heterocycles in which part of the carbon atoms constituting the aforementioned aromatic hydrocarbon ring has been substituted with a hetero atom. Examples of the hetero atoms within aromatic heterocycles include an oxygen atom, a sulfur atom and a nitrogen atom.

Specific examples of the aromatic hydrocarbon groups include groups in which two hydrogen atoms have been removed from the aforementioned aromatic hydrocarbon ring (arylene groups); and groups in which one of the hydrogen atoms of a group (i.e., an aryl group in which one hydrogen atom has been removed from the aforementioned aromatic hydrocarbon ring) has been substituted with an alkylene group (for example, groups in which one hydrogen atom has been further removed from the aryl group within an arylalkyl group, such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring within the aromatic hydrocarbon group may be substituted with a substituent. Examples of substituents include an alkyl group, an alkoxy group, a halogen atom, a halogenated alkyl group, a hydroxyl group and an oxo group (=O).

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

With respect to a "divalent linking group containing a hetero atom", a hetero atom is an atom other than carbon and hydrogen, and examples thereof include an oxygen atom, a nitrogen atom, a sulfur atom and a halogen atom.

Specific examples of the divalent linking group containing a hetero atom include non-hydrocarbon linking groups such as —O—, —C(=O)—, —C(=O)—O—, a carbonate bond (—O—C(=O)—O—), —S—, —S(=O)$_2$—, —S(S=O)$_2$—O—, —NH—, —NR$^{04}$— (R$^{04}$ represents a substituent such as an alkyl group or an acyl group), —NH—C(=O)— and =N—; and a combination of at least one of these non-hydrocarbon groups with a divalent hydrocarbon group. As examples of the divalent hydrocarbon group, the same groups as those described above for the divalent hydrocarbon group which may have a substituent can be given, and a linear or branched aliphatic hydrocarbon group is preferable.

As $Y^2$, a linear or branched alkylene group, a divalent alicyclic hydrocarbon group or a divalent linking group containing a hetero atom is particularly desirable.

When $Y^2$ represents a linear or branched alkylene group, the alkylene group preferably has 1 to 10 carbon atoms, more preferably 1 to 6 carbon atoms, still more preferably 1 to 4 carbon atoms, and most preferably 1 to 3 carbon atoms. More specifically, the same linear alkylene groups and branched alkylene groups as those listed above as the "linear or branched aliphatic hydrocarbon group" within the description for the aforementioned "divalent hydrocarbon group which may have a substituent" for $Y^2$ can be used.

When $Y^2$ represents a divalent alicyclic hydrocarbon group, as the alicyclic hydrocarbon group, the same alicyclic hydrocarbon groups as those listed above as the "aliphatic hydrocarbon group containing a ring in the structure thereof" within the description for the aforementioned divalent linking group for $Y^2$ can be used.

As the alicyclic hydrocarbon group, a group in which two or more hydrogen atoms have been removed from cyclopentane, cyclohexane, norbornane, isobornane, adamantane, tricyclodecane or tetracyclododecane is particularly desirable.

When $Y^2$ represents a divalent linking group containing a hetero atom, preferred examples of the linking groups include —O—, —C(=O)—O—, —C(=O)—, —O—C(=O)—O—, —C(=O)—NH—, —NH— (H may be replaced with a substituent such as an alkyl group, an acyl group or the like), —S—, —S(=O)$_2$—, —S(=O)$_2$—O—, groups represented by general formula —Y$^{21}$—O—Y$^{22}$—, —[Y$^{21}$—C(=O)—O]$_{m'}$—Y$^{22}$— or —Y$^{21}$—O—C(=O)—Y$^{22}$— [in the formulas, each of Y$^{21}$ and Y$^{22}$ independently represents a divalent hydrocarbon group which may have a substituent, O represents an oxygen atom, and m' represents an integer of 0 to 3].

When $Y^2$ represents —NH—, this H may be substituted with a substituent such as an alkyl group or an acyl group. The substituent (an alkyl group, an acyl group or the like) preferably has 1 to 10 carbon atoms, more preferably 1 to 8 carbon atoms, and most preferably 1 to 5 carbon atoms.

In formula —Y$^{21}$—O—Y$^{22}$—, —[Y$^{21}$—C(=O)—O]$_{m'}$—Y$^{22}$— or —Y$^{21}$—O—C(=O)—Y$^{22}$—, each of Y$^{21}$ and Y$^{22}$ independently represents a divalent hydrocarbon group which may have a substituent. Examples of the divalent hydrocarbon groups include the same groups as those described above for the "divalent hydrocarbon group which may have a substituent" usable as $Y^2$.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m'}$—Y$^{22}$—, m' represents an integer of 0 to 3, preferably an integer of 0 to 2, more preferably 0 or 1, and most preferably 1. In other words, it is particularly desirable that the group represented by the formula —[Y$^{21}$—C(=O)—O]$_{m'}$—Y$^{22}$— be a group represented by the formula —Y$^{21}$—C(=O)—O—Y$^{22}$—. Of these, groups represented by the formula —(CH$_2$)$_{a'}$—C(=O)—O—(CH$_2$)$_{b'}$— are preferred. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group for $Y^2$ containing a hetero atom, an organic group constituted of a combination of at least one non-hydrocarbon group with a divalent hydrocarbon group is preferable. Among the examples described above, linear groups containing an oxygen atom as a hetero atom, e.g., groups containing an ether bond or ester bond are preferred, groups represented by the above formula —$Y^{21}$—O—$Y^{22}$—, —$[Y^{21}$—C(=O)—O$]_{m'}$—$Y^{22}$— or —$Y^{21}$—O—C(=O)—$Y^{22}$— are more preferred, and groups represented by the above formula —$[Y^{21}$—C(=O)—O$]_{m'}$—$Y^{22}$— or —$Y^{21}$—O—C(=O)—$Y^{22}$— are most preferred.

Of the various possibilities described above, as $Y^2$, linear or branched alkylene groups, or divalent linking groups containing a hetero atom are preferable, and linear or branched alkylene groups, groups represented by the above formula —$Y^{21}$—O—$Y^{22}$—, groups represented by the above formula —$[Y^{21}$—C(=O)—O$]_{m'}$—$Y^{22}$— or groups represented by the above formula —$Y^{21}$—O—C(=O)—$Y^{22}$— are more preferable.

Specific examples of the structural unit (a11) include structural units represented by general formulas (a1-1) to (a1-4) shown below.

[Chemical Formula 13]

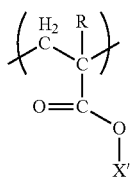
(a1-1)

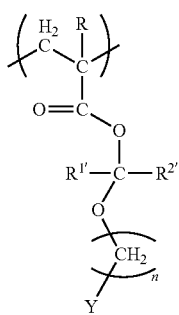
(a1-2)

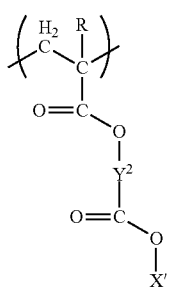
(a1-3)

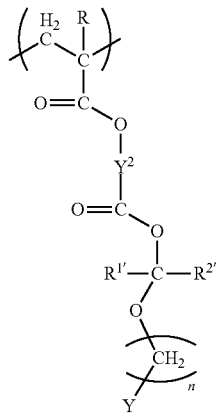
(a1-4)

In the formulas, R, $R^{1'}$, $R^{2'}$, n, Y and $Y^2$ are the same as defined above; and X' represents a tertiary alkyl ester-type acid dissociable group.

In the formulas, the tertiary alkyl ester-type acid dissociable group for X' include the same tertiary alkyl ester-type acid dissociable groups as those described above.

As $R^{1'}$, $R^{2'}$, n and Y are respectively the same as defined for $R^{1'}$, $R^{2'}$, n and Y in general formula (p1) described above in connection with the "acetal-type acid dissociable group".

As examples of $Y^2$, the same groups as those described above for $Y^2$ in general formula (a1-0-2) can be given.

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 14]

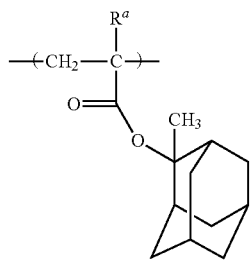
(a1-1-1)

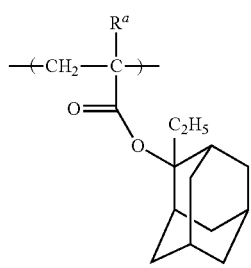
(a1-1-2)

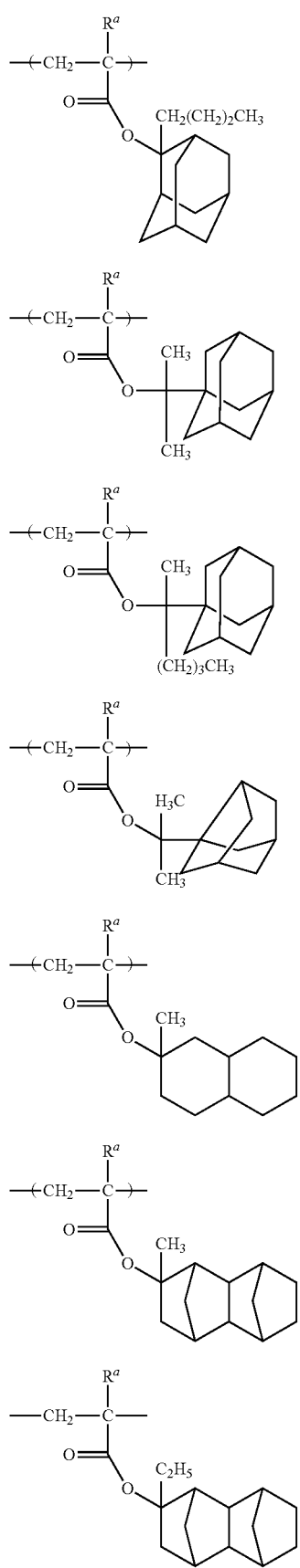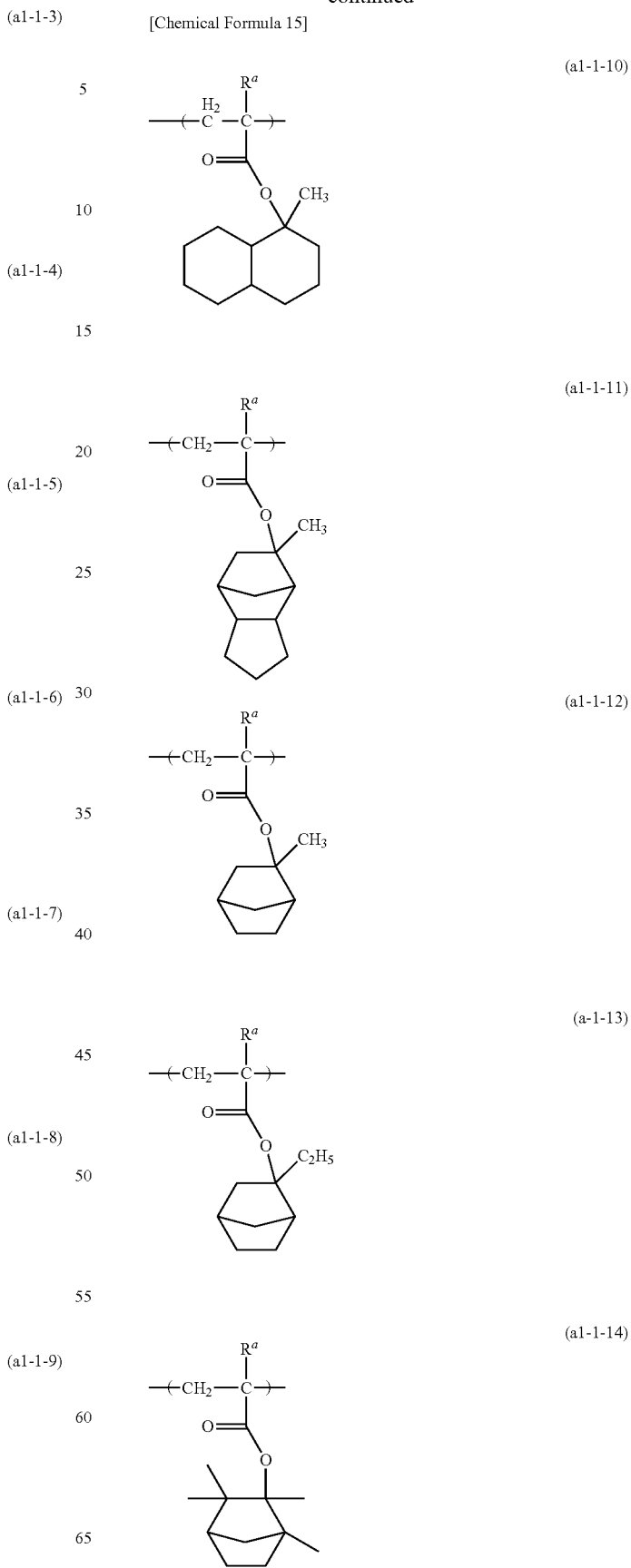

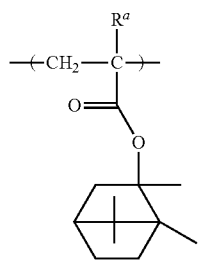
(a1-1-15)
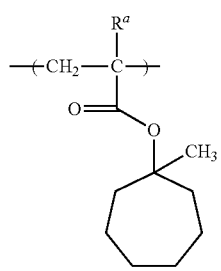
(a1-1-16)
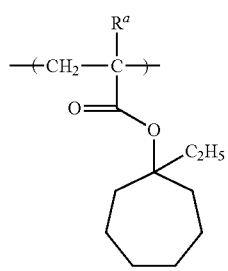
(a1-1-17)
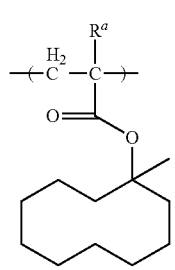
(a1-1-18)
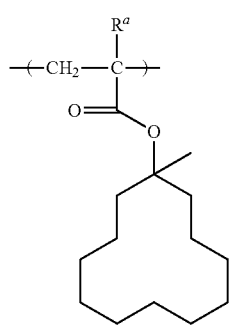
(a1-1-19)
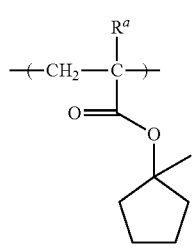
(a1-1-20)
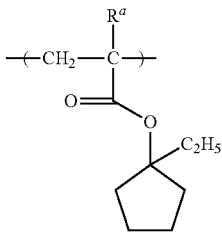
(a1-1-21)
[Chemical Formula 16]
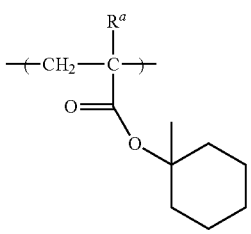
(a1-1-22)
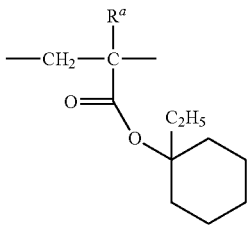
(a-1-1-23)
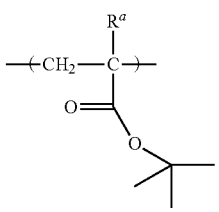
(a1-1-24)
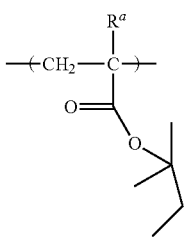
(a1-1-25)
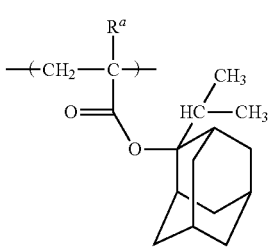
(a1-1-26)

(a1-1-27)
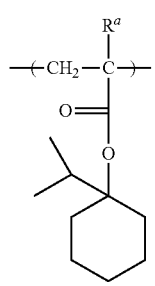
(a1-1-28)
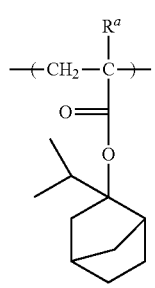
(a1-1-29)
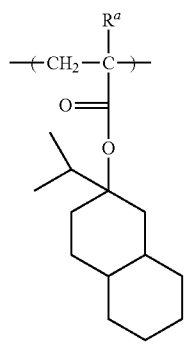
(a1-1-30)
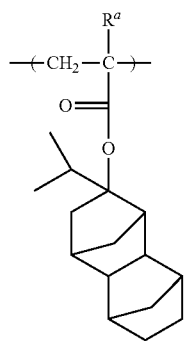
(a1-1-31)
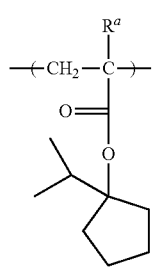
[Chemical Formula 17]
(a1-2-1)
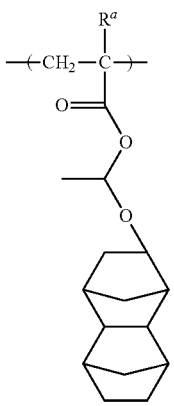
(a1-2-2)
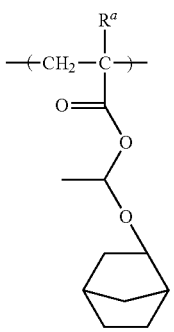
(a1-2-3)
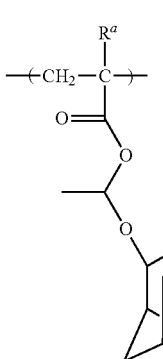
(a1-2-4)
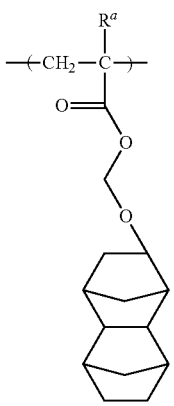

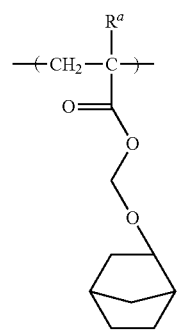 (a1-2-5)
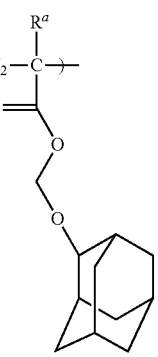 (a1-2-6)
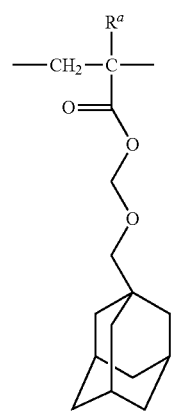 (a1-2-7)
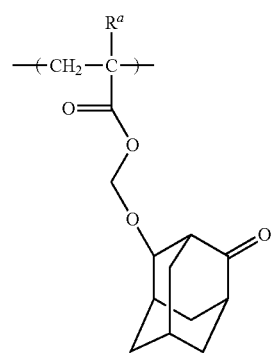 (a1-2-8)
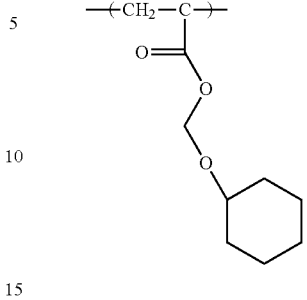 (a1-2-9)
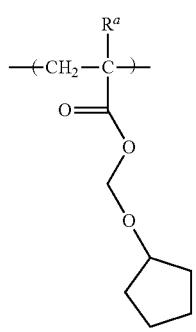 (a1-2-10)
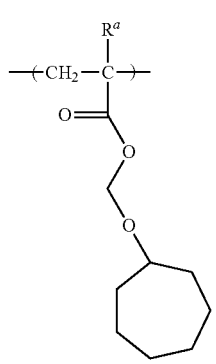 (a1-2-11)
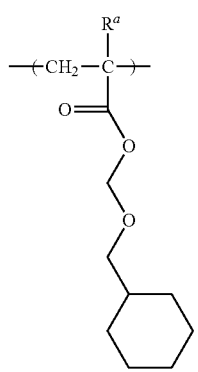 (a1-2-12)

(a1-2-13)
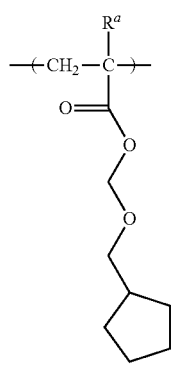
(a1-2-14)
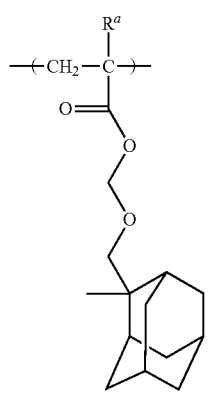
(a1-2-15)
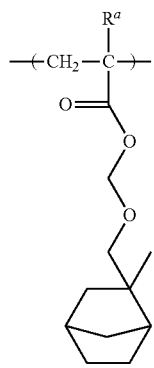
(a1-2-16)
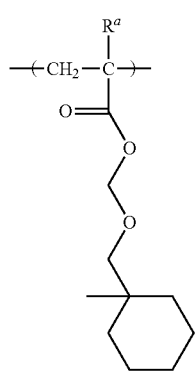
(a1-2-17)
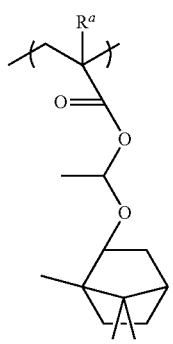
(a1-2-18)
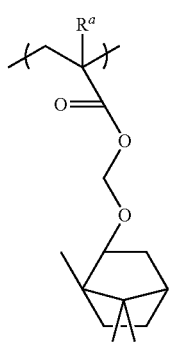
(a1-2-19)
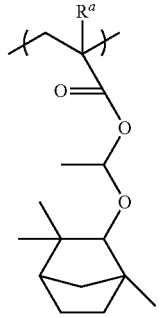
(a1-2-20)
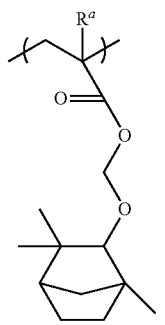
(a1-2-21)

(a1-2-22)
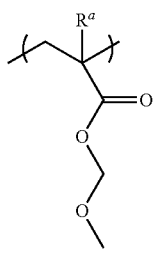
(a1-2-23)
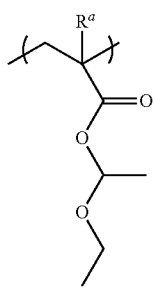
(a1-2-24)
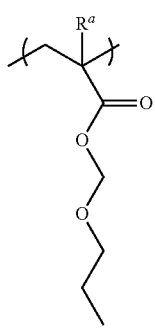
[Chemical Formula 18]
(a1-3-1)
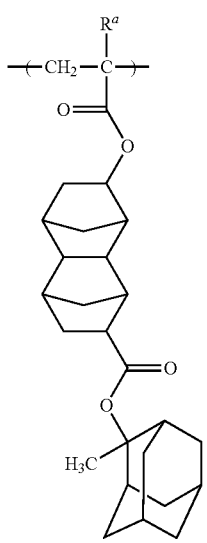
(a1-3-2)
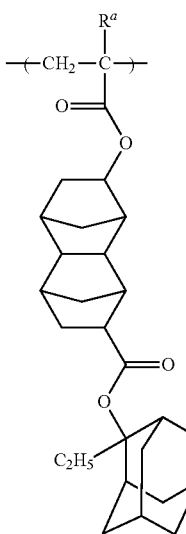
(a1-3-3)
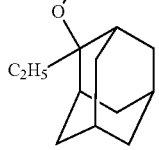
(a1-3-4)
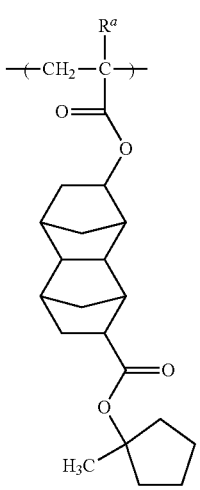

-continued
(a1-3-5)
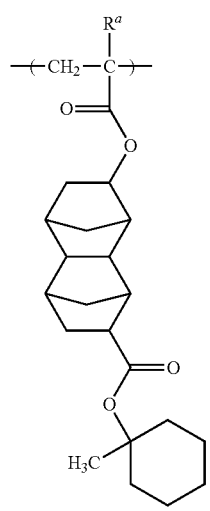
(a1-3-6)
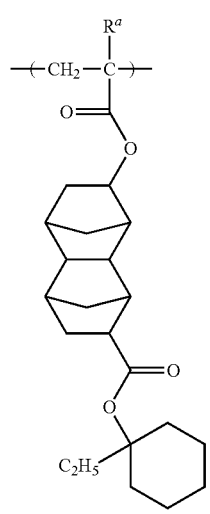
(a1-3-7)
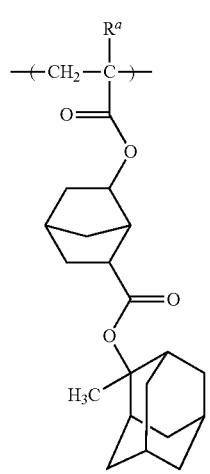
-continued
(a1-3-8)
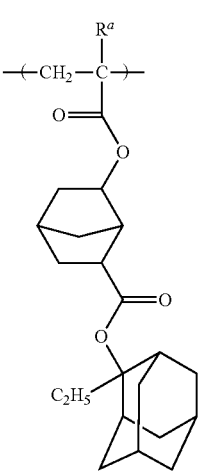
(a1-3-9)
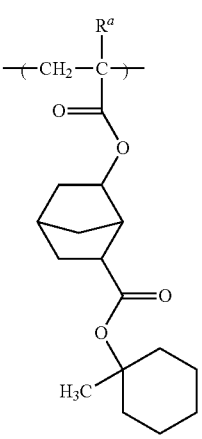
(a1-3-10)
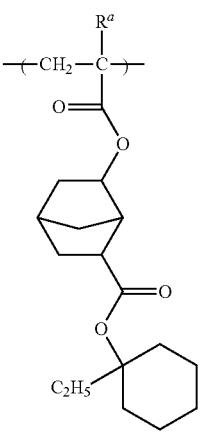

-continued
(a1-3-11)
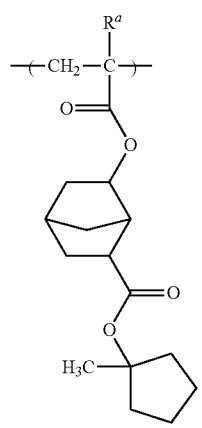
(a1-3-12)
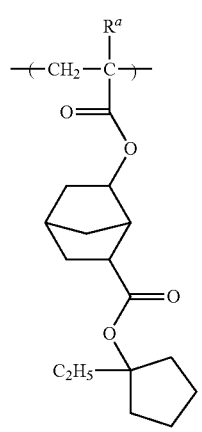
(a1-3-13)
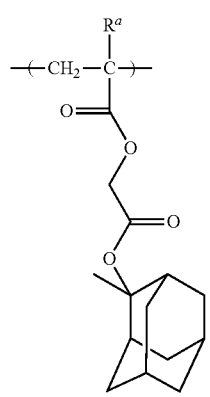
(a1-3-14)
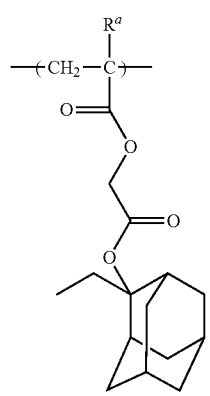
-continued
(a1-3-15)
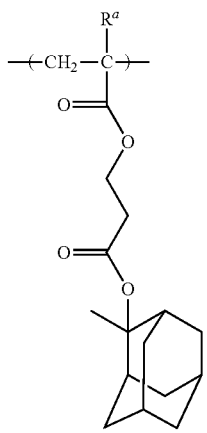
(a1-3-16)
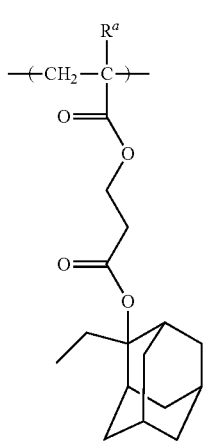
(a1-3-17)
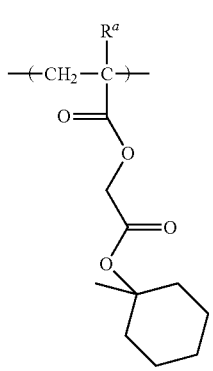
(a1-3-18)
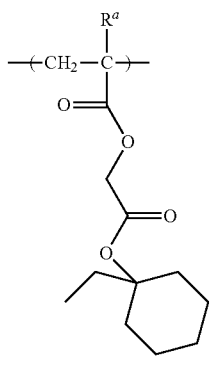

[Chemical Formula 19]
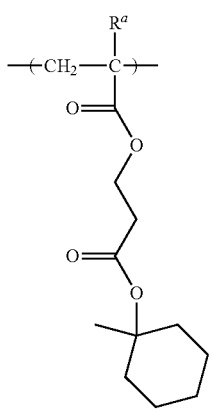
(a1-3-19)
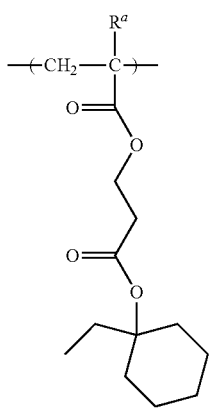
(a1-3-20)
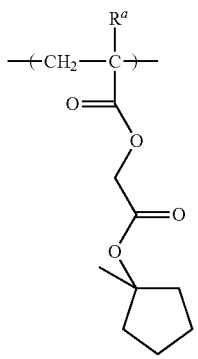
(a1-3-21)
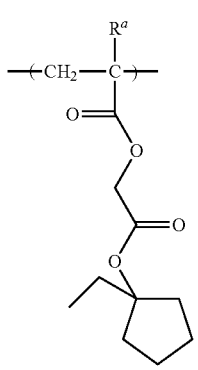
(a1-3-22)
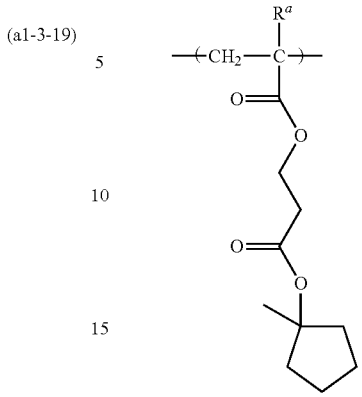
(a1-3-23)
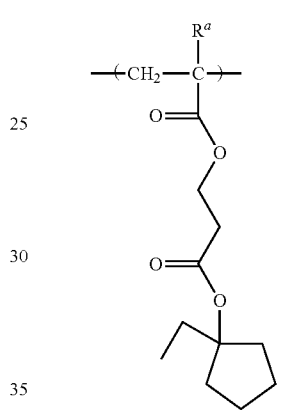
(a1-3-24)
[Chemical Formula 20]
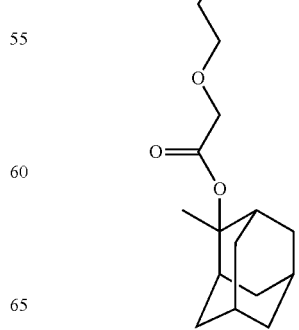
(a1-3-25)

(a1-3-26)
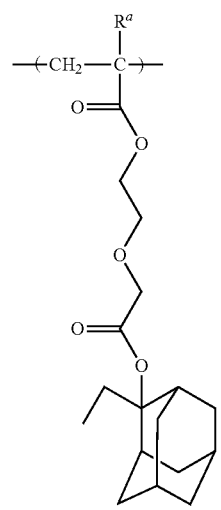
(a1-3-27)
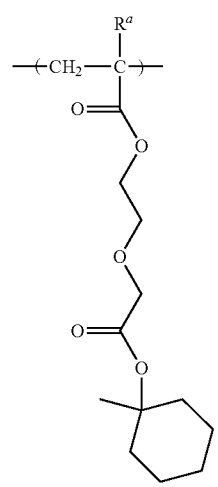
(a1-3-28)
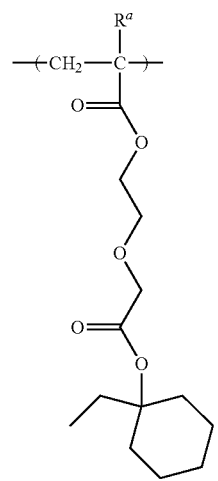
(a1-3-29)
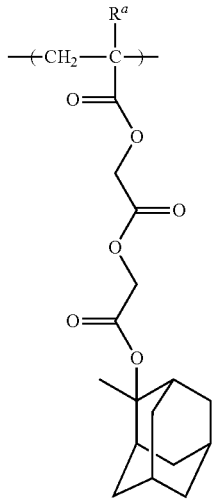
(a1-3-30)
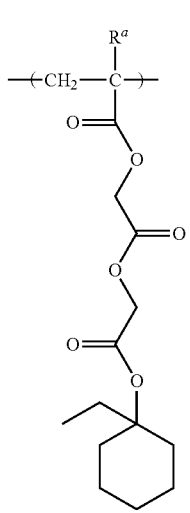
(a1-3-31)
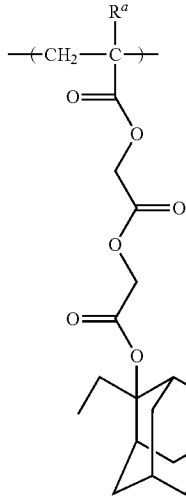

(a1-3-32)
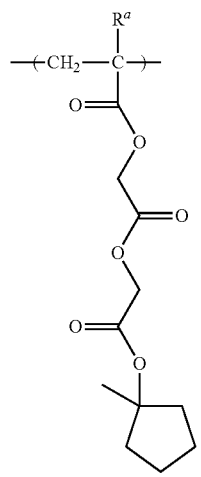
[Chemical Formula 21]
(a1-4-1)
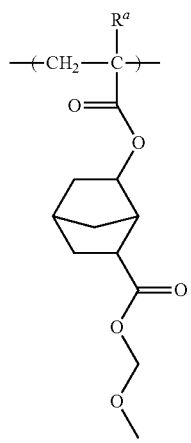
(a1-4-2)
(a1-4-3)
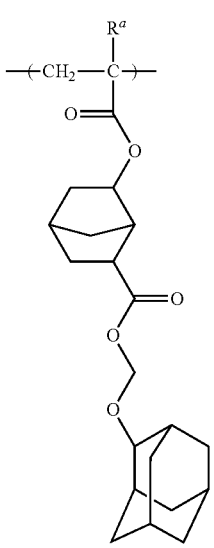
(a1-4-4)
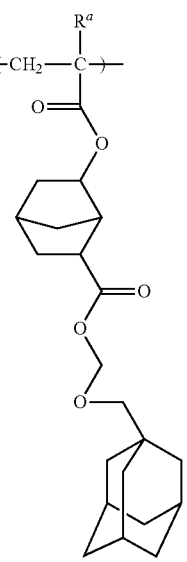
(a1-4-5)
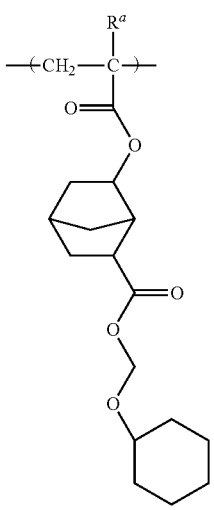

(a1-4-6)
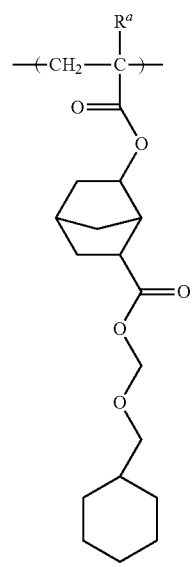
(a1-4-7)
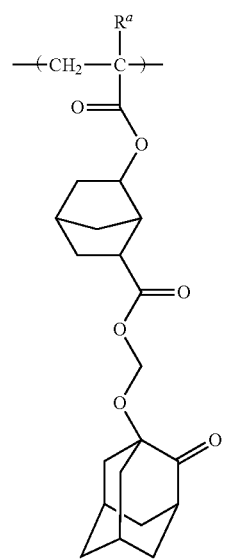
(a1-4-8)
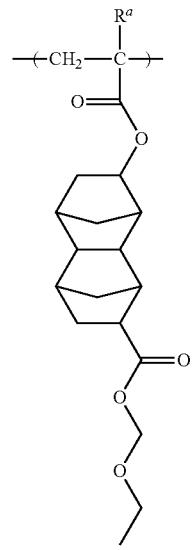
(a1-4-9)
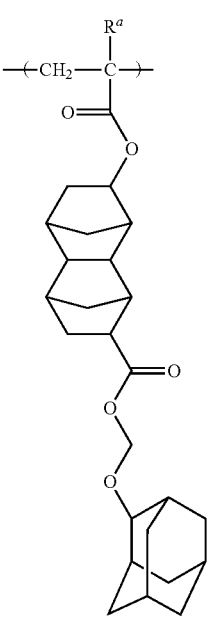
(a1-4-10)
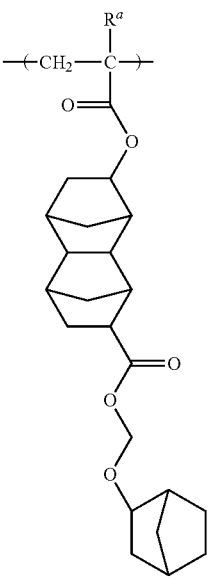

(a1-4-11)
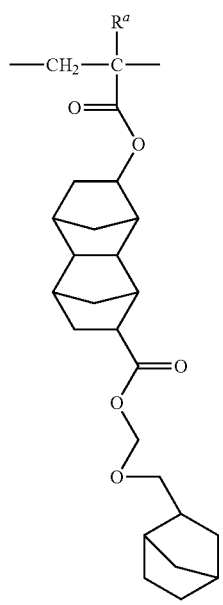
(a1-4-12)
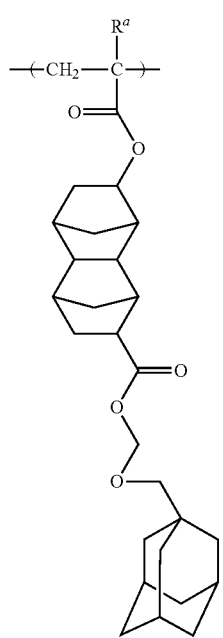
(a1-4-13)
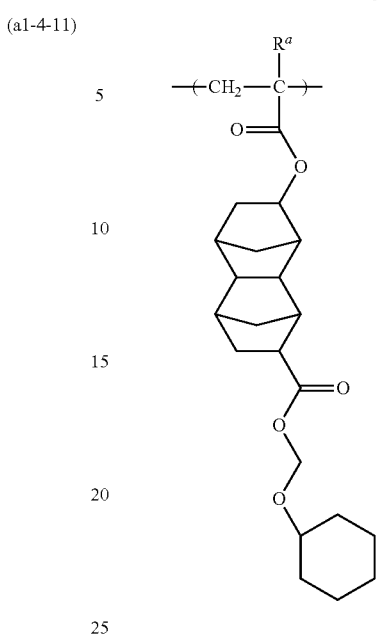
(a1-4-14)

-continued (a1-4-15)

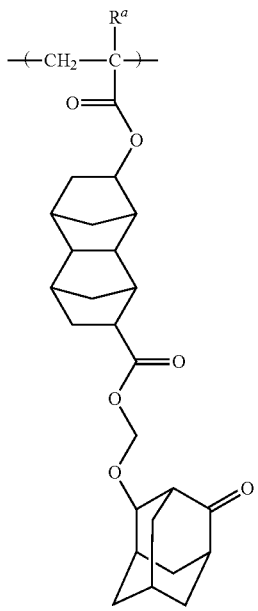

In the present invention, as the structural unit (a11), it is preferable to include at least one structural unit selected from the group consisting of structural units represented by general formula (a1-0-11) shown below, structural units represented by general formula (a1-0-12) shown below, structural units represented by general formula (a1-0-13) shown below and structural units represented by general formula (a1-0-2) shown below. It is particularly desirable that the structural unit (a11) include at least one structural unit selected from the group consisting of structural units represented by general formula (a1-0-11) shown below, structural units represented by general formula (a1-0-12) shown below and structural units represented by general formula (a1-0-2) shown below.

[Chemical Formula 22]

(a1-0-11)

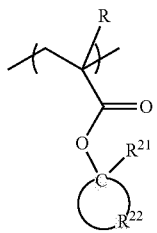

(a1-0-12)

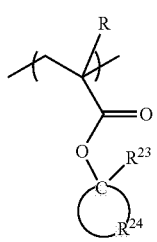

-continued

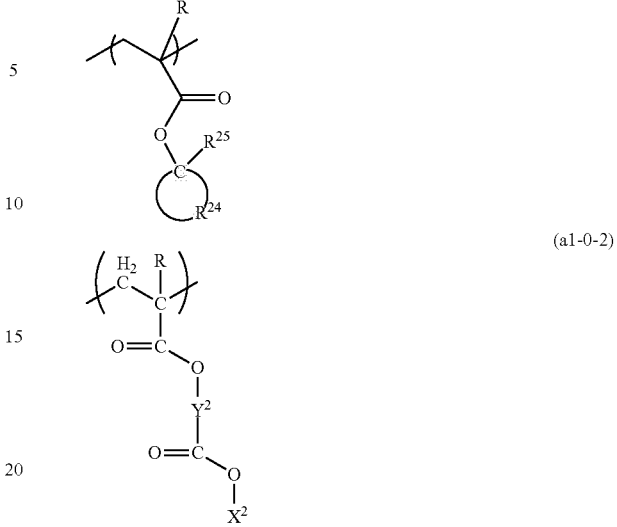

In the formulas, R represents a hydrogen atom, an alkyl group of 1 to 5 carbon atoms or a halogenated alkyl group of 1 to 5 carbon atoms; $R^{21}$ represents an alkyl group; $R^{22}$ represents a group which forms an aliphatic monocyclic group with the carbon atom to which this $R^{22}$ group is bonded; $R^{23}$ represents a branched alkyl group; $R^{24}$ represents a group which forms an aliphatic polycyclic group with the carbon atom to which this $R^{24}$ group is bonded; $R^{25}$ represents a linear alkyl group of 1 to 5 carbon atoms; $Y^2$ represents a divalent linking group; and $X^2$ represents an acid dissociable group.

In the formulas, R, $Y^2$ and $X^2$ are the same as defined above.

In general formula (a1-0-11), as the alkyl group for $R^{21}$, the same alkyl groups as those described above for $R^{t4}$ in formulas (1-1) to (1-9) can be used, and a methyl group, an ethyl group or an isopropyl group is preferable.

As the aliphatic monocyclic group formed by $R^{22}$ and the carbon atoms to which $R^{22}$ is bonded, the same aliphatic cyclic groups as those described above for the aforementioned tertiary alkyl ester-type acid dissociable group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

The monocycloalkane may or may not have part of the carbon atoms constituting the ring replaced with an ether group (—O—).

Further, the monocycloalkane may have a substituent such as an alkyl group of 1 to 5 carbon atoms, a fluorine atom or a fluorinated alkyl group of 1 to 5 carbon atoms.

As an examples of $R^{22}$ constituting such an aliphatic cyclic group, an alkylene group which may have an ether group (—O—) interposed between the carbon atoms can be given.

Specific examples of structural units represented by general formula (a1-0-11) include structural units represented by the aforementioned formulas (a1-1-16) to (a1-1-23), (a1-1-27) and (a1-1-31). Among these, a structural unit represented by general formula (a1-1-02) shown below which includes the structural units represented by the aforementioned formulas (a1-1-16), (a1-1-17), (a1-1-20) to (a1-1-23), (a1-1-27) and (a1-1-31) is preferable. Further, a structural unit represented by general formula (a1-1-02') shown below is also preferable.

In the formulas, h is preferably 1 or 2.

[Chemical Formula 23]

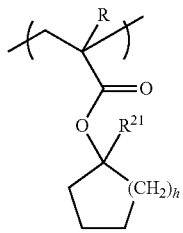
(a1-1-02)

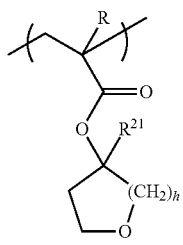
(a1-1-02')

In the formulas, R and $R^{21}$ are the same as defined above; and h represents an integer of 1 to 3.

In general formula (a1-0-12), as the branched alkyl group for $R^{23}$, the same alkyl groups as those described above for $R^{14}$ which are branched can be used, and an isopropyl group is particularly desirable.

As the aliphatic polycyclic group formed by $R^{24}$ and the carbon atoms to which this $R^{24}$ group is bonded, the same aliphatic cyclic groups as those described above for the aforementioned tertiary alkyl ester-type acid dissociable group and which are polycyclic can be used.

Specific examples of structural units represented by general formula (a1-0-12) include structural units represented by the aforementioned formulas (a1-1-26) and (a1-1-28) to (a1-1-30).

As the structural unit represented by formula (a1-0-12), a structural unit in which the aliphatic polycyclic group formed by $R^{24}$ and the carbon atom to which this $R^{24}$ group is bonded is a 2-adamantyl group is preferable, and a structural unit represented by the aforementioned formula (a1-1-26) is particularly desirable.

In general formula (a1-0-13), R and $R^{24}$ are the same as defined above.

As the linear alkyl group for $R^{25}$, the same linear alkyl groups as those described above for $R^{14}$ in the aforementioned formulas (1-1) to (1-9) can be mentioned, and a methyl group or an ethyl group is particularly desirable.

Specific examples of structural units represented by general formula (a1-0-13) include structural units represented by the aforementioned formulas (a1-1-1) to (a1-1-3) and (a1-1-7) to (a1-1-15) which were described above as specific examples of the structural unit represented by general formula (a1-1).

As the structural unit represented by formula (a1-0-13), a structural unit in which the aliphatic polycyclic group formed by $R^{24}$ and the carbon atom to which this $R^{24}$ group is bonded is a 2-adamantyl group is preferable, and a structural unit represented by the aforementioned formula (a1-1-1) or (a1-1-2) is particularly desirable.

Examples of structural units represented by general formula (a1-0-2) include structural units represented by the aforementioned formulas (a1-3) and (a1-4), and structural units represented by formula (a1-3) are particularly desirable.

As a structural unit represented by general formula (a1-0-2), those in which $Y^2$ in the formula is a group represented by the above formula $-Y^{21}-O-Y^{22}-$, a group represented by the above formula $-[Y^{21}-C(=O)-O]_{m'}-Y^{22}-$ or a group represented by the above formula $-Y^{21}-O-C(=O)-Y^{22}-$ are particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 24]

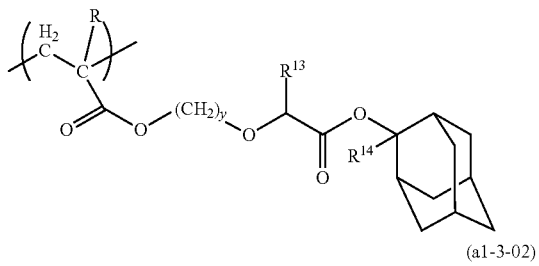
(a1-3-01)

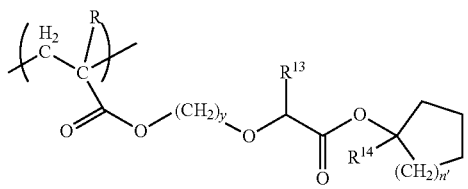
(a1-3-02)

In the formulas, R is the same as defined above; $R^{13}$ represents a hydrogen atom or a methyl group; $R^{14}$ represents an alkyl group; y represents an integer of 1 to 10; and n' represents an integer of 0 to 3.

[Chemical Formula 25]

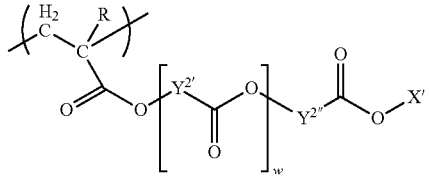
(a1-3-03)

In the formula, R is the same as defined above; each of $Y^{2'}$ and $Y^{2''}$ independently represents a divalent linking group; X' represents an acid dissociable group; and w represents an integer of 0 to 3.

In general formulas (a1-3-01) and (a1-3-02), $R^{13}$ is preferably a hydrogen atom.

$R^{14}$ is the same as defined for $R^{14}$ in the aforementioned formulas (1-1) to (1-9).

y is preferably an integer of 1 to 8, more preferably an integer of 1 to 5, and most preferably 1 or 2.

n' is preferably 1 or 2, and most preferably 2.

Specific examples of structural units represented by general formula (a1-3-01) include structural units represented by the aforementioned formulas (a1-3-25) and (a1-3-26).

Specific examples of structural units represented by general formula (a1-3-02) include structural units represented by the aforementioned formulas (a1-3-27) and (a1-3-28).

In general formula (a1-3-03), as the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable group for X', the same groups as those described above can be used. X' is preferably a tertiary alkyl ester-type acid dissociable group, more preferably the aforementioned (i) group which forms a tertiary carbon atom on the ring structure of a monovalent aliphatic cyclic group in which a substituent is bonded to the carbon atom to which an atom adjacent to the acid dissociable, dissolution inhibiting group is bonded. Among these, a group represented by the aforementioned general formula (1-1) is particularly desirable.

w represents an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable, and a structural unit represented by general formula (a1-3-03-1) is particularly desirable.

[Chemical Formula 26]

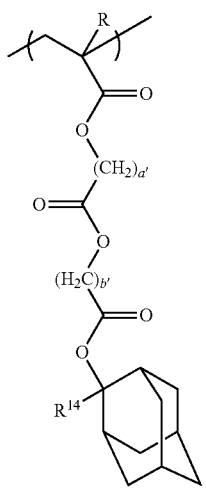

(a1-3-03-1)

-continued

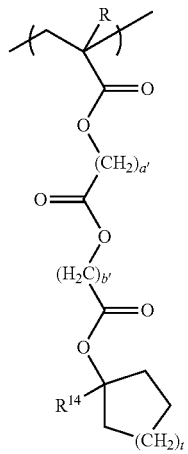

(a1-3-03-2)

In the formulas, R and $R^{14}$ are the same as defined above; a' represents an integer of 1 to 10; b' represents an integer of 1 to 10; and t represents an integer of 0 to 3.

In general formulas (a1-3-03-1) and (a1-3-03-2), a' is preferably an integer of 1 to 8, more preferably an integer of 1 to 5, and most preferably 1 or 2.

b' is preferably an integer of 1 to 8, more preferably an integer of 1 to 5, and most preferably 1 or 2.

t is preferably an integer of 1 to 3, and most preferably 1 or 2.

Specific examples of structural units represented by general formula (a1-3-03-1) or (a1-3-03-2) include structural units represented by the aforementioned formulas (a1-3-29) to (a1-3-32).

{Structural Unit (a12)}

The structural unit (a12) is a structural unit derived from a hydroxystyrene which may have the hydrogen atom bonded to the carbon atom on the α-position substituted with a substituent and which may have the hydrogen atom bonded to the benzene ring substituted with a substituent other than the hydroxyl group, and in which the hydrogen atom of the hydroxyl group is substituted with an acid dissociable group or a substituent containing an acid dissociable group.

A "hydroxystyrene which may have the hydrogen atom bonded to the carbon atom on the α-position substituted with a substituent and which may have the hydrogen atom bonded to the benzene ring substituted with a substituent other than the hydroxyl group" is the same as defined above for the (α-substituted) hydroxystyrene within the description for the "styrenes or the derivatives thereof".

In the structural unit (a12), as the acid dissociable group for substituting the hydrogen atom of the hydroxyl group, the same groups as those described above can be used. The acid dissociable group is preferably a tertiary alkyl ester-type acid dissociable group or an acetal-type acid dissociable group, and more preferably an acetal-type acid dissociable group.

As the substituent containing an acid dissociable group, groups constituted of an acid dissociable group and a divalent linking group can be used. As examples of the divalent linking group, the same divalent linking groups as those described above for $Y^2$ in general formula (a1-0-2) can be given. As the divalent linking group, a group in which the terminal structure on the acid dissociable group side is constituted of a carbonyloxy group is particularly desirable.

In this case, it is preferable that the acid dissociable group is bonded to the oxygen atom (—O—) of the carbonyloxy group.

As the substituent containing an acid dissociable group, groups represented by the formula $R^{11'}$—O—C(=O)— and groups represented by the formula $R^{11'}$—O—C(=O)—$R^{12'}$— are preferred. In the formulas, $R^{11'}$ represents an acid dissociable group, and $R^{12'}$ represents a linear or branched alkylene group.

The acid dissociable group for $R^{11'}$ is preferably a tertiary alkyl ester-type acid dissociable group or an acetal-type acid dissociable group, and more preferably a tertiary alkyl ester-type acid dissociable group.

Preferable examples of the tertiary alkyl ester-type acid dissociable groups for $R^{11'}$ include the aforementioned aliphatic branched, acid dissociable groups represented by the formula —$C(R^{71})(R^{72})(R^{73})$, groups represented by general formulas (1-1) to (1-9) and groups represented by general formulas (2-1) to (2-6).

Examples of the alkylene group for $R^{12'}$ include a methylene group, an ethylene group, a trimethylene group, a tetramethylene group and a 1,1-dimethylethylene group. As $R^{12'}$, a linear alkylene group is preferred.

Specific examples of the structural unit (a12) include those listed above within the description for the "structural units derived from styrenes or the derivatives thereof" and represented by general formula (III) in which p represents an integer of 1 to 3 (preferably 1) and $X^c$ represents an acid dissociable group or a substituent containing an acid dissociable group.

{Structural Unit (a13)}

The structural unit (a13) is a structural unit derived from a vinyl(hydroxynaphthalene) which may have the hydrogen atom bonded to the carbon atom on the α-position substituted with a substituent and which may have the hydrogen atom bonded to the naphthalene ring substituted with a substituent other than the hydroxyl group, and in which the hydrogen atom of the hydroxyl group is substituted with an acid dissociable group or a substituent containing an acid dissociable group.

A "vinyl(hydroxynaphthalene) which may have the hydrogen atom bonded to the carbon atom on the α-position substituted with a substituent and which may have the hydrogen atom bonded to the naphthalene ring substituted with a substituent other than the hydroxyl group" is the same as defined above for the (α-substituted) vinyl(hydroxynaphthalene) within the description for the "vinylnaphthalenes or the derivatives thereof".

In the structural unit (a13), as the acid dissociable groups for substituting the hydrogen atom of the hydroxyl group and the substituent containing an acid dissociable group, the same as those described above in connection with the structural unit (a12) can be used.

Specific examples of the structural unit (a13) include those listed above within the description for the "structural units derived from vinylnaphthalenes or the derivatives thereof" and represented by general formula (IV) in which x represents an integer of 1 to 3 (preferably 1), and $X^d$ represents an acid dissociable group or a substituent containing an acid dissociable group.

As the structural unit (a1) contained in the component (A1), one type of structural unit may be used, or two or more types may be used.

In the component (A1), the amount of the structural unit (a1) based on the combined total of all structural units constituting the component (A1) is preferably 15 to 70 mol %, more preferably 15 to 60 mol %, and still more preferably 20 to 55 mol %. When the amount of the structural unit (a1) is at least as large as the lower limit of the above-mentioned range, a pattern can be easily formed using a resist composition prepared from the component (A1), and various lithography properties such as sensitivity, resolution and pattern shape are also improved. On the other hand, when the amount of the structural unit (a1) is no more than the upper limit of the above-mentioned range, a good balance can be achieved with the other structural units.

(Structural Unit (a2))

In addition to the structural unit (a0), or in addition to the structural units (a0) and (a1), it is preferable that the component (A1) further contain at least one structural unit (a2) selected from the group consisting of a structural unit derived from an acrylate ester which may have the hydrogen atom bonded to the carbon atom on the α-position substituted with a substituent and contains a —$SO_2$— containing cyclic group (hereafter, referred to as "structural unit (a2$^S$)") and a structural unit derived from an acrylate ester which may have the hydrogen atom bonded to the carbon atom on the α-position substituted with a substituent and contains a lactone-containing cyclic group or cyclic carbonate skeleton (hereafter, referred to as structural unit (a2$^L$)").

When the component (A1) is used for forming a resist film, the —$SO_2$— containing cyclic group, lactone-containing cyclic group or carbonate skeleton-containing cyclic group of the structural unit (a2) is effective in improving the adhesion between the resist film and the substrate. Further, it is also effective in an alkali developing process in terms of improving the compatibility with developing solutions containing water, such as alkali developing solutions.

In those cases where the aforementioned structural unit (a0) or (a1) contains a —$SO_2$-containing cyclic group, lactone-containing cyclic group or cyclic carbonate skeleton within the structure thereof, this structural unit would also meet the definition for the structural unit (a2). However, it is defined so that such structural units correspond to the structural unit (a0) or (a1) and do not correspond to the structural unit (a2).

Structural Unit (a2$^S$):

The structural unit (a2$^S$) is a structural unit derived from an (α-substituted) acrylate ester containing a —$SO_2$— containing cyclic group.

As described above, a —$SO_2$— containing cyclic group refers to a cyclic group including a ring that contains —$SO_2$— within the ring skeleton thereof, and more specifically, a cyclic group in which the sulfur atom (S) within —$SO_2$— forms a part of the ring skeleton of the cyclic group. This ring that contains —$SO_2$— within the ring skeleton thereof is counted as the first ring. A cyclic group in which the only ring structure is this ring that contains —$SO_2$— in the ring skeleton thereof is referred to as a monocyclic group, and a group containing other ring structures is described as a polycyclic group regardless of the structure of the other rings. The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20 carbon atoms, still more preferably 4 to 15 carbon atoms, and most preferably 4 to 12 carbon atoms. Herein, the number of carbon atoms refers to the number of carbon atoms constituting the ring skeleton, excluding the number of carbon atoms within a substituent.

The —SO$_2$— containing cyclic group may be either a —SO$_2$— containing aliphatic cyclic group or a —SO$_2$— containing aromatic cyclic group. A —SO$_2$— containing aliphatic cyclic group is preferable.

Examples of the —SO$_2$— containing aliphatic cyclic group include aliphatic cyclic groups in which part of the carbon atoms constituting the ring skeleton has been substituted with a —SO$_2$— group or a —O—SO$_2$— group and has at least one hydrogen atom removed from the aliphatic hydrocarbon ring. Specific examples include an aliphatic hydrocarbon ring in which a —CH$_2$— group constituting the ring skeleton thereof has been substituted with a —SO$_2$— group and has at least one hydrogen atom removed therefrom; and an aliphatic hydrocarbon ring in which a —CH$_2$—CH$_2$— group constituting the ring skeleton has been substituted with a —O—SO$_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic alicyclic hydrocarbon group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —SO$_2$— containing cyclic group may have a substituent. Examples of the substituent include an alkyl group, an alkoxy group, a halogen atom, a hydroxyl group, an oxo group (=O), a halogenated alkyl group, a halogenated alkoxy group, a hydroxyalkyl group, —C(=O)—R$^{80}$ [R$^{80}$ represents an alkyl group], —COOR$^{81}$ [R$^{81}$ represents a hydrogen atom or an alkyl group], —OC(=O)R$^{81}$ [R$^{81}$ represents a hydrogen atom or an alkyl group], a cyano group, an amino group, an amide group, a nitro group, a sulfur atom and a sulfonyl group (SO$_2$).

The alkyl group for the substituent may be a linear, branched or cyclic group, or may be a combination of these groups. The number of carbon atoms thereof is preferably 1 to 30.

When the alkyl group is linear or branched, the number of carbon atoms thereof is preferably 1 to 20, more preferably 1 to 17, still more preferably 1 to 15, and most preferably 1 to 10. More specifically, the same linear or branched saturated hydrocarbon groups as those described later as specific examples of aliphatic hydrocarbon groups can be used. Of these, alkyl groups of 1 to 6 carbon atoms are preferred, and specific examples thereof include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

When the alkyl group is cyclic (i.e., a cycloalkyl group), the number of carbon atoms is preferably 3 to 30, more preferably 3 to 20, still more preferably 3 to 15, still more preferably 4 to 12, and most preferably 5 to 10. The alkyl group may be either a monocyclic group or a polycyclic group. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Further, specific examples of the polycycloalkane include adamantane, norbornane, isobornane, tricyclodecane and tetracyclododecane. These cycloalkyl groups may or may not have part or all of the hydrogen atoms bonded to the ring substituted with a substituent such as a fluorine atom or a fluorinated alkyl group.

Examples of the alkoxy group for the substituent include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

As examples of the halogenated alkoxy group for the substituent, groups in which part or all of the hydrogen atoms of the aforementioned alkoxy groups for the substituent have been substituted with the aforementioned halogen atoms can be given. As the halogenated alkoxy group, a fluorinated alkoxy group is preferable.

As examples of the hydroxyalkyl group for the substituent, the aforementioned alkyl groups for the substituent in which at least one of the hydrogen atoms has been substituted with a hydroxyl group can be given. The number of hydroxyl groups within the hydroxyalkyl group is preferably 1 to 3, and most preferably 1.

With respect to the aforementioned —C(=O)—R$^{80}$, —COOR$^{81}$ and —OC(=O)R$^{81}$ for the substituent, as the alkyl groups for R$^{80}$ and R$^{81}$, the same alkyl groups as those listed above as the alkyl groups for the substituent can be used.

Of the various possibilities described above, as the substituent within the —SO$_2$-containing cyclic group, an alkyl group, an alkoxy group, a halogen atom, a hydroxyl group, an oxo group (=O), a halogenated alkyl group, a hydroxyalkyl group, —COOR$^{81}$, —OC(=O)R$^{81}$, a cyano group or the like is preferred.

More specific examples of the —SO$_2$— containing cyclic group include groups represented by general formulas (3-1) to (3-4) shown below.

[Chemical Formula 27]

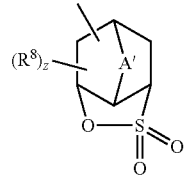

(3-1)

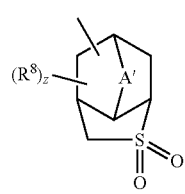

(3-2)

(3-3)

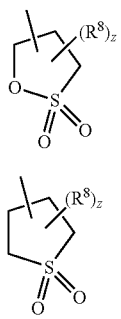

(3-4)

In the formulas, A' represents an oxygen atom, a sulfur atom or an alkylene group of 1 to 5 carbon atoms which may contain an oxygen atom or a sulfur atom; z represents an integer of 0 to 2; and $R^8$ represents an alkyl group, an alkoxy group, a halogen atom, a hydroxyl group, an oxo group (=O), a halogenated alkyl group, a hydroxyalkyl group, —COOR$^{81}$, —OC(=O)R$^{81}$ or a cyano group, wherein $R^{81}$ represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

A' is preferably an alkylene group of 1 to 5 carbon atoms or —O—, is more preferably an alkylene group of 1 to 5 carbon atoms, and is most preferably a methylene group.

z represents an integer of 0 to 2, and is most preferably 0.

When z is 2, the plurality of $R^8$ may be the same or different from each other.

As the alkyl group, alkoxy group, halogen atom, halogenated alkyl group, hydroxyalkyl group, —COOR$^{81}$ and —OC(=O)R$^{81}$ for $R^8$, the same alkyl groups, alkoxy groups, halogenated alkyl groups, —COOR$^{81}$, —OC(=O) R$^{81}$ and hydroxyalkyl groups as those described above as the substituent which the —SO$_2$— containing cyclic group may have can be used.

Specific examples of the cyclic groups represented by general formulas (3-1) to (3-4) are shown below. In each of the following formulas, "Ac" represents an acetyl group.

[Chemical Formula 28]

(3-1-1)

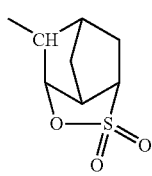

(3-1-2)

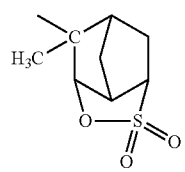

(3-1-3)

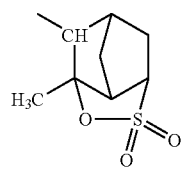

(3-1-4)

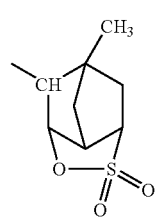

(3-1-5)

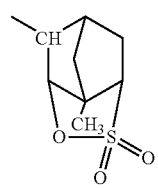

(3-1-6)

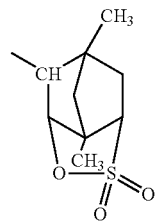

(3-1-7)

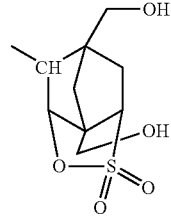

(3-1-8)

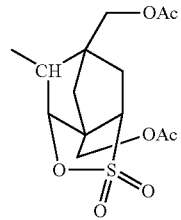

(3-1-9)

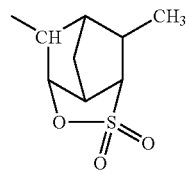

(3-1-10)
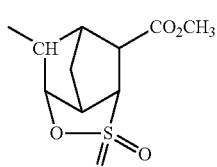
(3-1-11)
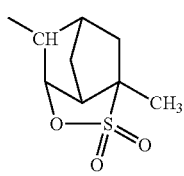
(3-1-12)
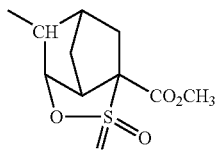
[Chemical Formula 29]
(3-1-13)
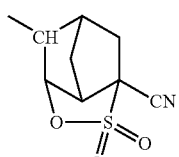
(3-1-14)
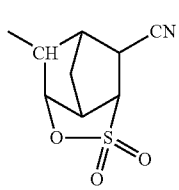
(3-1-15)
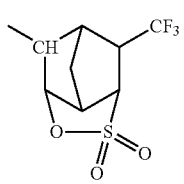
(3-1-16)
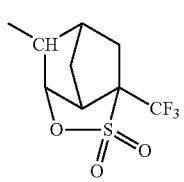
(3-1-17)
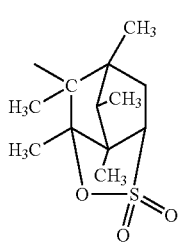
[Chemical Formula 30]
(3-1-18)
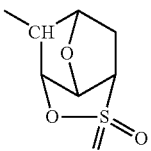
(3-1-19)
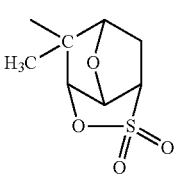
(3-1-20)
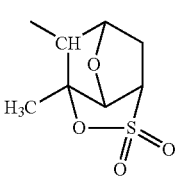
(3-1-21)
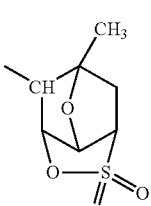
(3-1-22)
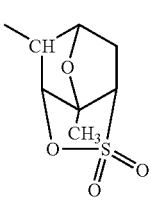
(3-1-23)
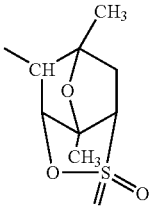
(3-1-24)
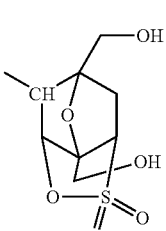
(3-1-25)
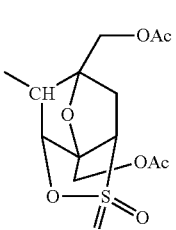

(3-1-26) 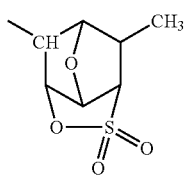

(3-1-27) 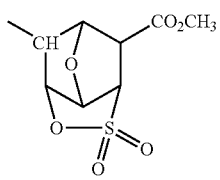

(3-1-28) 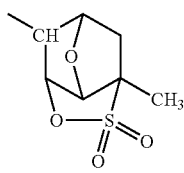

(3-1-29) 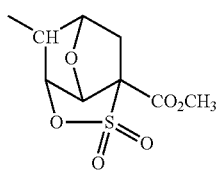

(3-1-30) 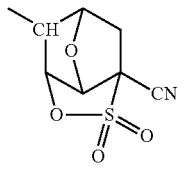

(3-1-31) 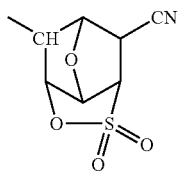

(3-1-32) 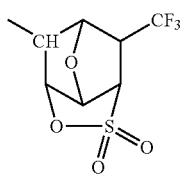

(3-1-33) 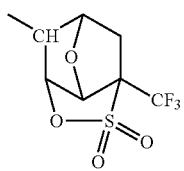

(3-2-1) 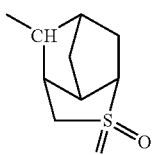

(3-2-2) 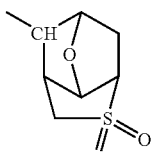

(3-3-1) 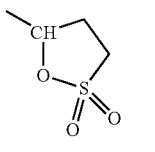

(3-4-1) 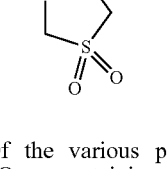

Of the various possibilities described above, as the —$SO_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by the aforementioned chemical formula (3-1-1) is most preferable.

More specific examples of the structural unit ($a2^S$) include structural units represented by general formula (a2-6) shown below.

[Chemical Formula 33]

(a2-6)

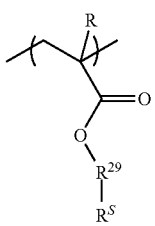

In the formula, R represents a hydrogen atom, an alkyl group of 1 to 5 carbon atoms or a halogenated alkyl group of 1 to 5 carbon atoms; $R^S$ represents a —$SO_2$— containing cyclic group; and $R^{29}$ represents a single bond or a divalent linking group.

In genera formula (a2-6), R is the same as defined above for R in general formula (a1-0-1) or (a1-0-2) described in connection with the structural unit (a1).

$R^S$ is the same as defined for the aforementioned —$SO_2$— containing group.

$R^{29}$ may be either a single bond or a divalent linking group. In terms of the effects of the present invention, a divalent linking group is preferable.

The divalent linking group for $R^{29}$ is not particularly limited. For example, the same divalent linking groups as those described for $Y^2$ in general formula (a1-0-2) explained above in relation to the structural unit (a1) can be used.

As the divalent linking group for $R^{29}$, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by $Y^2$.

As the divalent linking group containing an ester bond, a group represented by general formula: -$L^4$-C(=O)—O— (in the formula, $L^4$ represents a divalent linking group) is particularly desirable. That is, the structural unit ($a2^S$) is preferably a structural unit represented by general formula (a2-6-1) shown below.

[Chemical Formula 34]

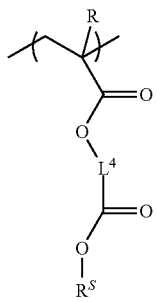

(a2-6-1)

In the formula, R and $R^S$ are the same as defined above; and $L^4$ represents a divalent linking group.

$L^4$ is not particularly limited. For example, the same divalent linking groups as those described for $Y^2$ in general formula (a1-0-2) explained above in relation to the structural unit (a1) can be used.

As the divalent linking group for $L^4$, a linear or branched alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene groups, divalent alicyclic hydrocarbon groups and divalent linking groups containing a hetero atom as those described above as preferable examples of $Y^2$ in general formula (a1-0-2) can be used.

Among these, a linear or branched alkylene group, or a divalent linking group containing an oxygen atom as a hetero atom is preferable.

The linear or branched alkylene group for $L^4$ preferably has 1 to 10 carbon atoms, more preferably 1 to 8 carbon atoms, and still more preferably 1 to 5 carbon atoms. As the linear alkylene group, a methylene group or an ethylene group is preferable, and a methylene group is particularly desirable. As the branched alkylene group, an alkylmethylene group or an alkylethylene group is preferable, and —CH(CH$_3$)—, —C(CH$_3$)$_2$— or —C(CH$_3$)$_2$CH$_2$— is particularly desirable.

As the divalent linking group containing an oxygen atom, a divalent linking group containing an ether bond or an ester bond is preferable, and a group represented by the general formula —$Y^{21}$—O—$Y^{22}$—, —$Y^{21}$—O—C(=O)—$Y^{22}$— or —[$Y^{21}$—C(=O)—O]$_{m'}$—$Y^{22}$— described above for $Y^2$ in general formula (a1-0-2) is more preferable. Among these, a group represented by the formula —$Y^{21}$—O—C(=O)—$Y^{22}$— is preferable, and a group represented by the formula —(CH$_2$)$_c$—C(=O)—O—(CH$_2$)$_d$— is particularly desirable. c represents an integer of 1 to 5, and preferably 1 or 2. d represents an integer of 1 to 5, and preferably 1 or 2.

In particular, as the structural unit ($a2^S$), a structural unit represented by general formula (a2-6-11) or (a2-6-12) shown below is preferable, and a structural unit represented by general formula (a2-6-12) shown below is more preferable.

[Chemical Formula 35]

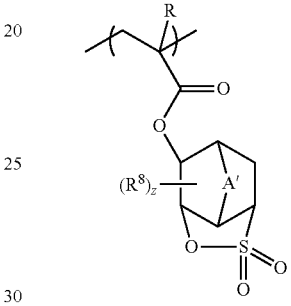

(a2-6-11)

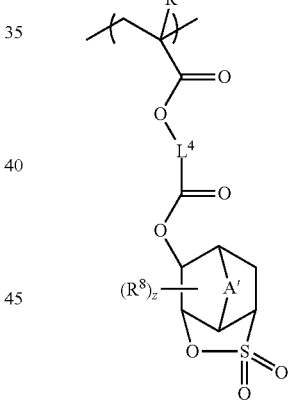

(a2-6-12)

In the formulas, R, A', $R^8$, z and $L^4$ are the same as defined above.

In general formula (a2-6-11), A' is preferably a methylene group, an oxygen atom (—O—) or a sulfur atom (—S—).

In general formula (a2-6-12), as $L^4$, a linear or branched alkylene group or a divalent linking group containing an oxygen atom is preferable. As the linear or branched alkylene group and the divalent linking group containing an oxygen atom represented by $L^4$, the same linear or branched alkylene groups and the divalent linking groups containing an oxygen atom as those described above can be used.

As the structural unit represented by general formula (a2-6-12), a structural unit represented by general formula (a2-6-12a) or (a2-6-12b) shown below is particularly desirable.

[Chemical Formula 36]

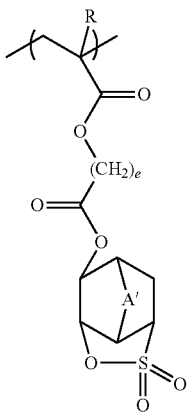

(a2-6-12a)

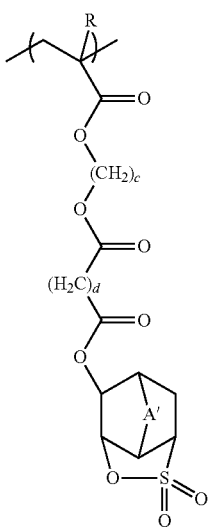

(a2-6-12b)

In the formulas, R and A' are the same as defined above; and each of c to e independently represents an integer of 1 to 3.

Structural Unit (a2$^L$):

The structural unit (a2$^L$) is a structural unit derived from an (α-substituted) acrylate ester containing a lactone-containing cyclic group or cyclic carbonate skeleton.

As described above, the term "lactone-containing cyclic group" refers to a cyclic group including one ring containing a —O—C(O)— structure (lactone ring). This "lactone ring" is counted as the first ring, so that a lactone-containing cyclic group in which the only ring structure is the lactone ring is referred to as a monocyclic group, and groups that also contain other ring structures are described as polycyclic groups regardless of the structure of the other rings.

The term "cyclic carbonate skeleton" refers to a cyclic group (carbonate skeleton-containing cyclic group) including one ring containing a —O—C(O)—O— structure. This ring that contains a —O—C(O)—O— structure is counted as the first ring. A cyclic group in which the only ring structure is this ring that contains a —O—C(O)—O— structure is referred to as a monocyclic group, and a group containing other ring structures is described as a polycyclic group regardless of the structure of the other rings.

The lactone-containing cyclic group for the structural unit (a2$^L$) is not particularly limited, and an arbitrary group may be used. Specific examples of lactone-containing monocyclic groups include a group in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

The lactone-containing cyclic group may have a substituent. Examples of the substituent include an alkyl group, an alkoxy group, a halogen atom, a hydroxyl group, an oxo group (=O), a halogenated alkyl group, a halogenated alkoxy group, a hydroxyalkyl group, —C(=O)—R$^{80}$ [R$^{80}$ represents an alkyl group], —COOR$^{81}$ [R$^{81}$ represents a hydrogen atom or an alkyl group], —OC(=O)R$^{81}$ [R$^{81}$ represents a hydrogen atom or an alkyl group], a cyano group, an amino group, an amide group, a nitro group, a sulfur atom and a sulfonyl group (SO$_2$).

Of these, as the alkyl group, alkoxy group, halogen atom, halogenated alkyl group, halogenated alkoxy group, hydroxyalkyl group, —C(=O)—R$^{80}$, —COOR$^{81}$ and —OC(=O)R$^{81}$, the same groups as those described above as the substituent which the —SO$_2$— containing cyclic group may have can be used.

As the substituent included within the lactone-containing cyclic group, an alkyl group of 1 to 5 carbon atoms, an alkoxy group of 1 to 5 carbon atoms or —COOR" [R" represents a hydrogen atom or an alkyl group] is particularly desirable. As the alkyl group, alkoxy group and —COOR", the same alkyl groups, alkoxy groups and —COOR" groups as those described for R' in general formulas (a2-1) to (a2-5) shown below can be used.

Examples of the structural unit (a2$^L$) containing a lactone-containing cyclic group include structural units represented by the aforementioned general formula (a2-6) in which the R$^S$ group has been substituted with a lactone-containing cyclic group. Specific examples thereof include structural units represented by general formulas (a2-1) to (a2-5) shown below.

[Chemical Formula 37]

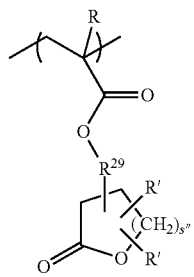

(a2-1)

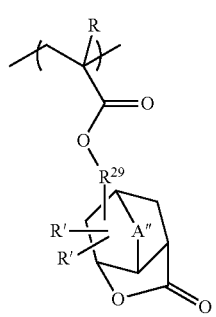

(a2-2)

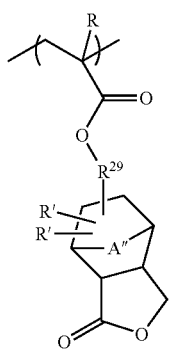
(a2-3)

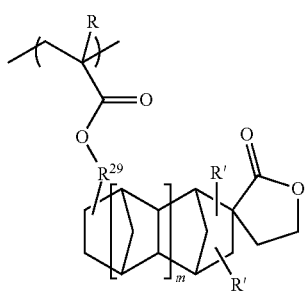
(a2-4)

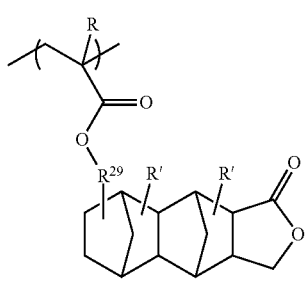
(a2-5)

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms, —COOR" [R" represents a hydrogen atom or an alkyl group] or a cyano group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In genera formulas (a2-1) to (a2-5), R is the same as defined above for R in general formula (a1-0-1) or (a1-0-2) described in connection with the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group.

In terms of industrial availability, R' is preferably a hydrogen atom.

The alkyl group for R" may be any of linear, branched or cyclic.

In those cases where R" represents a linear or branched alkyl group, the alkyl group preferably has 1 to 10 carbon atoms, and more preferably 1 to 5 carbon atoms.

In those cases where R" represents a cyclic alkyl group, the cyclic alkyl group preferably has 3 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms, an oxygen atom (—O—) or a sulfur atom (—S—), and more preferably an alkylene group of 1 to 5 carbon atoms or —O—. As the alkylene group of 1 to 5 carbon atoms, a methylene group or a dimethylmethylene group is more preferable, and a methylene group is particularly desirable.

$R^{29}$ is the same as defined for $R^{29}$ in the aforementioned general formula (a2-6).

In formula (a2-1), s" is preferably 1 or 2.

Specific examples of structural units represented by general formulas (a2-1) to (a2-5) are shown below. In the formulas shown below, $R^\alpha$ represents a hydrogen atom, a methyl group or a trifluoromethyl group.

[Chemical Formula 38]

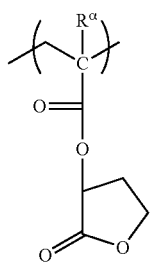
(a2-1-1)

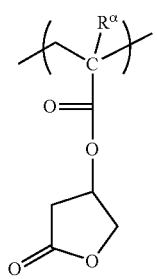
(a2-1-2)

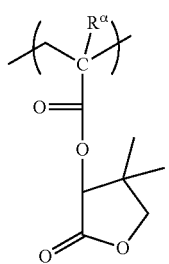
(a2-1-3)

-continued
(a2-1-4) 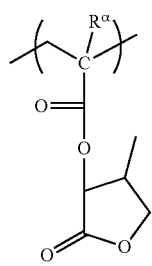
(a2-1-5) 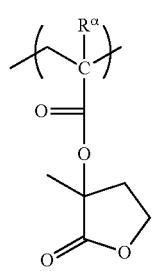
(a2-1-6) 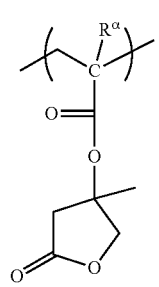
(a2-1-7) 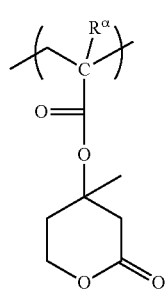
(a2-1-8) 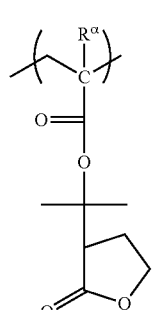
-continued
(a2-1-9) 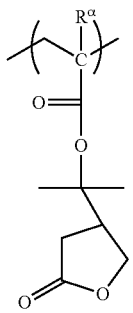
(a2-1-10) 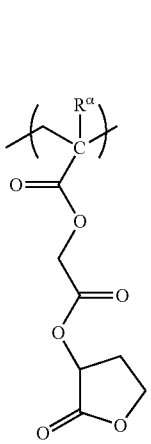
(a2-1-11) 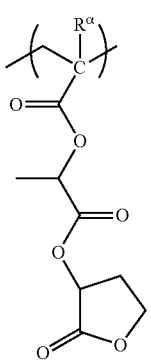
(a2-1-12) 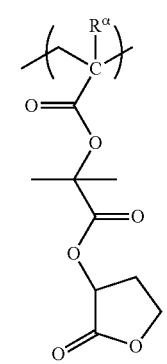

(a2-1-13)
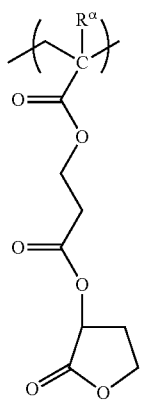
[Chemical Formula 39]
(a2-2-1)
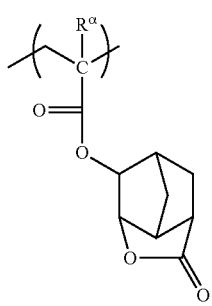
(a2-2-2)
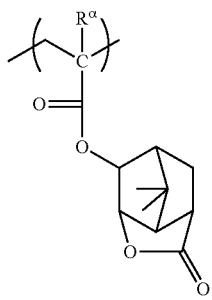
(a2-2-3)
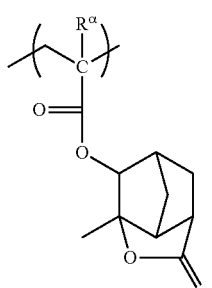
(a2-2-4)
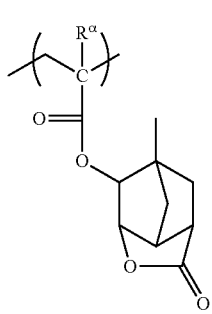
(a2-2-5)
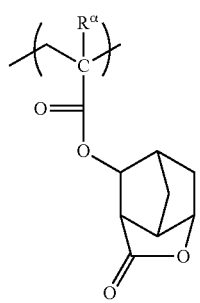
(a2-2-6)
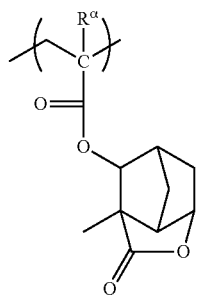
(a2-2-7)
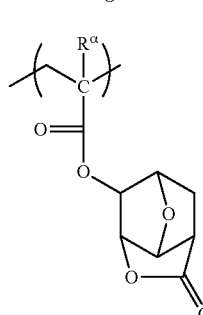
(a2-2-8)
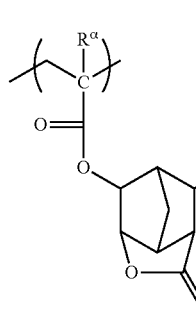
(a2-2-9)
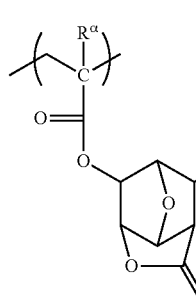

(a2-2-10)
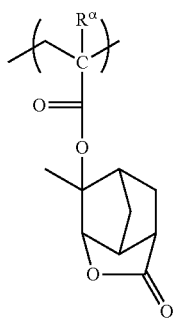
(a2-2-11)
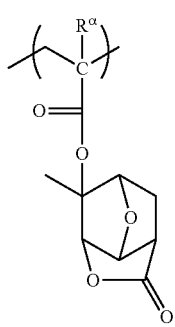
(a2-2-12)
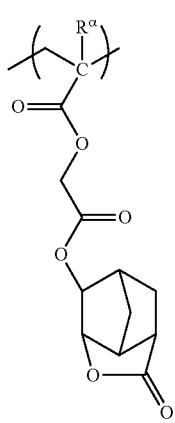
(a2-2-13)
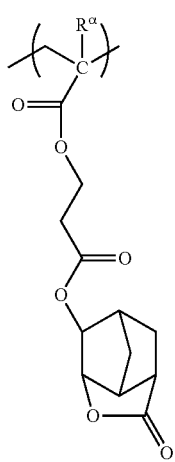
(a2-2-14)
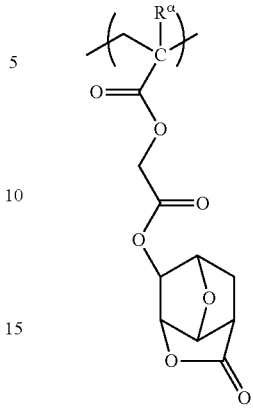
(a2-2-15)
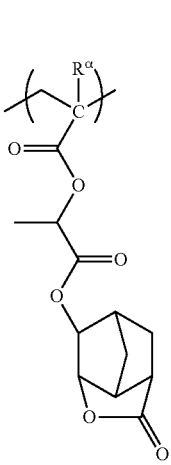
(a2-2-16)
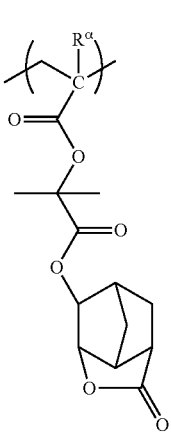

(a2-2-17)
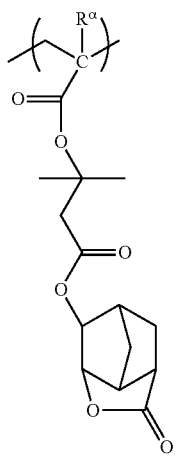
[Chemical Formula 40]
(a2-3-1)
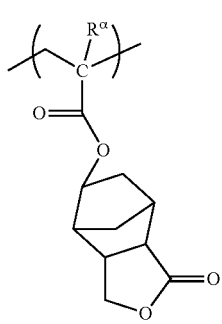
(a2-3-2)
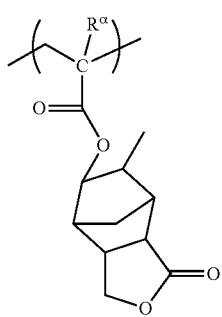
(a2-3-3)
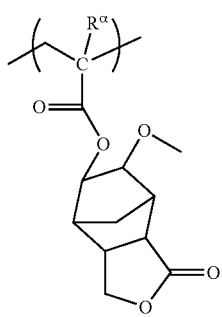
(a2-3-4)
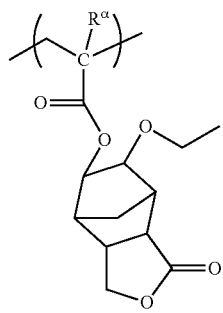
(a2-3-5)
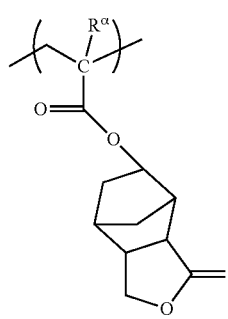
[Chemical Formula 41]
(a2-4-1)
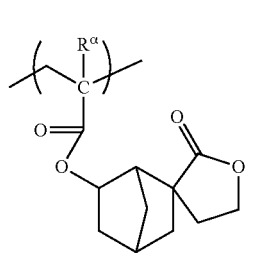
(a2-4-2)
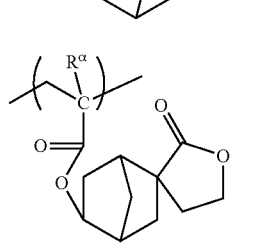
(a2-4-3)
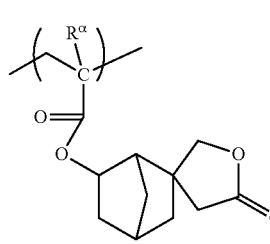
(a2-4-4)
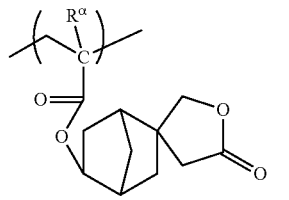

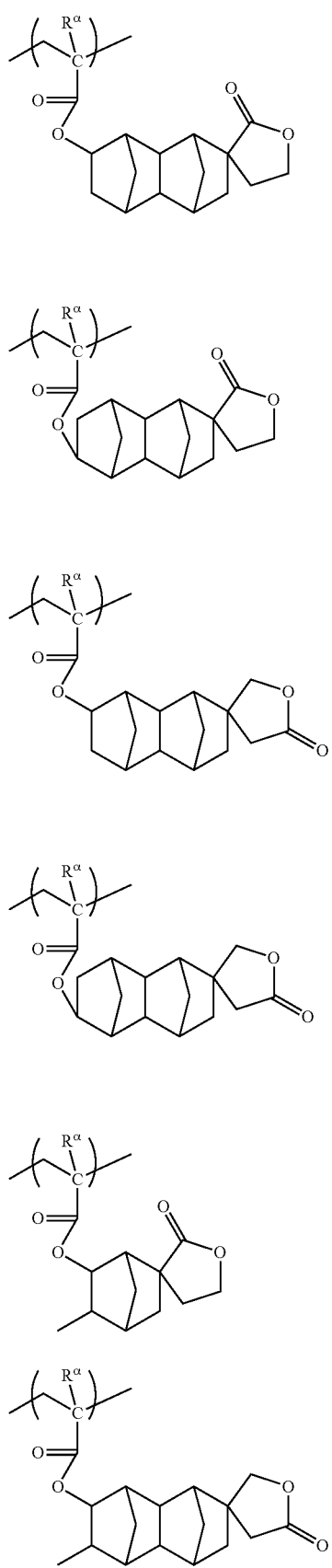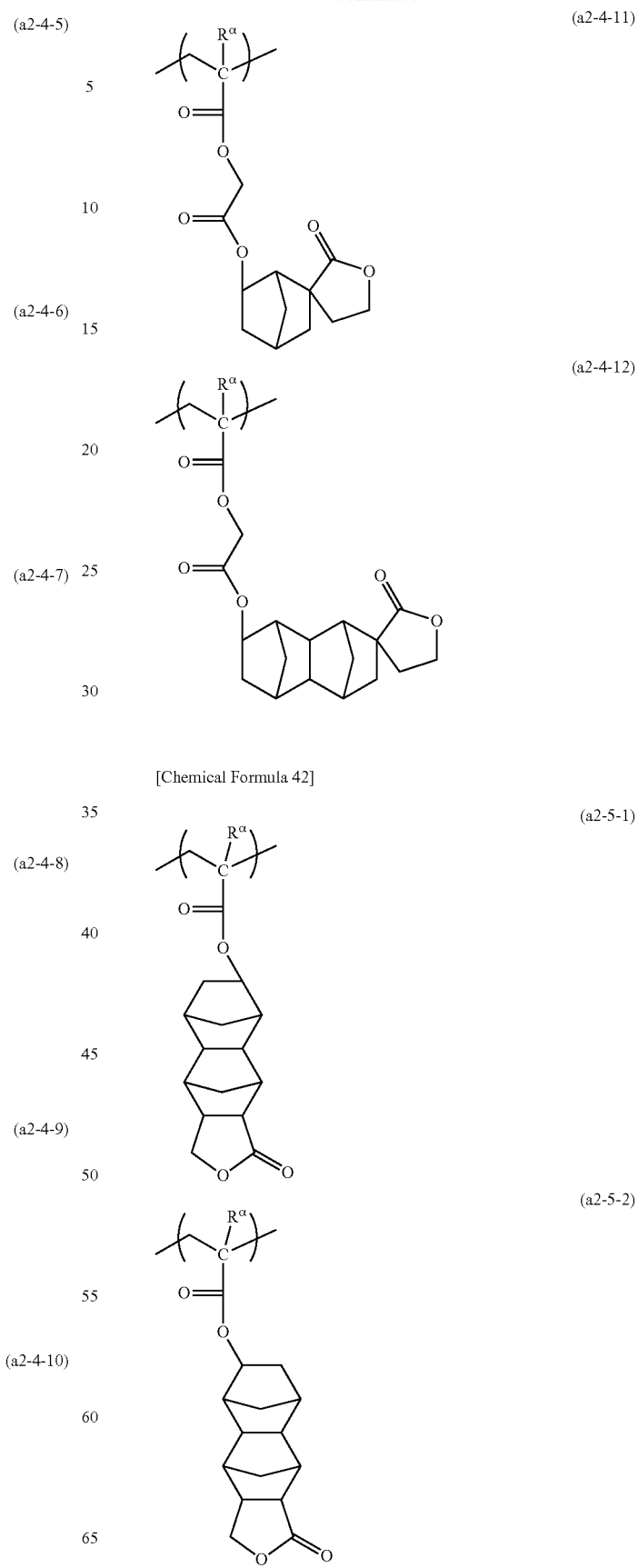

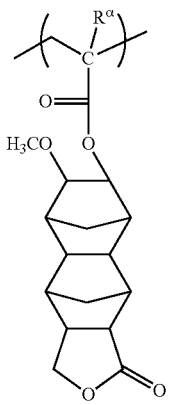

(a2-5-3)

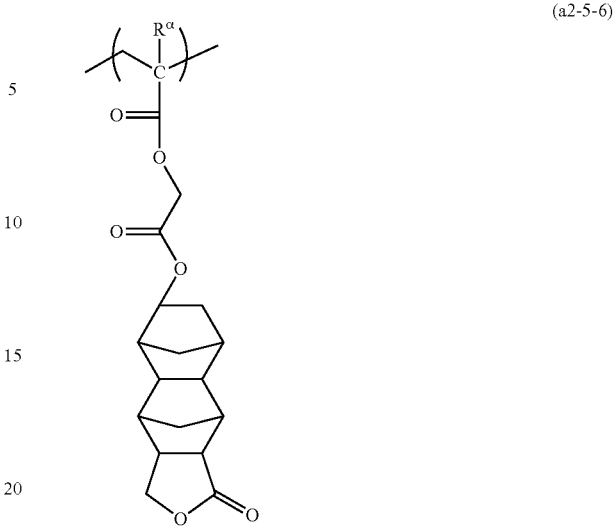

(a2-5-6)

As examples of the carbonate skeleton-containing cyclic group for the structural unit (a2$^L$), carbonate skeleton-containing cyclic groups, and groups in which some or all of the hydrogen atoms bonded to the carbon atoms that constitute the carbonate skeleton-containing cyclic group have been substituted, can be given. Examples of the substituent for substituting these hydrogen atoms include an alkyl group and a hydroxyalkyl group.

Particularly preferred examples of the structural unit (a2$^L$) that contains a carbonate skeleton-containing cyclic group include structural units represented by formula (a2-7) shown below.

[Chemical Formula 43]

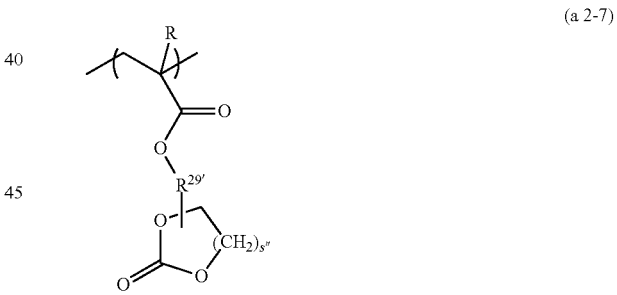

(a2-7)

In the formula, R represents a hydrogen atom, an alkyl group of 1 to 5 carbon atoms or a halogenated alkyl group of 1 to 5 carbon atoms; R$^{29'}$ represents a divalent linking group; and s''' represents an integer of 1 to 2.

In the formula, as the divalent linking group for R$^{29'}$, the same divalent linking groups as those described for R$^{29}$ in the aforementioned general formula (a2-6) can be used. Among these, a methylene group is preferred.

s''' is preferably 1.

As the structural unit (a2) contained in the component (A1), one type of structural unit may be used, or two or more types may be used. For example, as the structural unit (a2), a structural unit (a2$^S$) may be used alone, or a structural unit (a2$^L$) may be used alone, or a combination of these structural units may be used. Further, as the structural unit (a2$^S$) or the structural unit (a2$^L$), either a single type of structural unit may be used, or two or more types may be used in combination.

(a2-5-4)

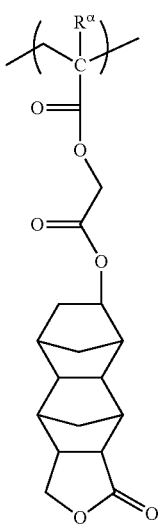

(a2-5-5)

As the structural unit (a2), at least one structural unit selected from the group consisting of structural units represented by the above general formulas (a2-1) to (a2-6) is preferable, and at least one structural unit selected from the group consisting of structural units represented by general formulas (a2-1) to (a2-3) and (a2-6) is more preferable. Of these, it is particularly preferable to use at least one structural unit selected from the group consisting of the structural units represented by chemical formulas (a2-1-1), (a2-2-1), (a2-2-7), (a2-3-1), (a2-3-5) and (a2-6-1).

In the component (A1), the amount of the structural unit (a2) based on the combined total of all structural units constituting the component (A1) is preferably 5 to 80 mol %, more preferably 10 to 60 mol %, and still more preferably 15 to 50 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

(Structural Unit (a3))

The component (A1) may also contain a structural unit (a3) having a polar group-containing hydrocarbon group, as well as the structural units (a0) and (a1), or the structural units (a0), (a1) and (a2). By including the structural unit (a3) within the component (A1), the polarity of the component (A1) following exposure is further improved. An increase in the polarity contributes to favorable improvements in the resolution and the like, especially in the case of alkali developing process.

In those cases where the aforementioned structural unit (a0), (a1) or (a2) includes a polar group-containing hydrocarbon group within the structure thereof, this structural unit would also meet the definition for the structural unit (a3). However, it is defined so that such structural units correspond to the structural unit (a0), (a1) or (a2) and do not correspond to the structural unit (a3).

A polar group-containing hydrocarbon group is a hydrocarbon group to which a polar group is bonded.

Preferred examples of polar group in the structural unit (a3) include a hydroxyl group, a cyano group, a carboxyl group, a hydroxyalkyl group, a hydroxyalkyloxy group and a fluorinated alcohol group (namely, a hydroxyalkyl group in which some or all of the hydrogen atoms bonded to the carbon atoms have been substituted with fluorine atoms).

The carbon skeletons within the hydroxyalkyl group, hydroxyalkyloxy group and fluorinated alcohol group may be linear, branched or cyclic, or may be a combination thereof. When the carbon skeleton is linear or branched, the number of carbon atoms within this carbon skeleton is preferably 1 to 12. More specifically, the same linear or branched aliphatic hydrocarbon groups as those described later can be used. When the carbon skeleton is cyclic, the number of carbon atoms within this carbon skeleton is preferably 3 to 30. More specifically, the same cyclic aliphatic hydrocarbon groups as those described later can be used.

Among the above-mentioned examples, as the polar group, a hydroxyl group is preferred.

In the structural unit (a3), the number of polar groups bonded to the hydrocarbon group is not particularly limited, although 1 to 3 groups is preferable, and 1 group is particularly desirable.

The hydrocarbon group to which the polar group is bonded may be either an aliphatic hydrocarbon group or an aromatic hydrocarbon group.

With respect to the polar group-containing aliphatic hydrocarbon group, the aliphatic hydrocarbon group to which the polar group is bonded may be either saturated or unsaturated, but is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 12 carbon atoms, more preferably 1 to 10 carbon atoms, still more preferably 1 to 8 carbon atoms, and still more preferably 1 to 6 carbon atoms.

As the linear or branched aliphatic hydrocarbon group, a linear or branched alkyl group is preferable.

The linear or branched aliphatic hydrocarbon group may have part or all of the hydrogen atoms substituted with a substituent other than the aforementioned polar group. Examples of the substituent include a fluorine atom, a fluorinated alkyl group of 1 to 5 carbon atoms, and an oxo group (=O). Further, the linear or branched aliphatic hydrocarbon group may have a divalent group containing a hetero atom present between the carbon atoms. Examples of the "divalent group containing a hetero atom" include the same "divalent linking groups containing a hetero atom" as those described for $Y^2$ in general formula (a1-0-2) explained above in connection with the structural unit (a1).

As examples of the "aliphatic hydrocarbon group containing a ring in the structure thereof", a cyclic aliphatic hydrocarbon group, and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 30 carbon atoms. Further, the cyclic aliphatic hydrocarbon group may be either a polycyclic group or a monocyclic group, and is preferably a polycyclic group.

Specifically, the cyclic aliphatic hydrocarbon group can be selected appropriately from the multitude of groups that have been proposed for the resins of resist compositions designed for use with ArF excimer lasers. As the monocyclic aliphatic hydrocarbon group, a group in which two or more hydrogen atoms have been removed from a monocycloalkane of 3 to 20 carbon atoms is preferable. Examples of the monocycloalkane include cyclopentane and cyclohexane. As the polycyclic aliphatic hydrocarbon group, a group in which two or more hydrogen atoms have been removed from a polycycloalkane of 7 to 30 carbon atoms is preferable. Examples of the polycycloalkane include adamantane, norbornane, isobornane, tricyclodecane and tetracyclododecane.

The cyclic aliphatic hydrocarbon group may have part or all of the hydrogen atoms substituted with a substituent other than the aforementioned polar group. Examples of the substituent include an alkyl group of 1 to 5 carbon atoms, a fluorine atom, a fluorinated alkyl group of 1 to 5 carbon atoms, and an oxo group (=O).

With respect to the polar group-containing aromatic hydrocarbon group, examples of aromatic hydrocarbon groups to which the polar group is bonded include a divalent aromatic hydrocarbon group in which one hydrogen atom has been removed from an aromatic hydrocarbon ring of a monovalent aromatic hydrocarbon group such as a phenyl group, a biphenyl group, a fluorenyl group, a naphthyl group, an anthryl group or a phenanthryl group; an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from an aromatic hydrocarbon ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may have part or all of the hydrogen atoms substituted with a substituent other than the aforementioned polar group. Examples of the substituent include an alkyl group of 1 to 5 carbon atoms, a fluorine atom, a fluorinated alkyl group of 1 to 5 carbon atoms, and an oxo group (=O).

More specifically, as the structural unit (a3), a structural unit (a31) derived from an acrylate ester which may have the hydrogen atom bonded to the carbon atom on the α-position substituted with a substituent and contains a polar group-containing hydrocarbon group; a structural unit (a32) derived from a hydroxystyrene which may have the hydrogen atom bonded to the carbon atom on the α-position substituted with a substituent and which may have the hydrogen atom bonded to the benzene ring substituted with a substituent other than the hydroxyl group; and a structural unit (a33) derived from a vinyl(hydroxynaphthalene) which may have the hydrogen atom bonded to the carbon atom on the α-position substituted with a substituent and which may have the hydrogen atom bonded to the naphthalene ring substituted with a substituent other than the hydroxyl group can be used.

Among these, as the structural unit (a32), those listed above within the description for the "structural units derived from styrenes or the derivatives thereof" and represented by general formula (III) in which p represents an integer of 1 to 3 (preferably 1) and X' represents a hydrogen atom or a polar group-containing hydrocarbon group can be used.

As the structural unit (a33), those listed above within the description for the "structural units derived from vinylnaphthalenes or the derivatives thereof" and represented by general formula (IV) in which x represents an integer of 1 to 3 (preferably 1) and $X^d$ represents a hydrogen atom or a polar group-containing hydrocarbon group can be used.

Of the various possibilities described above, as the structural unit (a3), the structural unit (a31) is preferred.

Specific examples of preferred structural unit (a31) are shown below.

[Chemical Formula 44]

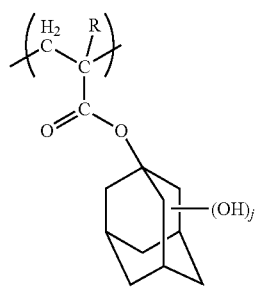

(a3-1)

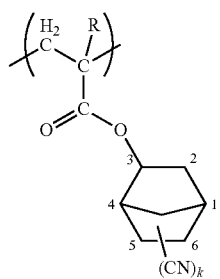

(a3-2)

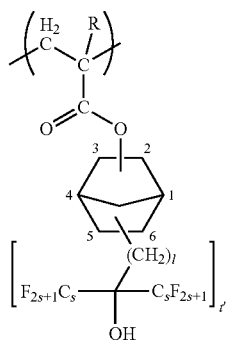

(a3-3)

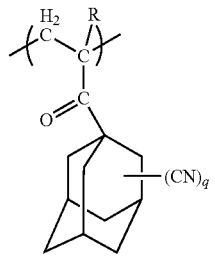

(a3-4)

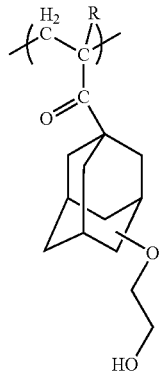

(a3-5)

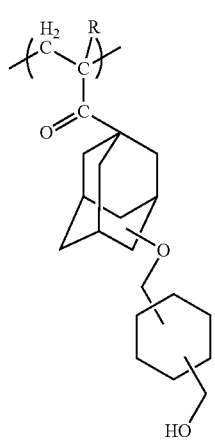

(a3-6)

-continued

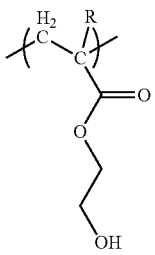
(a3-7)

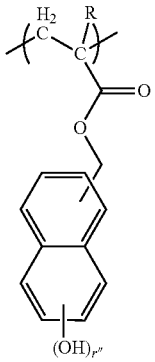
(a3-8)

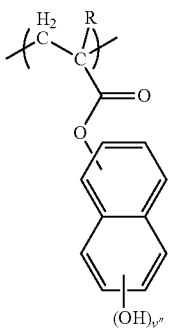
(a3-9)

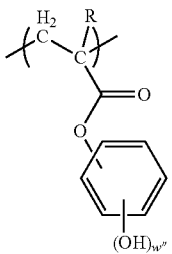
(a3-10)

In the formulas above, R is the same as defined above; j is an integer of 1 to 3; k is an integer of 1 to 3; t' is an integer of 1 to 3; l is an integer of 1 to 5; s is an integer of 1 to 3; and each of q, r'', v'' and w'' independently represents an integer of 1 to 3.

In formula (a3-1), j is preferably 1 or 2, and more preferably 1. When j is 1, it is preferable that the hydroxyl group be bonded to the 3rd position of the adamantyl group.

When j is 2, it is preferable that the hydroxyl groups be bonded to the 3rd and 5th positions of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxyl group of the acrylic acid. The fluorinated alkyl alcohol is preferably bonded to the 5th or 6th position of the norbornyl group.

In general formula (a3-4), q is preferably 1 or 2, and more preferably 1. When q is 2, it is preferable that the cyano groups be bonded to the 3rd and 5th positions of the adamantyl group. When q is 1, it is preferable that the cyano group be bonded to the 3rd position of the adamantyl group.

In general formula (a3-8), r'' is preferably 1 or 2, and more preferably 1.

In general formula (a3-9), v'' is preferably 1 or 2, and more preferably 1.

In general formula (a3-10), w'' is preferably 1 or 2, and more preferably 1.

As the structural unit (a3) contained in the component (A1), one type of structural unit may be used, or two or more types may be used.

When the component (A1) contains the structural unit (a3), the amount of the structural unit (a3) within the component (A1) based on the combined total of all structural units constituting the component (A1) is preferably 1 to 80 mol %, more preferably 5 to 60 mol %, and still more preferably 15 to 40 mol %. By making the amount of the structural unit (a3) at least as large as the lower limit of the above-mentioned range, the effect of using the structural unit (a3) can be satisfactorily achieved. On the other hand, by making the amount of the structural unit (a3) no more than the upper limit of the above-mentioned range, a good balance can be achieved with the other structural units.

The component (A1) may also contain other structural units besides the above structural units (a0) to (a3), provided the inclusion of these other structural units does not impair the effects of the present invention.

As such a structural unit, any other structural unit which cannot be classified as one of the above structural units (a0) to (a3) can be used without any particular limitations, and any of the multitude of conventional structural units used within resist resins for ArF excimer lasers or KrF excimer lasers (and particularly for ArF excimer lasers) can be used.

Examples of such other structural units include a structural unit (a4) derived from an acrylate ester which may have the hydrogen atom bonded to the carbon atom on the α-position substituted with a substituent and contains a non-acid-dissociable cyclic group; a structural unit (a5) derived from a styrene which may have the hydrogen atom bonded to the carbon atom on the α-position substituted with a substituent and which may have the hydrogen atom bonded to the benzene ring substituted with a non-polar group; and a structural unit (a6) derived from a vinylnaphthalene which may have the hydrogen atom bonded to the carbon atom on the α-position substituted with a substituent and which may have the hydrogen atom bonded to the naphthalene ring substituted with a non-polar group. By including at least one of the structural units (a4) to (a6), the dry etching resistance of the resist pattern to be formed is improved. Further, the hydrophobicity of the component (A1) is increased. An increase in the hydrophobicity contributes to favorable improvements in the resolution, resist pattern shape and the like, especially in the case of developing process using an organic solvent.

(Structural Unit (a4))

The "non-acid-dissociable cyclic group" for the structural unit (a4) is a cyclic group that does not dissociate, when acid is generated from the component (B) upon exposure, and remains within this structural unit as it is in spite of the action of this acid. Examples of the cyclic group include non-acid-dissociable, aliphatic polycyclic groups, groups represented by formulas (2-1) to (2-6) listed above in connection with the structural unit (a1) in which at least one of $R^{15}$ and $R^{16}$ represents a hydrogen atom, and groups represented by formula (3) listed above in connection with the structural unit (a1) in which at least one of $R^{15}$ and $R^{16}$ represents a hydrogen atom.

Examples of the non-acid-dissociable, aliphatic polycyclic group include a monovalent aliphatic polycyclic group in which the carbon atom having an atom adjacent to this aliphatic polycyclic group (e.g., —O— within —C(=O)—O—) bonded thereto has no substituent (a group or an atom other than hydrogen). The aliphatic cyclic group is not particularly limited as long as it is acid non-dissociable, and any of the multitude of conventional cyclic groups used within the resin component of resist compositions for ArF excimer lasers or KrF excimer lasers (and particularly for ArF excimer lasers) can be used. The aliphatic cyclic group may be either saturated or unsaturated, but is preferably saturated.

Specific examples thereof include a group in which one hydrogen atom has been removed from the cycloalkane such as the monocycloalkane or the polycycloalkane listed above in connection with the aliphatic cyclic group in the structural unit (a1).

The aliphatic cyclic group may be either a monocyclic group or a polycyclic group. In terms of the above effects, the polycyclic group is preferable. In particular, a bi-, tri- or tetracyclic group is preferable. In consideration of industrial availability and the like, at least one polycyclic group selected from amongst a tricyclodecyl group, an adamantyl group, a tetracyclododecyl group, an isobornyl group and a norbornyl group is particularly desirable.

Specific examples of the non-acid-dissociable, aliphatic cyclic group include monovalent aliphatic cyclic groups in which the carbon atom having an atom adjacent to the aliphatic cyclic group (e.g., —O— within —C(=O)—O—) bonded thereto has no substituent (a group or an atom other than hydrogen). More specific examples include groups represented by general formulas (1-1) to (1-9) explained above in relation to the structural unit (a1) in which the $R^{14}$ group has been substituted with a hydrogen atom; and a cycloalkane having a tertiary carbon atom which is formed solely of carbon atoms constituting the ring skeleton and having one hydrogen atom removed from.

A substituent may be bonded to this aliphatic cyclic group. Examples of the substituent include an alkyl group of 1 to 5 carbon atoms, a fluorine atom and a fluorinated alkyl group.

As the structural unit (a4), the aforementioned structural unit (a1) in which an acid dissociable group has been substituted with a non-acid-dissociable, aliphatic polycyclic group can be used. Of these, a structural unit represented by the aforementioned general formula (a1-0-1) in which $X^1$ has been substituted with a non-acid-dissociable, aliphatic polycyclic group, that is, a structural unit represented by general formula (a-4-0) shown below is preferable, and a structural unit represented by any one of general formulas (a-4-1) to (a-4-5) shown below is particularly desirable.

[Chemical Formula 45]

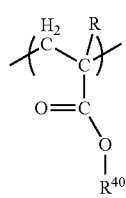

(a4-0)

In the formula, R is the same as defined above; and $R^{40}$ represents a non-acid-dissociable, aliphatic polycyclic group.

[Chemical Formula 46]

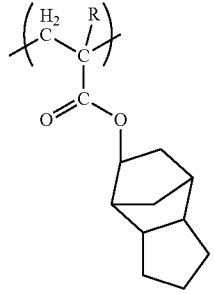

(a4-1)

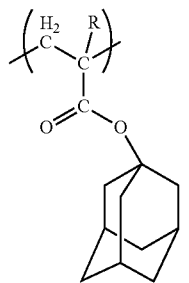

(a4-2)

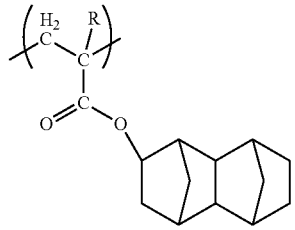

(a4-3)

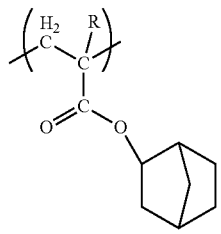

(a4-4)

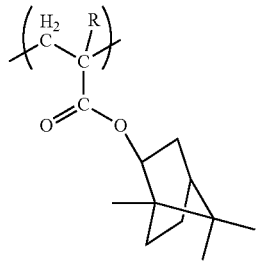

(a4-5)

In the formulas, R is the same as defined above.

As the structural unit (a4) contained in the component (A1), one type of structural unit may be used, or two or more types may be used.

When the component (A1) contains the structural unit (a4), the amount of the structural unit (a4) within the component (A1) based on the combined total of all structural units constituting the component (A1) is preferably 1 to 30 mol %, more preferably 1 to 20 mol %, and still more preferably 5 to 20 mol %. By ensuring that this amount is at least as large as the lower limit of the above range, the effects generated by including the structural unit (a4) are obtained satisfactorily, whereas by ensuring that the amount is not more than the upper limit of the above range, a good balance can be achieved with the other structural units.

(Structural Unit (a5))

With respect to the structural unit (a5), as a "styrene which may have the hydrogen atom bonded to the carbon atom on the α-position substituted with a substituent and which may have the hydrogen atom bonded to the benzene ring substituted with a non-polar group", the same (α-substituted) styrenes as those described above within the description for the "styrenes or the derivatives thereof" (excluding those having the hydrogen atom bonded to the benzene ring substituted with a polar group) can be used.

There are no particular limitations on the non-polar group as long as it does not fall under the definition of the polar group as described above for the structural unit (a3), and examples thereof include a halogen atom, an alkyl group of 1 to 5 carbon atoms and a halogenated alkyl group of 1 to 5 carbon atoms. Examples of the halogen atom include a fluorine atom, a chlorine atom, a bromine atom and an iodine atom, and a fluorine atom is particularly desirable.

Specific examples of the structural unit (a5) include those listed above within the description for the "structural units derived from styrenes or the derivatives thereof" and represented by general formula (III) in which p is 0 and q is 0 to 5.

(Structural Unit (a6))

With respect to the structural unit (a6), as a "vinylnaphthalene which may have the hydrogen atom bonded to the carbon atom on the α-position substituted with a substituent and which may have the hydrogen atom bonded to the naphthalene ring substituted with a non-polar group", the same (α-substituted) vinylnaphthalenes as those described above within the description for the "vinylnaphthalenes or the derivatives thereof" (excluding those having the hydrogen atom bonded to the naphthalene ring substituted with a polar group) can be used.

As the non-polar group, the same groups as those described above for the structural unit (a5) can be used.

Specific examples of the structural unit (a6) include those listed above within the description for the "structural units derived from vinylnaphthalenes or the derivatives thereof" and represented by general formula (IV) in which x is 0 and y+z is 0 to 7.

In the present invention, the component (A1) is preferably a copolymer having the structural units (a0) and (a1), and more preferably a copolymer having the structural units (a0), (a1) and (a2).

Examples of such copolymers having the structural units (a0) and (a1) include a copolymer consisting of the structural units (a0) and (a1); a copolymer consisting of the structural units (a0), (a1) and (a2); a copolymer consisting of the structural units (a0), (a1) and (a3); a copolymer consisting of the structural units (a0), (a1), (a2) and (a3); a copolymer consisting of the structural units (a0), (a1), (a2) and (a4); and a copolymer consisting of the structural units (a0), (a1), (a2), (a3) and (a4).

The weight average molecular weight (Mw) (the polystyrene equivalent value determined by gel permeation chromatography (GPC)) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is not particularly limited, but is preferably 1.0 to 5.0, more preferably 1.0 to 3.0, and most preferably 1.0 to 2.5. Here, Mn is the number average molecular weight.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as $HS-CH_2-CH_2-CH_2-C(CF_3)_2-OH$ during the above polymerization, a $-C(CF_3)_2-OH$ group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The monomers for deriving the corresponding structural units can be synthesized by a conventional method. For example, of the various structural units classified as the structural unit (a0), monomers for deriving the structural units represented by the above general formula (a0-1) can be synthesized by the methods disclosed in Japanese Unexamined Patent Application, First Publication No. 2008-223000, PCT International Publication WO2008/99727, and Japanese Unexamined Patent Application, First Publication No. 2009-242361. As for the known monomers, commercially available monomers can also be used.

With respect to the component (A), as the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties such as EL margin are improved, and the roughness reduction effects and the like are also improved.

In the resist composition of the present invention, the amount of the component (A) can be appropriately adjusted depending on the thickness of the resist film to be formed, and the like.

The component (A) may also contain another type of base component other than the component (A1) which exhibits changed solubility in a developing solution under the action of acid (hereafter, referred to as "component (A2)"), with the proviso that the effects of the present invention are not impaired. The component (A2) may be a resin, a low molecular weight compound, or a mixture of these materials.

The component (A2) is not particularly limited, and any of the multitude of base components that have been conventionally proposed for chemically amplified resist compositions (e.g., base resins used within chemically amplified resist compositions for ArF excimer lasers or KrF excimer lasers, preferably ArF excimer lasers) can be used.

For example, when the resist composition of the present invention is a resist composition which forms a negative resist pattern in an alkali developing process and forms a positive resist pattern in a solvent developing process, as the component (A2), a base component that is soluble in an alkali developing solution is used.

As a base component that is soluble in an alkali developing solution, a resin that is soluble in an alkali developing solution (namely, an alkali-soluble resin) is usually used.

Examples of the alkali-soluble resin include alkali-soluble resins such as a resin having a structural unit derived from at least one of α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; an acrylic resin or polycycloolefin resin which may have the hydrogen atom bonded to the carbon atom on the α-position substituted with a substituent and contains a sulfoneamide group, as disclosed in U.S. Pat. No. 6,949,325; an acrylic resin which may have the hydrogen atom bonded to the carbon atom on the α-position substituted with a substituent and contains a fluorinated alcohol, as disclosed in U.S. Pat. No. 6,949,325, Japanese Unexamined Patent Application, First Publication No. 2005-336452 or Japanese Unexamined Patent Application, First Publication No. 2006-317803; and a polycycloolefin resin containing a fluorinated alcohol, as disclosed in Japanese Unexamined Patent Application, First Publication No. 2006-259582.

Here, among the acrylic acids which may have the hydrogen atom bonded to the carbon atom on the α-position substituted with a substituent, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

When the resist composition of the present invention is a resist composition which forms a positive resist pattern in an alkali developing process and forms a negative resist pattern in a solvent developing process, examples of the resin used as the component (A2) include resins having the aforementioned structural unit (a1) and also optionally having the aforementioned structural units (a2) to (a6) or the like.

More specifically, as the component (A2), resins having the aforementioned structural units (a12) and (a32); resins having the aforementioned structural units (a12), (a32) and (a5);

resins having the aforementioned structural units (a13) and (a33); resins having the aforementioned structural units (a13), (a33) and (a6);

resins having the aforementioned structural units (a11) and (a2); resins having the aforementioned structural units (a11), (a2) and (a31); resins having the aforementioned structural units (a11), (a2), (a31) and (a4);

resins having the aforementioned structural units (a11) and (a32); resins having the aforementioned structural units (a11), (a32) and (a5);

resins having the aforementioned structural units (a11) and (a33); resins having the aforementioned structural units (a11), (a33) and (a6);

or the like can be used.

When the resist composition of the present invention is a resist composition which forms a positive resist pattern in an alkali developing process and forms a negative resist pattern in a solvent developing process, as a low molecular weight compound used as the component (A2), a low molecular weight compound that has a molecular weight of at least 500 but less than 2,500, contains a hydrophilic group, and also contains an acid dissociable group such as those listed above in connection with the component (A1) is preferred. Specific examples include compounds containing a plurality of phenol skeletons in which a part or all of the hydrogen atoms within hydroxyl groups have been substituted with the aforementioned acid dissociable groups.

As preferable examples of the low molecular weight compound used as the component (A2), low molecular weight phenol compounds in which a portion of the hydroxyl group hydrogen atoms have been substituted with an aforementioned acid dissociable group can be given. These types of compounds are known, for example, as sensitizers or heat resistance improvers for use in non-chemically amplified g-line or i-line resists, and any of these compounds may be used.

Specific examples of the low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. Among these, in terms of achieving excellent resolution and line width roughness (LWR), a phenol compound having 2 to 6 triphenylmethane skeletons is particularly desirable.

Also, there are no particular limitations on the acid dissociable group, and suitable examples include the groups described above.

<Component (B)>

The component (B) contains an acid generator (B1) (hereafter, referred to as "component (B1)") constituted of a compound represented by general formula (b0-1) or (b0-2) shown below.

[Chemical Formula 47]

$$Q^3-Q^2-Q^1-SO_3^- \ M^+ \quad (b0\text{-}1)$$

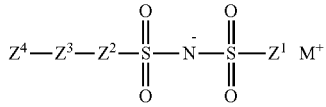
(b0-2)

In the formulas, $Q^1$ represents a fluorinated alkylene group of 1 to 4 carbon atoms which may have a substituent; $Q^2$ represents a divalent linking group containing an oxygen atom; $Q^3$ represents a ring structure-containing hydrocarbon group of 3 to 30 carbon atoms which may have a substituent; $M^+$ represents an organic cation; $Z^1$ represents an alkyl group of 1 to 10 carbon atoms which may have a substituent or a fluorinated alkyl group of 1 to 10 carbon atoms which may have a substituent; $Z^2$ represents a fluorinated alkylene group of 1 to 4 carbon atoms which may have a substituent; $Z^3$ represents a single bond or a divalent linking group; and $Z^4$ represents a monovalent organic group.

{Compound Represented by Formula (b0-1)}

[Anion Moiety]

In the aforementioned general formula (b0-1), the fluorinated alkylene group of 1 to 4 carbon atoms for $Q^1$ is preferably linear or branched, and the number of carbon atoms thereof is preferably 1 to 3, and more preferably 1 or 2.

Specific examples of such fluorinated alkylene groups include $-CF_2-$, $-CF_2CF_2-$, $-CF_2CF_2CF_2-$, $-CF(CF_3)CF_2-$, $-CF(CF_2CF_3)-$, $-C(CF_3)_2-$, $-CF_2CF_2CF_2CF_2-$, $-CF(CF_3)CF_2CF_2-$, $-CF_2CF(CF_3)CF_2-$, $-CF(CF_3)CF(CF_3)-$, $-C(CF_3)_2CF_2-$, $-CF(CF_2CF_3)CF_2-$, $-CF(CF_2CF_2CF_3)-$, $-C(CF_3)(CF_2CF_3)-$; $-CH_2CF_2-$, $-CH_2CH_2CF_2-$, $-CH_2CF_2CF_2-$, $-CH(CF_3)CH_2-$, $-CH(CF_2CF_3)-$, $-C(CH_3)(CF_3)-$, $-CH_2CH_2CH_2CF_2-$, $-CH_2CH_2CF_2CF_2-$, $-CH(CF_3)CH_2CH_2-$, $-CH_2CH(CF_3)CH_2-$, $-CH(CF_3)CH(CF_3)-$ and $-C(CF_3)_2CH_2-$.

As the fluorinated alkylene group for $Q^1$, a fluorinated alkylene group in which the carbon atom bonded to the adjacent sulfur atom is fluorinated is particularly desirable. Examples of such fluorinated alkylene groups include $-CF_2-$, $-CF_2CF_2-$, $-CF_2CF_2CF_2-$, $-CF(CF_3)CF_2-$, $-CF_2CF_2CF_2CF_2-$, $-CF(CF_3)CF_2CF_2-$, $-CF_2CF(CF_3)CF_2-$, $-CF(CF_3)CF(CF_3)-$, $-C(CF_3)_2CF_2-$, $-CF(CF_2CF_3)CF_2-$; $-CH_2CF_2-$, $-CH_2CH_2CF_2-$, $-CH_2CF_2CF_2-$; $-CH_2CH_2CH_2CF_2-$, $-CH_2CH_2CF_2CF_2-$, and $-CH_2CF_2CF_2CF_2-$.

Of these, $-CF_2-$, $-CF_2CF_2-$, $-CF_2CF_2CF_2-$ or $CH_2CF_2CF_2-$ is preferable, $-CF_2-$, $-CF_2CF_2-$ or $-CF_2CF_2CF_2-$ is more preferable, and $-CF_2-$ is particularly desirable.

The fluorinated alkylene group for $Q^1$ may have a substituent.

The expression that the "fluorinated alkylene group may have a substituent" means that some or all of the fluorine atoms or hydrogen atoms in the fluorinated alkylene group may be substituted, either with atoms other than fluorine atoms and hydrogen atoms, or with groups.

Examples of substituents which the fluorinated alkylene group may have include an alkoxy group of 1 to 4 carbon atoms and a hydroxyl group.

In the aforementioned general formula (b0-1), $Q^2$ represents a divalent linking group containing an oxygen atom. The linking group may contain an atom other than an oxygen atom. Examples of atoms other than an oxygen atom include a carbon atom, a hydrogen atom, a sulfur atom and a nitrogen atom. Examples of divalent linking groups containing an oxygen atom include non-hydrocarbon, oxygen atom-containing linking groups such as an oxygen atom (an ether bond; $-O-$), an ester bond ($-C(=O)-O-$), an amido bond ($-C(=O)-NH-$), a carbonyl group ($-C(=O)-$) and a carbonate group ($-O-C(=O)-O-$); and combinations of the aforementioned non-hydrocarbon, oxygen atom-containing linking groups with an alkylene group which may have a substituent, or with a fluorinated alkylene group.

The alkylene group or fluorinated alkylene group is preferably linear or branched. The alkylene group or fluorinated alkylene group preferably has 1 to 12 carbon atoms, more preferably 1 to 5 carbon atoms, still more preferably 1 to 4 carbon atoms, and most preferably 1 to 3 carbon atoms.

Specific examples of alkylene groups include a methylene group $[-CH_2-]$; alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$ and $-C(CH_2CH_3)_2-$; an ethylene group $[-CH_2CH_2-]$; alkylethylene groups such as $-CH(CH_3)CH_2-$, $-CH(CH_3)CH(CH_3)-$, $-C(CH_3)_2CH_2-$ and $-CH(CH_2CH_3)CH_2-$; a trimethylene group (n-propylene group) $[-CH_2CH_2CH_2-]$; alkyltrimethylene groups such as $-CH(CH_3)CH_2CH_2-$ and $-CH_2CH(CH_3)CH_2-$; a tetramethylene group $[-CH_2CH_2CH_2CH_2-]$; alkyltetramethylene groups such as $-CH(CH_3)CH_2CH_2CH_2-$ and $-CH_2CH(CH_3)CH_2CH_2-$; and a pentamethylene group $[-CH_2CH_2CH_2CH_2CH_2-]$.

As the fluorinated alkylene group, the aforementioned alkylene group for $Q^2$ in which a part or all of the hydrogen atoms in the alkylene group have been substituted with fluorine atoms can be used. Specific examples thereof include $-CF_2-$, $-CF_2CF_2-$, $-CF_2CF_2CF_2-$, $-CF(CF_3)CF_2-$, $-CF(CF_2CF_3)-$, $-C(CF_3)_2-$, $-CF_2CF_2CF_2CF_2-$, $-CF(CF_3)CF_2CF_2-$, $-CF_2CF(CF_3)CF_2-$, $-CF(CF_3)CF(CF_3)-$, $-C(CF_3)_2CF_2-$, $-CF(CF_2CF_3)CF_2-$, $-CF(CF_2CF_2CF_3)-$, $-C(CF_3)(CF_2CF_3)-$; $-CHF-$, $-CH_2CF_2-$, $-CH_2CH_2CF_2-$, $-CH_2CF_2CF_2-$, $-CH(CF_3)CH_2-$, $-CH(CF_2CF_3)-$, $-C(CH_3)(CF_3)-$, $-CH_2CH_2CH_2CF_2-$, $-CH_2CH_2CF_2CF_2-$, $-CH(CF_3)CH_2CH_2-$, $-CH_2CH(CF_3)CH_2-$, $-CH(CF_3)CH(CF_3)-$ and $-C(CF_3)_2CH_2-$.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may be substituted, either with atoms other than hydrogen atoms and fluorine atoms, or with groups.

Examples of substituents which the alkylene group or fluorinated alkylene group may have include an alkyl group of 1 to 4 carbon atoms, an alkoxy group of 1 to 4 carbon atoms, and a hydroxyl group.

Examples of divalent linking groups constituted of combinations of the aforementioned non-hydrocarbon, oxygen atom-containing linking groups with a divalent hydrocarbon group which may have a substituent include $-R^{9a}-O-$, $-R^{9b}-O-C(=O)-$, $-O-C(=O)-R^{9c}-$, $-O-R^{9d}-O-C(=O)-$, $-O-R^{9e}-O-C(=O)-R^{9f}-$, $-R^{9g}-O-C(=O)-R^{9h}-$, $-C(=O)-O-R^{9i}-O-C(=O)-$ and $-C(=O)-O-R^{9j}-O-C(=O)-R^{9k}-$.

In the formulas, each of $R^{9a}$ to $R^{9k}$ independently represents an alkylene group or fluorinated alkylene group which may have a substituent. As the alkylene group and fluorinated alkylene group for $R^{9a}$ to $R^{9k}$, the same groups as those described above can be used. As each of $R^{9a}$ to $R^{9k}$, an alkylene group is preferred.

In the aforementioned general formula (b0-1), $Q^3$ represents a ring structure-containing hydrocarbon group of 3 to 30 carbon atoms which may have a substituent.

The ring structure-containing hydrocarbon group is not limited as long as it contains a ring in the structure thereof, and may be constituted solely of cyclic hydrocarbon groups (cyclic groups), or may be a group constituted of cyclic groups as well as linear or branched hydrocarbon groups.

The cyclic group may be either a monocyclic group or a polycyclic group, but is preferably a polycyclic group.

The ring structure-containing hydrocarbon group may be either an aromatic hydrocarbon group or an aliphatic hydrocarbon group.

The aromatic hydrocarbon group for the ring structure-containing hydrocarbon group contains an aromatic cyclic group.

The aromatic cyclic group has 3 to 30 carbon atoms, preferably 5 to 30 carbon atoms, more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic cyclic group.

The aromatic hydrocarbon group may be constituted solely of aromatic cyclic groups, or may be constituted of a combination of aromatic cyclic groups with aliphatic hydrocarbon groups.

Specific examples of the aromatic hydrocarbon group include an aryl group such as a phenyl group, a biphenyl group, a fluorenyl group, a naphthyl group, an anthryl group or a phenanthryl group; and an arylalkyl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned hetero atom can be used.

When part of the carbon atoms constituting the aromatic ring within the aromatic hydrocarbon group has been substituted with a hetero atom, an atom in the $Q^3$ group which is bonded to the adjacent $Q^2$ group is preferably a carbon atom.

In the latter example, as the substituent for substituting the hydrogen atom of the aromatic hydrocarbon group, for example, an alkyl group, a halogen atom, an alkoxy group, a hydroxyl group, —C(=O)—$R^{80}$ [$R^{80}$ represents an alkyl group], —COO$R^{81}$ [$R^{81}$ represents a hydrogen atom or an alkyl group], —OC(=O)—$R^{82}$ [$R^{82}$ represents a hydrogen atom or an alkyl group], a halogenated alkyl group, a halogenated alkoxy group, a hydroxyalkyl group, an oxygen atom (=O), a sulfur atom, a sulfonyl group ($SO_2$), a nitrogen-containing hydrocarbon group, and other nitrogen-containing substituents can be used.

The alkyl group for the substituent may be a linear, branched or cyclic group, or may be a combination of these groups. The number of carbon atoms thereof is preferably 1 to 30.

When the alkyl group is linear or branched, the number of carbon atoms thereof is preferably 1 to 20, more preferably 1 to 17, still more preferably 1 to 15, and most preferably 1 to 10. Specific examples thereof include a methyl group, an ethyl group, an n-propyl group, an isopropyl group, an n-butyl group, an isobutyl group, an n-pentyl group, a hexyl group, a nonyl group and a decyl group.

When the alkyl group is cyclic (i.e., a cycloalkyl group), the number of carbon atoms is preferably 3 to 30, more preferably 3 to 20, still more preferably 3 to 15, still more preferably 4 to 12, and most preferably 5 to 10. The alkyl group may be either a monocyclic group or a polycyclic group. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Further, specific examples of the polycycloalkane include adamantane, norbornane, isobornane, tricyclodecane and tetracyclododecane. These cycloalkyl groups may or may not have part or all of the hydrogen atoms bonded to the ring substituted with a substituent such as a fluorine atom or a fluorinated alkyl group.

Examples of the halogen atom for the substituent include a fluorine atom, a chlorine atom, a bromine atom and an iodine atom, and a fluorine atom is preferable.

Examples of the alkoxy group for the substituent include the aforementioned alkyl groups for the substituent having an oxygen atom (—O—) bonded thereto. The aforementioned alkoxy group is preferably an alkoxy group having 1 to 5 carbon atoms, more preferably a methoxy group, an ethoxy group, a n-propoxy group, an isopropoxy group, a n-butoxy group or a tert-butoxy group, and most preferably a methoxy group or an ethoxy group.

With respect to the aforementioned —C(=O)—$R^{80}$, —COO$R^{81}$ and —OC(=O)—$R^{82}$ for the substituent, as the alkyl groups for $R^{80}$ to $R^{82}$, the same alkyl groups as those listed above for the substituent can be used.

Examples of the halogenated alkyl group for the substituent include groups in which part or all of the hydrogen atoms within the aforementioned alkyl groups has been substituted with the aforementioned halogen atoms. As the halogenated alkyl group, a fluorinated alkyl group is particularly desirable.

Examples of the halogenated alkoxy group for the substituent include the aforementioned alkoxy groups in which part or all of the hydrogen atoms have been substituted with the aforementioned halogen atoms. As the halogenated alkoxy group, a fluorinated alkoxy group is preferable.

As examples of the hydroxyalkyl group for the substituent, the aforementioned alkyl groups for the substituent in which at least one of the hydrogen atoms has been substituted with a hydroxyl group can be given. The number of hydroxyl groups within the hydroxyalkyl group is preferably 1 to 3, and most preferably 1.

The nitrogen-containing hydrocarbon groups and other nitrogen-containing substituents will be described later.

Among the examples above, as the aromatic hydrocarbon group, an aromatic cyclic group which may have a substituent is preferable, and a naphthyl group which may have a substituent or a phenyl group which may have a substituent is more preferable.

The aliphatic hydrocarbon group for the ring structure-containing hydrocarbon group contains an aliphatic cyclic group.

The aliphatic cyclic group has 3 to 30 carbon atoms, preferably 5 to 30 carbon atoms, more preferably 5 to 20 carbon atoms, still more preferably 6 to 15 carbon atoms, and most preferably 6 to 12 carbon atoms.

The aliphatic cyclic group may be either saturated or unsaturated, but is preferably saturated.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

The aliphatic cyclic group may have a substituent. For example, part of the carbon atoms constituting the aliphatic cyclic group (such as carbon atoms constituting the ring structure) may be substituted with a substituent containing a hetero atom, or a part or all of the hydrogen atoms constituting the aliphatic cyclic group may be substituted with a substituent containing a hetero atom.

As the hetero atom, there is no particular limitation as long as it is an atom other than carbon and hydrogen, and examples thereof include a halogen atom, an oxygen atom, a sulfur atom and a nitrogen atom. Examples of the halogen atom include a fluorine atom, a chlorine atom, an iodine atom and a bromine atom.

The substituent containing a hetero atom (hereafter, sometimes referred to as "hetero atom-containing substituent") may consist solely of the hetero atom, or may be a group containing a group or atom other than the hetero atom.

Specific examples of the hetero atom-containing substituent which may substitute part of the carbon atoms constituting the aliphatic cyclic group include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the hetero atom-containing substituent is —NH—, the substituent for substituting H (an alkyl group, an acyl group or the like) preferably has 1 to 10 carbon atoms, more preferably 1 to 8 carbon atoms, and most preferably 1 to 5 carbon atoms. These substituents may be contained in the ring structure.

Specific examples of the substituent for substituting part or all of the hydrogen atoms constituting the aliphatic cyclic group include a halogen atom, an alkoxy group, a hydroxyl group, —C(=O)—R[80] [R[80] represents an alkyl group], —COOR[81] [R[81] represents a hydrogen atom or an alkyl group], —OC(=O)—R[82] [R[82] represents a hydrogen atom or an alkyl group], a halogenated alkyl group, a halogenated alkoxy group, a hydroxyalkyl group, an oxo group (=O), a sulfur atom, a sulfonyl group (SO$_2$), a nitrogen-containing hydrocarbon group and other nitrogen-containing substituents.

As the halogen atom, alkoxy group, —C(=O)—R[80], —COOR[81], —OC(=O)—R[82], halogenated alkyl group, halogenated alkoxy group, hydroxyalkyl group, nitrogen-containing hydrocarbon group and other nitrogen-containing substituents for the hetero atom-containing substituent, the same as those described above as the substituents for substituting the hydrogen atoms of the aforementioned aromatic hydrocarbon group can be mentioned.

When the aliphatic cyclic group does not contain a hetero atom-containing substituent in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent in the ring structure thereof, the hetero atom-containing substituent is preferably —O—, —C(=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 48]

(L1)

(L2)

(L3)

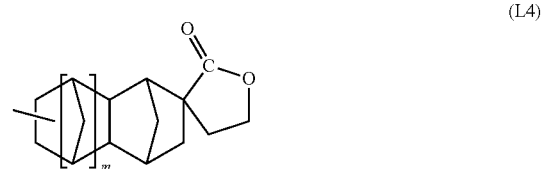

(L4)

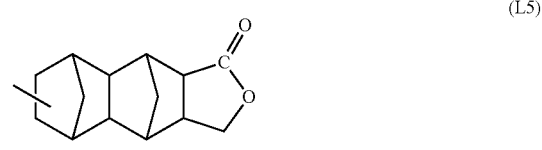

(L5)

(L6)

(S1)

(S2)

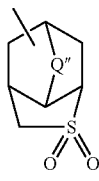
(S3)

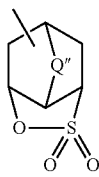
(S4)

In the formulas, Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms); and m represents an integer of 0 or 1.

In the formulas, as the alkylene group for Q", $R^{94}$ and $R^{95}$, the same alkylene groups as those described above for $R^{9a}$ to $R^{9k}$ in connection with $Q^2$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxo group (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituents for substituting part or all of the hydrogen atoms can be used.

The aliphatic hydrocarbon group for $Q^3$ may be constituted solely of an aliphatic cyclic group which may have a substituent, or may be a group constituted of an aliphatic cyclic group which may have a substituent and a linear or branched hydrocarbon group which may have a substituent. As a latter example, linear or branched alkyl groups which may have a substituent in which hydrogen atoms have been substituted with an aliphatic cyclic group can be mentioned.

As the aliphatic hydrocarbon group for $Q^3$, an aliphatic cyclic group which may have a substituent is preferable.

As $Q^3$, ring structure-containing hydrocarbon groups containing a nitrogen atom are also preferable.

As the ring structure-containing hydrocarbon groups containing a nitrogen atom, heterocyclic groups containing a nitrogen atom as a hetero atom (hereafter, referred to as "nitrogen-containing heterocyclic group") and ring structure-containing hydrocarbon groups which have a substituent containing a nitrogen atom (hereafter, referred to as "nitrogen-containing substituent") can be used. Of these, nitrogen-containing heterocyclic groups are preferred.

The ring structure-containing hydrocarbon groups containing a nitrogen atom may have a substituent with no nitrogen atom (hereafter, referred to as "non-nitrogen-containing substituent").

Examples of the non-nitrogen-containing substituents include an alkyl group, a halogen atom, an alkoxy group, a hydroxyl group, —C(=O)—$R^{80}$ [$R^{80}$ represents an alkyl group], —COO$R^{81}$ [$R^{81}$ represents a hydrogen atom or an alkyl group], —OC(=O)—$R^{82}$ [$R^{82}$ represents a hydrogen atom or an alkyl group], a halogenated alkyl group, a halogenated alkoxy group, a hydroxyalkyl group, an oxygen atom (=O), a sulfur atom, a sulfonyl group ($SO_2$) and an aryl group.

As the alkyl group, halogen atom, alkoxy group, —C(=O)—$R^{80}$, —COO$R^{81}$, —OC(=O)—$R^{82}$, halogenated alkyl group, halogenated alkoxy group and hydroxyalkyl group for the substituent, the same as those described above as the substituents for substituting the hydrogen atoms of the aforementioned aromatic hydrocarbon group can be mentioned.

As the aryl group, the same aryl groups as those described above as the aromatic hydrocarbon groups for $Q^3$ can be mentioned, and a phenyl group, a tolyl group, a naphthyl group or the like is preferable.

As the nitrogen-containing heterocyclic group, groups in which one hydrogen atom has been removed from a heterocycle containing a nitrogen atom as a hetero atom (namely, nitrogen-containing heterocycle) can be used.

As the nitrogen-containing heterocycles, unsaturated monocyclic nitrogen-containing heterocycles such as pyridine, pyrrole, pyrazole, imidazole, 1,2,3-triazole, 1,2,4-triazole, tetrazole, pyrimidine, pyrazine and 1,3,5-triazine; saturated monocyclic nitrogen-containing heterocycles such as piperidine, piperazine and pyrrolidine; and polycyclic nitrogen-containing heterocycles such as quinoline, isoquinoline, indole, pyrrolo[2,3-b]pyridine, indazole, benzimidazole, benzotriazole, carbazole, acridine, 1,5-diazabicyclo [4.3.0]—5-nonene, 1,8-diazabicyclo[5.4.0]-7-undecene, hexamethylenetetramine and 1,4-diazabicyclo [2.2.2]octane can be used.

The nitrogen-containing heterocyclic group may be either a monocyclic group or a polycyclic group. The nitrogen-containing heterocyclic group has 3 to 30 carbon atoms, preferably 5 to 30 carbon atoms, and more preferably 5 to 20 carbon atoms.

As the nitrogen-containing heterocyclic group, a 2-pyridyl group, a 3-pyridyl group, a 4-pyridyl group or a piperidino group is preferable, and a 2-pyridyl group is particularly desirable.

These nitrogen-containing heterocyclic groups may have part or all of the hydrogen atoms substituted with a nitrogen-containing substituent or a non-nitrogen-containing substituent.

The aforementioned ring structure-containing hydrocarbon group which has a nitrogen-containing substituent is a ring structure-containing hydrocarbon group in which part or all of the hydrogen atoms have been substituted with a nitrogen-containing substituent.

The ring structure-containing hydrocarbon group may be either an aromatic hydrocarbon group or an aliphatic hydrocarbon group. As the aromatic hydrocarbon groups and aliphatic hydrocarbon groups, the same aromatic hydrocarbon groups and aliphatic hydrocarbon groups as those described above in connection with the ring structure-containing hydrocarbon group for $Q^3$ can be used.

As examples of the nitrogen-containing substituent, the aforementioned nitrogen-containing heterocyclic groups can be given. Further, as other nitrogen-containing substituents, non-hydrocarbon-based, nitrogen-containing substituents such as amino group (—$NH_2$), an imino group (=NH), a cyano group (—CN), an ammonio group (—$NH_3^+$) and a nitro group can be used.

These nitrogen-containing substituents may have part or all of the hydrogen atoms substituted with a non-nitrogen-containing substituent. Examples of the nitrogen-containing substituent substituted with a non-nitrogen-containing substituent include an alkylamino group, an amide group, a dialkylamino group, an alkylimino group and a trialkylammonio group.

Specific examples of the ring structure-containing hydrocarbon group which has a nitrogen-containing substituent include aminoaryl groups such as a 2-aminophenyl group and a 4-aminophenyl group; alkylaminoaryl groups such as a (methylamino)phenyl group; and dialkylaminoaryl groups such as a (dimethylamino)phenyl group and a (diethylamino)phenyl group.

Among the examples described above, as an anion ($Q^3$-$Q^2$-$Q^1$-$SO_3^-$) of the compound represented by the aforementioned general formula (b0-1), those in which $Q^2$ represents a divalent linking group containing a carbonyl group and/or an ether bond are preferable; and those in which $Q^2$ represents a divalent linking group containing an ester bond or a divalent linking group containing an ether bond but does not contain an ester bond are more preferable.

As the divalent linking groups containing an ester bond, those described above in connection with $Q^2$, i.e., those represented by —$R^{9b}$—O—C(=O)—, —O—C(=O)—$R^{9c}$—, —O—$R^{9d}$—O—C(=O)—, —O—$R^{9e}$—O—C(=O)—$R^{9f}$—, —$R^{9g}$—O—C(=O)—$R^{9h}$—, —C(=O)—O—$R^{9i}$—O—C(=O)— and —C(=O)—O—$R^{9j}$—O—C(=O)—$R^{9k}$— are preferable. Among these, those in which $R^{9b}$ to $R^{9k}$ represent an alkylene group are particularly desirable.

As the divalent linking group containing an ether bond but does not contain an ester bond, those described above in connection with $Q^2$, i.e., those represented by —$R^{9a}$—O— are preferable. Among these, those in which $R^{9a}$ represents an alkylene group are particularly desirable.

More preferable examples of the anions in which the aforementioned $Q^2$ group represents a divalent linking group containing a carboxyl group include the anions represented by general formula (11) shown below.

[Chemical Formula 49]

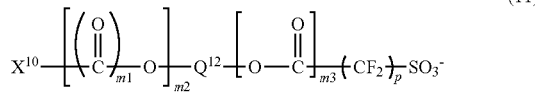

(11)

In formula (11), $X^{10}$ represents a ring structure-containing hydrocarbon group of 3 to 30 carbon atoms which may have a substituent; $Q^{12}$ represents a single bond or an alkylene group; p represents an integer of 1 to 4; and each of m1 to m3 represents 0 or 1, with the provision that both of (m2+m3) and (m1+m3) is not 0.

In formula (11), $X^{10}$ is the same as defined for $Q^3$ in the aforementioned formula (b0-1).

As $X^{10}$, an aliphatic cyclic group which may have a substituent or an aromatic hydrocarbon group which may have a substituent is preferable. Of these, an aliphatic cyclic group containing a hetero atom-containing substituent in the ring structure thereof is particularly desirable.

As the alkylene group for $Q^{12}$, the same alkylene groups as those described above for $R^{9a}$ to $R^{9k}$ in connection with $Q^2$ can be used.

As $Q^{12}$, a single bond or a methylene group is particularly desirable. In particular, when $X^{10}$ represents an aliphatic cyclic group which may have a substituent, $Q^{12}$ is preferably a single bond, whereas when $X^{10}$ represents an aromatic hydrocarbon group which may have a substituent, $Q^{12}$ is preferably a methylene group.

Each of m1 to m3 represents 0 or 1, with the provision that both of (m2+m3) and (m1+m3) is not 0. In other words, both of (m2+m3) and (m1+m3) is either 1 or 2. For example, when m3 is 0, m2 is 1 and m1 is also 1.

p is preferably an integer of 1 to 3, and more preferably 1 or 2.

Preferable examples of the anions in which $Q^2$ in the aforementioned general formula (b0-1) represents a divalent linking group containing an ester bond or a divalent linking group containing an ether bond but does not contain an ester bond include the anions represented by general formulas (11a) to (11e) shown below.

[Chemical Formula 50]

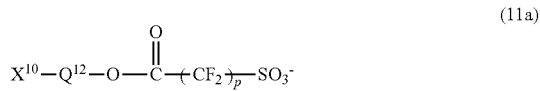

(11a)

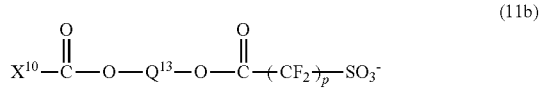

(11b)

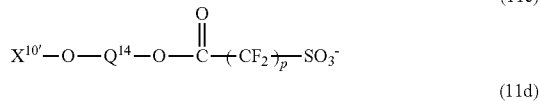

(11c)

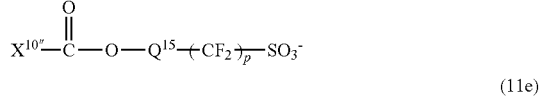

(11d)

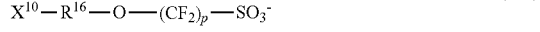

(11e)

In formula (11a), $X^{10}$, $Q^{12}$ and p are the same as defined above; in formula (11b), $X^{10}$ and p are the same as defined above, and $Q^{13}$ represents an alkylene group; in formula (11c), $X^{10'}$ represents a fluorinated aryl group which may have a substituent, $Q^{14}$ represents a single bond or an alkylene group, and p is the same as defined above; in formula (11d), $X^{10''}$ represents an aliphatic cyclic group of 3 to 30 carbon atoms which may have a substituent, $Q^{15}$ represents an alkylene group which may have a substituent, and p is the same as defined above; and in formula (11e), $X^{10}$ and p are the same as defined above, and $Q^{16}$ represents an alkylene group.

In formula (11a), $X^{10}$, $Q^{12}$ and p are respectively the same as defined for $X^{10}$, $Q^{12}$ and p in the aforementioned formula (11).

In formula (11b), $X^{10}$ and p are respectively the same as defined for $X^{10}$ and p in the aforementioned formula (11).

As the alkylene group for $Q^{13}$, the same alkylene groups as those described above for $R^{9a}$ to $R^{9k}$ in connection with $Q^2$ can be used.

In formula (11c), p is the same as defined for p in the aforementioned formula (11).

A "fluorinated aryl group" for $X^{10'}$ is an aryl group in which at least one of the hydrogen atoms has been substituted with a fluorine atom. As the aryl group, the same aryl groups as those described above in connection with the aromatic hydrocarbon groups for $Q^3$ can be used, and a phenyl group or a naphthyl group is preferable, and a phenyl group is particularly desirable.

The aryl group may have a substituent other than a fluorine atom. Examples of the substituent include the same substituents as those described above for substituting the hydrogen atom of the aromatic hydrocarbon groups for $Q^3$ (excluding fluorine atoms).

As the alkylene group for $Q^{14}$, the same alkylene groups as those described above for $R^{9a}$ to $R^{9k}$ in connection with $Q^2$ can be used. As $Q^{14}$, a single bond or a linear alkylene group is preferred. As the alkylene group, an alkylene group of 1 to 5 carbon atoms is particularly desirable.

In formula (11d), p is the same as defined for p in the aforementioned formula (11).

As the aliphatic cyclic group for $X^{10'''}$, the same aliphatic cyclic groups as those described above in connection with the aliphatic hydrocarbon group for $Q^3$ can be used, and an adamantyl group is particularly desirable.

The aliphatic cyclic group may have a substituent. As the substituent, the same substituents as those described above for substituting part or all of the hydrogen atoms of the aforementioned aliphatic cyclic groups can be used.

As the alkylene group for $Q^{15}$, the same alkylene groups as those described above for $R^{9a}$ to $R^{9k}$ in connection with $Q^2$ can be used. As $Q^{15}$, a linear or branched alkylene group is preferable. The alkylene group preferably has a main chain of 1 to 12 carbon atoms. The number of carbon atoms within the main chain is more preferably 1 to 5, still more preferably 1 to 3, and most preferably 1. In other words, as $Q^{15}$, a methylene group or an alkylmethylene group is particularly desirable.

The alkyl group within the alkylmethylene group is preferably an alkyl group of 1 to 5 carbon atoms.

The alkylene group may have a substituent. As the substituent, the same substituents as those described above which the aforementioned aliphatic hydrocarbon group for $Q^3$ may have as a substituent can be used, and a halogen atom is preferable, and a fluorine atom is particularly desirable.

In formula (11e), $X^{10}$ and p are respectively the same as defined for $X^{10}$ and p in the aforementioned formula (11).

As the alkylene group for $Q^{16}$, the same alkylene groups as those described above for $R^{9a}$ to $R^{9k}$ in connection with $Q^2$ can be used. As the alkylene group, an alkylene group of 1 to 5 carbon atoms is particularly desirable.

Preferable examples of the anions represented by the aforementioned general formulas (11a) to (11e) include the anions represented by general formulas (b1) to (b8) shown below.

[Chemical Formula 51]

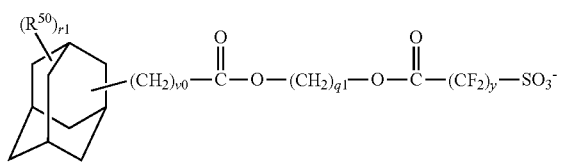
(b1)

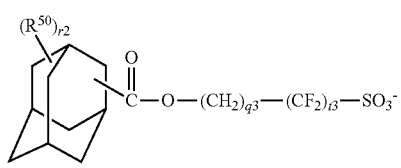
(b2)

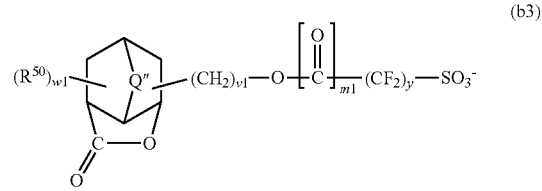
(b3)

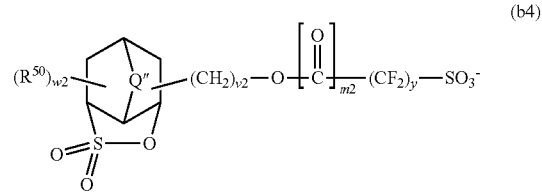
(b4)

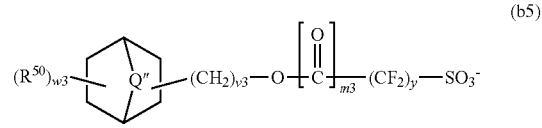
(b5)

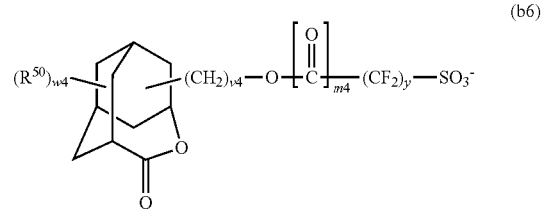
(b6)

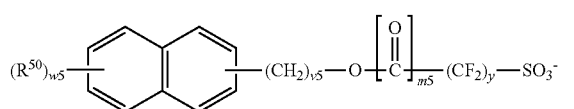
(b7)

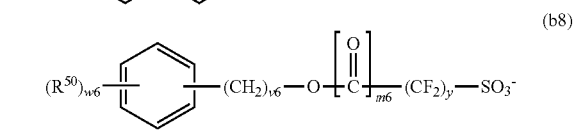
(b8)

In the formulas, y represents an integer of 1 to 3; q1 represents an integer of 1 to 5; q3 represents an integer of 1 to 12; t3 represents an integer of 1 to 3; each of r1 and r2 independently represents an integer of 0 to 3; $R^{50}$ represents a substituent; each of m1 to m6 independently represents 0 or 1; each of v0 to v6 independently represents an integer of 0 to 3; each of w1 to w6 independently represents an integer of 0 to 3; and Q'' is the same as defined above.

As the substituent for $R^{50}$, the same substituents as those listed above, within the description for $Q^3$, which the aforementioned aromatic hydrocarbon group may have as a substituent or which the aforementioned aliphatic hydrocarbon group may have as a substituent can be used.

If there are two or more of the $R^{50}$ group, as indicated by the values r1, r2, and w1 to w6, then the two or more of the $R^{50}$ groups in this compound may be the same or different from each other.

[Cation Moiety]

In the aforementioned formula (b0-1), $M^+$ represents an organic cation.

As $M^+$, there is no particular limitation, and any of the known cation moieties of acid generators used in conventional chemically amplified resist compositions can be used.

Suitable examples of the cation moieties include the cation moieties of onium salt-based acid generators such as iodonium salts and sulfonium salts. As examples of the cation moiety, a cation represented by general formula (b-1') or (b-2') shown below can be given. Among these, a cation represented by formula (b-1') shown below is particularly desirable.

[Chemical Formula 52]

In the formulas, each of $R^{1''}$ to $R^{3''}$ independently represents an aryl group which may have a substituent, an alkyl group or an alkenyl group, wherein two of $R^{1''}$ to $R^{3''}$ may be bonded to each other to form a ring with the sulfur atom in the formula; and each of $R^{5''}$ and $R^{6''}$ independently represents an aryl group which may have a substituent, an alkyl group or an alkenyl group.

In formula (b-1'), each of $R^{1''}$ to $R^{3''}$ independently represents an aryl group which may have a substituent, an alkyl group or an alkenyl group. Two of $R^{1''}$ to $R^{3''}$ may be mutually bonded to form a ring with the sulfur atom in the formula.

Examples of the aryl groups for $R^{1''}$ to $R^{3''}$ include an unsubstituted aryl group of 6 to 20 carbon atoms; and a substituted aryl group in which part or all of the hydrogen atoms of the aforementioned unsubstituted aryl group has been substituted with substituents.

The unsubstituted aryl group for $R^{1''}$ to $R^{3''}$ is preferably an aryl group having 6 to 10 carbon atoms because it can be synthesized at a low cost. Specific examples thereof include a phenyl group and a naphthyl group.

Examples of the substituents within the unsubstituted aryl group for $R^{1''}$ to $R^{3''}$ include an alkyl group, an alkoxy group, a halogen atom, a hydroxyl group, an oxo group (=O), an aryl group, an alkoxyalkyloxy group, an alkoxycarbonylalkyloxy group, —C(=O)—O—$R^{6'}$, —O—C(=O)—$R^{7'}$ and —O—$R^{8'}$. Each of $R^{6'}$, $R^{7'}$ and $R^{8'}$ independently represents a hydrogen atom, a saturated hydrocarbon group or an aliphatic unsaturated hydrocarbon group.

The alkyl group as the substituent for the substituted aryl group is preferably an alkyl group of 1 to 5 carbon atoms, and a methyl group, an ethyl group, a propyl group, an n-butyl group, or a tert-butyl group is particularly desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is particularly desirable.

The halogen atom as the substituent for the substituted aryl group is preferably a fluorine atom.

As the aryl group as the substituent for the substituted aryl group, the same aryl groups as those described above for $R^{1''}$ to $R^{3''}$ can be mentioned, and an aryl group of 6 to 20 carbon atoms is preferable, an aryl group of 6 to 10 carbon atoms is more preferable, and a phenyl group or a naphthyl group is still more preferable.

Examples of the alkoxyalkyloxy groups as the substituent for the substituted aryl group include groups represented by a general formula shown below:

—O—C($R^{47}$)($R^{48}$)—O—$R^{49}$ (wherein each of $R^{47}$ and $R^{48}$ independently represents a hydrogen atom or a linear or branched alkyl group; and $R^{49}$ represents an alkyl group).

The alkyl group for $R^{47}$ and $R^{48}$ preferably has 1 to 5 carbon atoms, and may be either linear or branched, and is preferably an ethyl group or a methyl group, and most preferably a methyl group.

It is preferable that at least one of $R^{47}$ and $R^{48}$ be a hydrogen atom. It is particularly desirable that either one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkane include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the substituted aryl group include groups represented by a general formula shown below:

—O—$R^{50}$—C(=O)—O—$R^{56}$ (wherein $R^{50}$ represents a linear or branched alkylene group; and $R^{56}$ represents a tertiary alkyl group).

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

Examples of the tertiary alkyl group for $R^{56}$ include a 2-methyl-2-adamantyl group, a 2-(2-propyl)-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Further, a group in which $R^{56}$ in the group represented by the aforementioned general formula: —O—$R^{50}$—C(=O)—O—$R^{56}$ has been substituted with $R^{56'}$ can also be mentioned. $R^{56'}$ represents a hydrogen atom, an alkyl group, a fluorinated alkyl group or an aliphatic cyclic group which may contain a hetero atom.

The alkyl group for $R^{56'}$ is the same as defined for the alkyl group for the aforementioned $R^{49}$.

Examples of the fluorinated alkyl group for $R^{56'}$ include groups in which part or all of the hydrogen atoms within the alkyl group for $R^{49}$ has been substituted with a fluorine atom.

Examples of the aliphatic cyclic group for $R^{56'}$ which may contain a hetero atom include an aliphatic cyclic group which does not contain a hetero atom, an aliphatic cyclic group containing a hetero atom in the ring structure, and an aliphatic cyclic group in which a hydrogen atom has been substituted with a hetero atom.

As an aliphatic cyclic group for $R^{56'}$ which does not contain a hetero atom, a group in which one or more hydrogen atoms have been removed from a monocycloalkane or a polycycloalkane such as a bicycloalkane, a tricycloalkane or a tetracycloalkane can be mentioned. Examples of the monocycloalkane include cyclopentane and cyclohexane. Examples of polycycloalkane include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56'}$ containing a hetero atom in the ring structure include groups represented by the aforementioned formulas (L1) to (L5) and (S1) to (S4).

As the aliphatic cyclic group for $R^{56'}$ in which a hydrogen atom has been substituted with a hetero atom, an aliphatic cyclic group in which a hydrogen atom has been substituted with an oxo group ($=$O) can be mentioned.

With respect to —C($=$O)—O—$R^{6'}$, —O—C($=$O)—$R^{7'}$ and —O—$R^{8'}$ as the substituent for the substituted aryl group, each of $R^{6'}$, $R^{7'}$ and $R^{8'}$ independently represents a hydrogen atom, a saturated hydrocarbon group or an aliphatic unsaturated hydrocarbon group.

The saturated hydrocarbon group may be any one of linear, branched or cyclic group, or may be a combination of these groups.

The linear or branched, saturated hydrocarbon group preferably has 1 to 25 carbon atoms, more preferably 1 to 15 carbon atoms, and still more preferably 4 to 10 carbon atoms.

Examples of the linear, saturated hydrocarbon group include a methyl group, an ethyl group, a propyl group, a butyl group, a pentyl group, a hexyl group, a heptyl group, an octyl group, a nonyl group and a decyl group.

As examples of the branched, saturated hydrocarbon group, the tertiary alkyl groups described above for $R^{56}$ can be mentioned. Further, examples of the branched, saturated hydrocarbon group excluding the tertiary alkyl groups include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The linear or branched, saturated hydrocarbon group may have a substituent. Examples of the substituent include an alkoxy group, a halogen atom, a halogenated alkyl group, a hydroxyl group, an oxo group ($=$O), a cyano group and a carboxy group.

The alkoxy group as the substituent for the linear or branched saturated hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the linear or branched, saturated hydrocarbon group include a fluorine atom, a chlorine atom, a bromine atom and an iodine atom, and a fluorine atom is preferable.

Examples of the halogenated alkyl group as the substituent for the linear or branched, saturated hydrocarbon group include a group in which part or all of the hydrogen atoms within the aforementioned linear or branched, saturated hydrocarbon group have been substituted with the aforementioned halogen atoms.

The cyclic saturated hydrocarbon group for $R^{6'}$, $R^{7'}$ and $R^{8'}$ preferably has 3 to 20 carbon atoms. The cyclic saturated hydrocarbon group may be either a polycyclic group or a monocyclic group, and examples thereof include groups in which one hydrogen atom has been removed from a monocycloalkane, and groups in which one hydrogen atom has been removed from a polycycloalkane (e.g., a bicycloalkane, a tricycloalkane or a tetracycloalkane). More specific examples include groups in which one hydrogen atom has been removed from a monocycloalkane such as cyclopentane, cyclohexane, cycloheptane or cyclooctane; and groups in which one hydrogen atom has been removed from a polycycloalkane such as adamantane, norbornane, isobornane, tricyclodecane or tetracyclododecane.

The cyclic, saturated hydrocarbon group may have a substituent. For example, part of the carbon atoms constituting the ring within the cyclic alkyl group may be substituted with a hetero atom, or a hydrogen atom bonded to the ring within the cyclic alkyl group may be substituted with a substituent.

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one or more hydrogen atoms have been removed therefrom, can be used. Further, the ring may contain an ester bond (—C($=$O)—O—). More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter example, as the substituent, the same substituents as those described above which the aforementioned linear or branched alkyl group may have, or an alkyl group of 1 to 5 carbon atoms can be used.

The saturated hydrocarbon group for $R^{6'}$, $R^{7'}$ and $R^{8'}$ may be a combination of a linear or branched saturated hydrocarbon group with a cyclic saturated hydrocarbon group.

Examples of the combination of a linear or branched saturated hydrocarbon group with a cyclic saturated hydrocarbon group include groups in which a cyclic saturated hydrocarbon group as a substituent is bonded to a linear or branched saturated hydrocarbon group (such as a 1-(1-adamantyl)methyl group), and groups in which a linear or branched saturated hydrocarbon group as a substituent is bonded to a cyclic saturated hydrocarbon group.

The aliphatic unsaturated hydrocarbon group for $R^{6'}$, $R^{7'}$ and $R^{8'}$ is preferably linear or branched. Examples of the linear aliphatic unsaturated hydrocarbon group include a vinyl group, a propenyl group (an allyl group) and a butynyl group. Examples of the branched aliphatic unsaturated hydrocarbon group include a 1-methylpropenyl group and a 2-methylpropenyl group. The aforementioned linear or branched, aliphatic unsaturated hydrocarbon group may have a substituent. Examples of the substituents include the same substituents as those which the aforementioned linear or branched alkyl group may have.

Among the aforementioned examples, as $R^{6'}$, $R^{7'}$ and $R^{8'}$, in terms of improvement in lithography properties and shape of the resist pattern, a hydrogen atom, a linear or branched, saturated hydrocarbon group of 1 to 15 carbon atoms or a cyclic saturated hydrocarbon group of 3 to 20 carbon atoms is preferable.

The aryl group for each of $R^{1'''}$ to $R^{3'''}$ is preferably a phenyl group or a naphthyl group.

Examples of the alkyl groups for $R^{1'''}$ to $R^{3'''}$ include unsubstituted alkyl groups; and substituted alkyl groups in which part or all of the hydrogen atoms of the aforementioned unsubstituted alkyl groups has been substituted with substituents.

The unsubstituted alkyl group may be any one of linear, branched or cyclic group, or may be a combination of these groups. The number of carbon atoms thereof is preferably 1 to 30.

When the alkyl group is linear or branched, the number of carbon atoms thereof is preferably 1 to 20, more preferably 1 to 15, still more preferably 1 to 10, and most preferably 1 to 5. Specific examples thereof include a methyl group, an ethyl group, an n-propyl group, an isopropyl group, an n-butyl group, an isobutyl group, an n-pentyl group, a hexyl group, a nonyl group and a decyl group. Among these, a methyl group is particularly desirable because it is excellent in resolution and can be synthesized at a low cost.

When the alkyl group is cyclic, the number of carbon atoms is preferably 3 to 30, more preferably 3 to 20, still more preferably 3 to 15, still more preferably 4 to 12, and most preferably 5 to 10. The alkyl group may be either a monocyclic group or a polycyclic group. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Further, specific examples of the polycycloalkane include adamantane, norbornane, isobornane, tricyclodecane and tetracyclododecane.

As the substituent contained within the substituted alkyl group, the same substituents as those described above as the substituent within the aforementioned substituted aryl group can be used.

Examples of the alkenyl groups for $R^{1'''}$ to $R^{3'''}$ include unsubstituted alkenyl groups; and substituted alkenyl groups in which part or all of the hydrogen atoms of the aforementioned unsubstituted alkenyl groups has been substituted with substituents.

The unsubstituted alkenyl group may be any one of linear, branched or cyclic group, or may be a combination of these groups. The alkenyl group preferably has 2 to 10 carbon atoms, more preferably 2 to 5 carbon atoms, and still more preferably 2 to 4 carbon atoms. Specific examples thereof include a vinyl group, a propenyl group (an allyl group), a butynyl group, a 1-methylpropenyl group and a 2-methylpropenyl group.

As the substituent contained within the substituted alkenyl group, the same substituents as those described above as the substituent within the aforementioned substituted aryl group can be used.

Two of $R^{1'''}$ to $R^{3'''}$ may be mutually bonded to form a ring with the sulfur atom in the formula. The ring may be either monocyclic or polycyclic.

Further, the ring may be either an aromatic ring or an aliphatic ring. The aliphatic ring may be either a saturated aliphatic ring or an unsaturated aliphatic ring.

When two of $R^{1'''}$ to $R^{3'''}$ are bonded to each other to form a ring, it is preferable that a ring containing the sulfur atom in the formula within the ring skeleton thereof be a 3 to 10-membered ring including the sulfur atom, and it is particularly desirable that the ring be a 5 to 7-membered ring including the sulfur atom.

Such a ring may contain another hetero atom as an atom to constitute the ring skeleton, in addition to the sulfur atom to which $R^5$ and $R^6$ are bonded. Examples of the hetero atom include a sulfur atom, an oxygen atom and a nitrogen atom.

Specific examples of the ring to be formed include a thiophene ring, a thiazole ring, a benzothiophene ring, a thianthrene ring, a dibenzothiophene ring, a 9H-thioxanthene ring, a thioxanthone ring, a phenoxathiin ring, a tetrahydrothiophenium ring and a tetrahydrothiopyranium ring.

Specific examples of cation moiety represented by general formula (b-1') include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyl)diphenylsulfonium, (4-(tert-butoxycarbonylmethyloxy)-3,5-dimethylphenyl)diphenylsulfonium, (4-(2-methyl-2-adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium and 1-(4-methylphenyl)tetrahydrothiopyranium.

Specific preferable examples of the cations represented by formula (b-1') include cations represented by formulas (b1-1-1) to (b1-1-33) shown below.

[Chemical Formula 53]

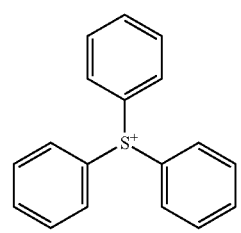

(b1-1-1)

-continued
(b1-1-2)
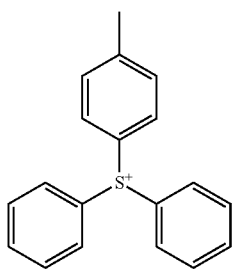
(b1-1-3)
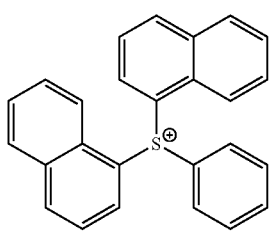
(b1-1-4)
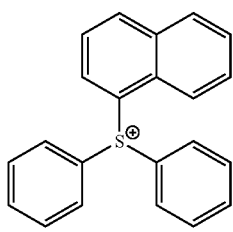
(b1-1-5)
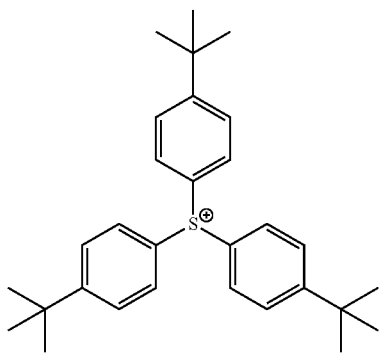
(b1-1-6)
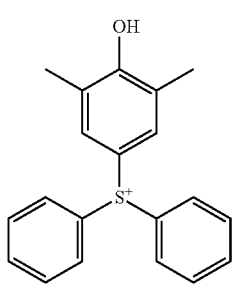
-continued
(b1-1-7)
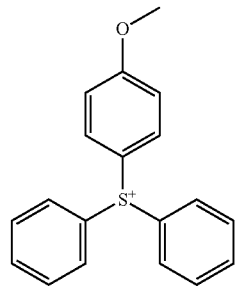
(b1-1-8)
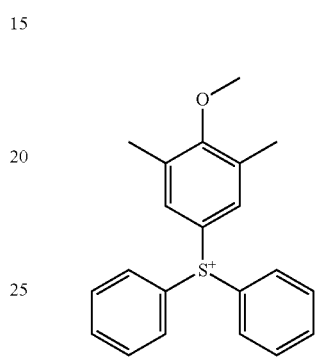
[Chemical Formula 54]
(b1-1-9)
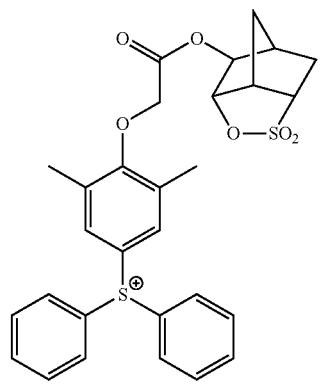
(b1-1-10)
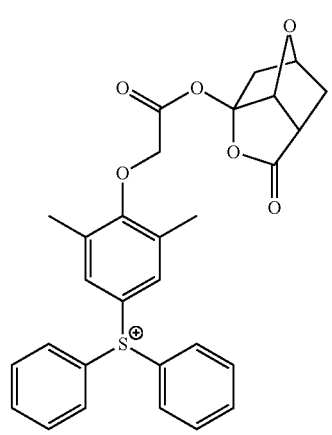

(b1-1-11)
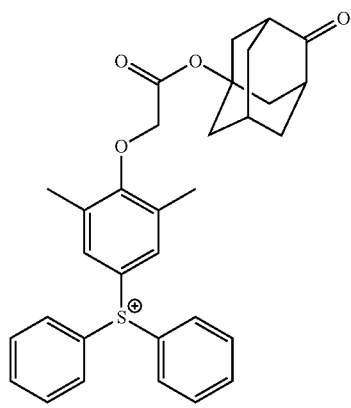
(b1-1-12)
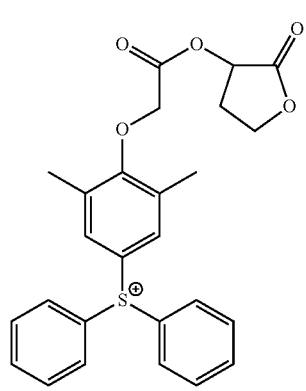
[Chemical Formula 55]
(b1-1-13)
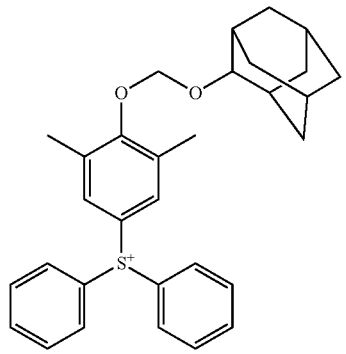
(b1-1-14)
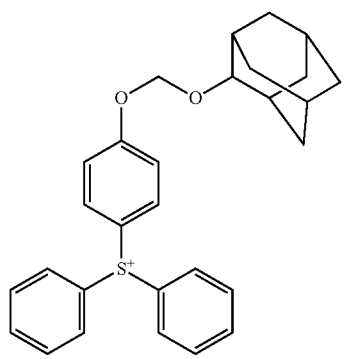
(b1-1-15)
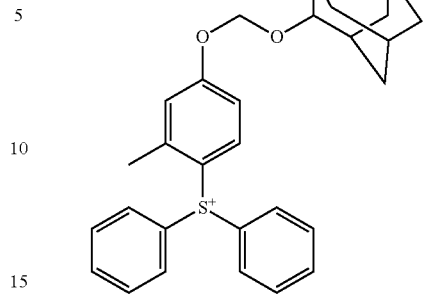
(b1-1-16)
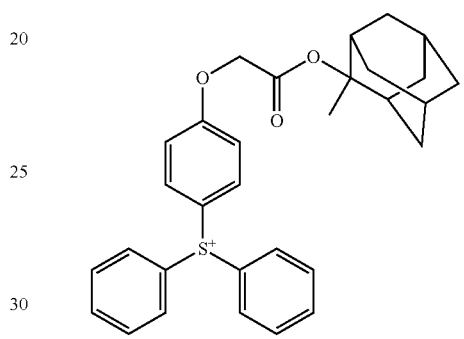
(b1-1-17)
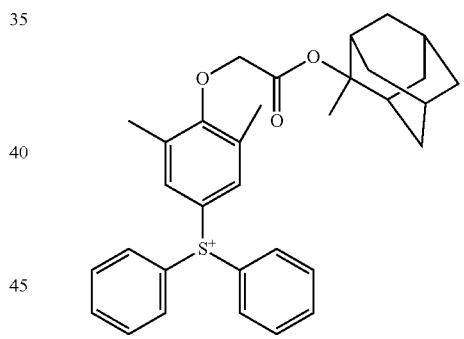
(b1-1-18)
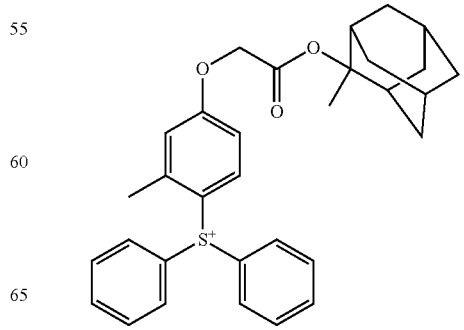

(b1-1-19) 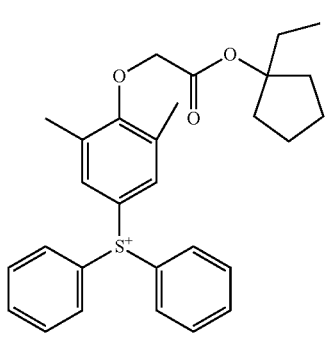
(b1-1-20) 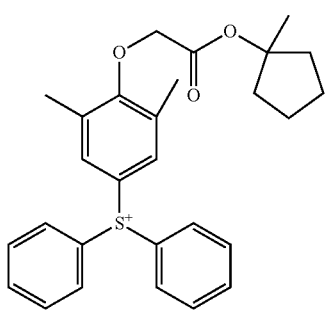
(b1-1-21) 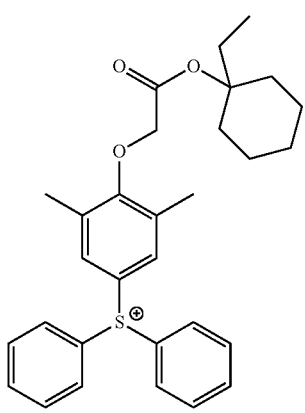
[Chemical Formula 56]
(b1-1-22) 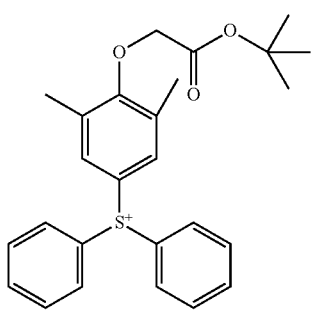
(b1-1-23) 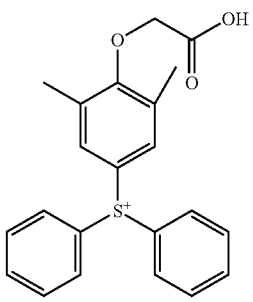
(b1-1-24) 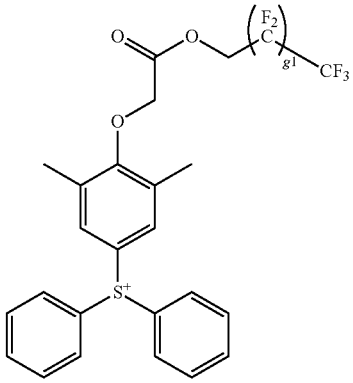
(b1-1-25) 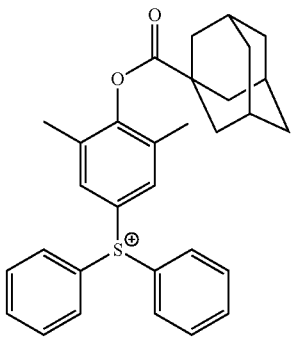
(b1-1-26) 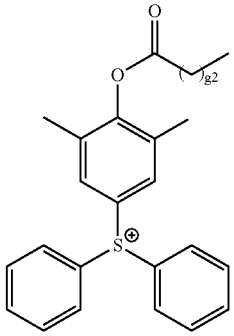

-continued (b1-1-27)
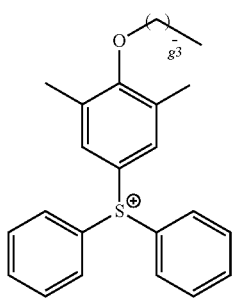

In the formulas, each of g1 to g3 represents a recurring number, wherein g1 is an integer of 1 to 5, g2 is an integer of 0 to 20, and g3 is an integer of 0 to 20.

[Chemical Formula 57]

(b1-1-28)
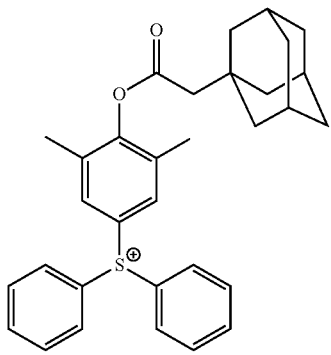

(b1-1-29)
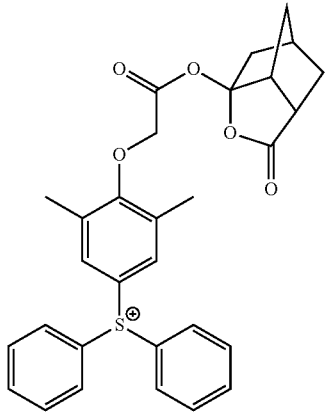

(b1-1-30)
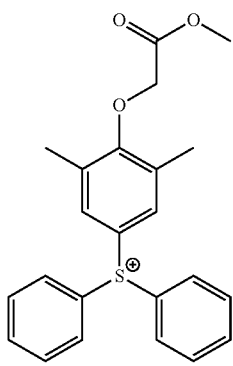

(b1-1-31)
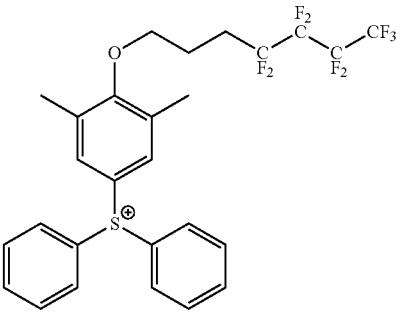

[Chemical Formula 58]

(b1-1-32)
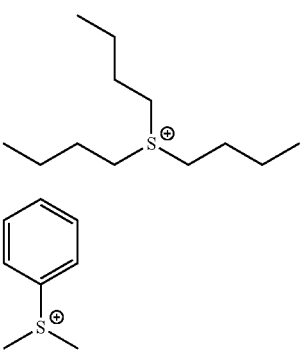

(b1-1-33)
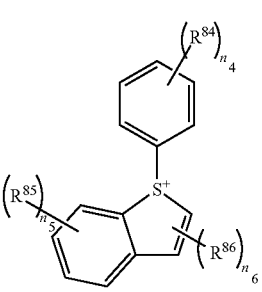

Further, with respect to the cation represented by formula (b-1'), when two of $R^{1''}$ to $R^{3''}$ are mutually bonded to form a ring with the sulfur atom in the formula, specific preferable examples of the cation moiety include cation moieties represented by formulas (b1-2) to (b1-5) shown below.

[Chemical Formula 59]

(b1-2)
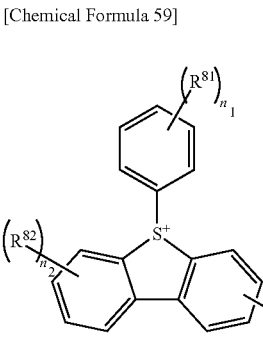

(b1-3)

In the formulas, each of $R^{81}$ to $R^{86}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

[Chemical Formula 60]

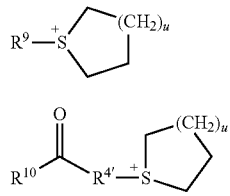

(b1-4)

(b1-5)

In the formulas, each of $R^9$ and $R^{10}$ independently represents a phenyl group or naphthyl group which may have a substituent, an alkyl group of 1 to 5 carbon atoms, an alkoxy group or a hydroxyl group; $R^{4'}$ represents an alkylene group of 1 to 5 carbon atoms; and u represents an integer of 1 to 3.

In formulas (b1-2) and (b1-3), the alkyl group for $R^{81}$ to $R^{86}$ is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

In formulas (b1-2) and (b1-3), the alkoxy group for $R^{81}$ to $R^{86}$ is preferably an alkoxy group of 1 to 5 carbon atoms, more preferably a linear or branched alkoxy group, and most preferably a methoxy group or an ethoxy group.

In formulas (b1-2) and (b1-3), the hydroxyalkyl group for $R^{81}$ to $R^{86}$ is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{81}$ to $R^{86}$ group, as indicated by the corresponding value of $n_1$ to $n_6$, then the two or more of the individual $R^{81}$ to $R^{86}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Preferable examples of the cation represented by the above formula (b1-2) or (b1-3) are shown below.

[Chemical Formula 61]

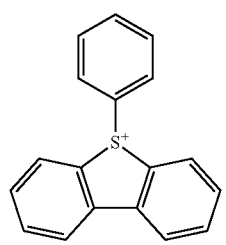

(b1-2-1)

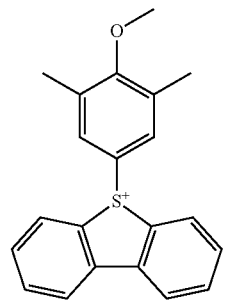

(b1-2-2)

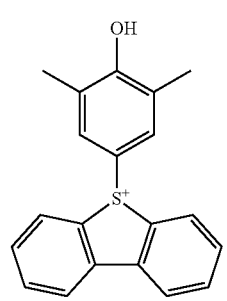

(b1-2-3)

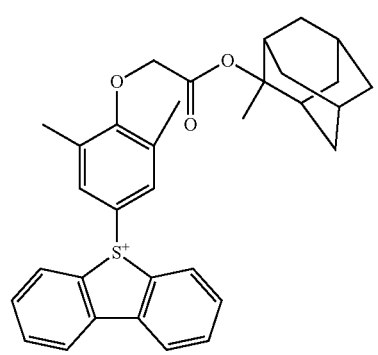

(b1-2-4)

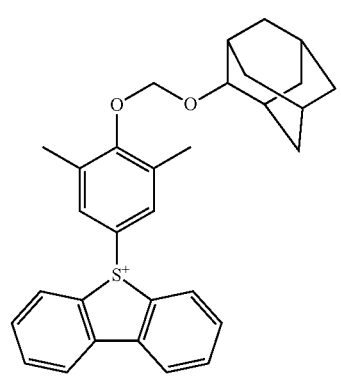

(b1-2-5)

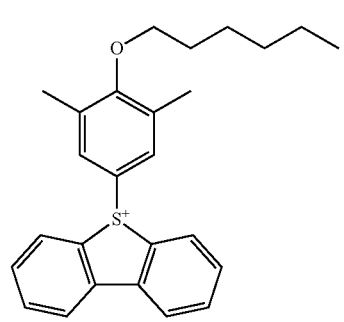

(b1-2-6)

(b1-3-1)

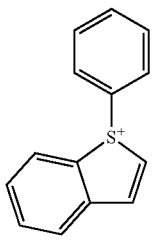

(b1-3-2)

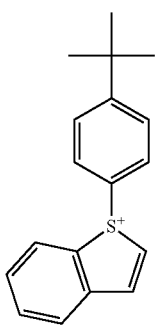

In formulas (b1-4) and (b1-5), each of $R^9$ and $R^{10}$ independently represents a phenyl group or naphthyl group which may have a substituent, an alkyl group of 1 to 5 carbon atoms, an alkoxy group or a hydroxyl group. Examples of the substituent are the same as the substituents described above in relation to the substituted aryl group for $R^{1''}$ to $R^{3''}$ (i.e., an alkyl group, an alkoxy group, an alkoxyalkyloxy group, an alkoxycarbonylalkyloxy group, a halogen atom, a hydroxyl group, an oxo group (=O), an aryl group, —C(=O)—O—$R^{6'}$, —O—C(=O)—$R^{7'}$, —O—$R^{8'}$, and a group in which $R^{56}$ in the aforementioned general formula —O—$R^{50}$—C(=O)—O—$R^{56}$ has been substituted with $R^{56'}$).

$R^{4'}$ represents an alkylene group of 1 to 5 carbon atoms.

u is an integer of 1 to 3, and most preferably 1 or 2.

Preferable examples of the cation represented by the above formula (b1-4) or (b1-5) are shown below.

In the formulas, $R^c$ is the same as the substituents described above in relation to the substituted aryl group (i.e., an alkyl group, an alkoxy group, an alkoxyalkyloxy group, an alkoxycarbonylalkyloxy group, a halogen atom, a hydroxyl group, an oxo group (=O), an aryl group, —C(=O)—O—$R^{6'}$, —O—C(=O)—$R^{7'}$ and —O—$R^{8'}$).

[Chemical Formula 63]

(b1-4-1)

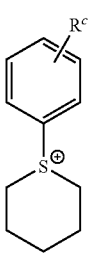

(b1-4-2)

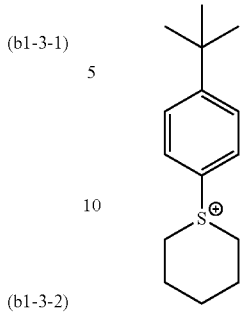

(b1-4-3)

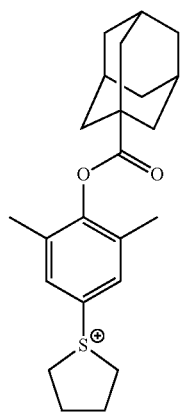

(b1-4-4)

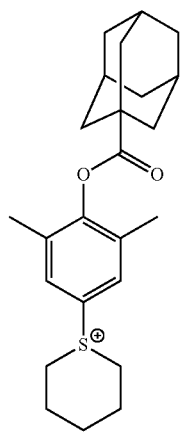

(b1-4-5)

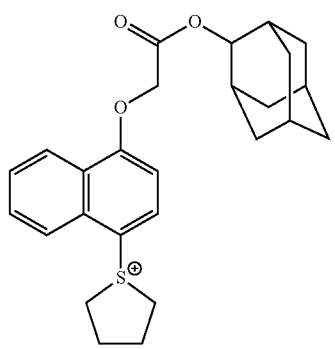

[Chemical Formula 64]

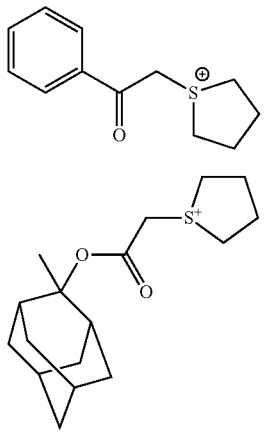

(b1-5-1)

(b1-5-2)

In formula (b-2') above, each of $R^{5'''}$ and $R^{6'''}$ independently represents an aryl group which may have a substituent, an alkyl group or an alkenyl group.

As the aryl group for $R^{5'''}$ and $R^{6'''}$, the same as the aryl groups for $R^{1'''}$ to $R^{3'''}$ can be used.

As the alkyl group for $R^{5'''}$ and $R^{6'''}$, the same as the alkyl groups for $R^{1'''}$ to $R^{3'''}$ can be used.

As the alkenyl group for $R^{5'''}$ and $R^{6'''}$ the same alkenyl groups as those described above for $R^{1'''}$ to $R^{3'''}$ can be used.

At least one of $R^{5'''}$ and $R^{6'''}$ preferably represents an aryl group, and it is particularly desirable that both of $R^{5'''}$ and $R^{6'}$ be aryl groups, as such groups yield superior improvements in the lithography properties and resist pattern shape.

It is particularly desirable that both of $R^{5'''}$ and $R^{6'''}$ represents a phenyl group.

Specific examples of the cations represented by the aforementioned general formula (b-2') include diphenyliodonium and bis(4-tert-butylphenyl)iodonium.

{Compound Represented by Formula (b0-2)}
[Anion Moiety]

In the aforementioned general formula (b0-2), $Z^1$ represents an alkyl group of 1 to 10 carbon atoms which may have a substituent or a fluorinated alkyl group of 1 to 10 carbon atoms which may have a substituent.

The alkyl group or the fluorinated alkyl group preferably has 1 to 8 carbon atoms, and more preferably 1 to 4 carbon atoms. In particular, when $Z^1$ represents a fluorinated alkyl group of 1 to 4 carbon atoms, the skeleton of the "$Z^1$—$SO_2$—" group in the formula exhibits an excellent decomposability, as compared to, for example, a perfluoroalkyl chain of 6 to 10 carbon atoms which is relatively persistent. Therefore, the effect of safety in handling in terms of bioaccumulation can also be achieved. Further, the above-mentioned range is also preferable in terms of uniform distribution within the resist film.

In terms of enhancing the strength of the acid generated, $Z^1$ is preferably a fluorinated alkyl group which may have a substituent. The fluorination ratio of the fluorinated alkyl group (percentage (%) of the number of fluorine atoms, based on the total number of fluorine atoms and hydrogen atoms) is preferably from 50 to 100%, more preferably from 80 to 100%, and still more preferably from 85 to 100%.

The alkyl group or fluorinated alkyl group may have a substituent. Examples of substituents include an alkoxy group, a halogen atom other than a fluorine atom, a halogenated alkyl group, a hydroxyl group and an oxygen atom (=O).

The alkoxy group for the substituent is preferably an alkoxy group of 1 to 5 carbon atoms, more preferably a methoxy group, an ethoxy group, a n-propoxy group, an isopropoxy group, a n-butoxy group or a tert-butoxy group, and most preferably a methoxy group or an ethoxy group.

Examples of the halogen atom for the substituent include a chlorine atom, a bromine atom and an iodine atom.

Examples of the halogenated alkyl group for the substituent include groups in which part or all of the hydrogen atoms within the aforementioned alkyl groups has been substituted with the aforementioned halogen atoms.

In the aforementioned general formula (b0-2), $Z^2$ represents a fluorinated alkylene group of 1 to 4 carbon atoms which may have a substituent.

As examples of $Z^2$, the same groups as those described above for $Q^1$ in general formula (b0-1) can be given.

In the aforementioned general formula (b0-2), $Z^3$ represents a single bond or a divalent linking group.

As examples of the divalent linking group for $Z^3$, the same divalent linking groups as those described above for $Y^2$ in general formula (a1-0-2) in connection with the structural unit (a1) can be given, and preferable examples thereof include divalent hydrocarbon groups which may have a substituent and divalent linking groups containing a hetero atom.

As the divalent linking group for the "divalent hydrocarbon group which may have a substituent", an alkylene group or a fluorinated alkylene group is preferred. The alkylene group or fluorinated alkylene group is preferably linear or branched. The alkylene group or fluorinated alkylene group preferably has 1 to 12 carbon atoms, more preferably 1 to 5 carbon atoms, still more preferably 1 to 4 carbon atoms, and most preferably 1 to 3 carbon atoms.

Specific examples of the alkylene groups for $Z^3$ include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

As the fluorinated alkylene group for $Z^3$, the aforementioned alkylene group for $Z^3$ in which a part or all of the hydrogen atoms in the alkylene group have been substituted with fluorine atoms can be used. Specific examples thereof include —$CF_2$—, —$CF_2CF_2$—, —$CF_2CF_2CF_2$—, —CF($CF_3$)$CF_2$—, —CF($CF_2CF_3$)—, —C($CF_3$)$_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2CF_2$—, —CF($CF_2CF_3$)$CF_2$—, —CF($CF_2CF_2CF_3$)—, —C($CF_3$)($CF_2CF_3$)—; —CHF—, —$CH_2CF_2$—, —$CH_2CH_2CF_2$—, —$CH_2CF_2CF_2$—, —CH($CF_3$)$CH_2$—, —CH($CF_2CF_3$)—, —C($CH_3$)($CF_3$)—, —$CH_2CH_2CH_2CF_2$—, —$CH_2CH_2CF_2CF_2$—, —CH($CF_3$)$CH_2CH_2$—, —$CH_2$CH($CF_3$)$CH_2$—, —CH($CF_3$)CH($CF_3$)— and —C($CF_3$)$_2$$CH_2$—.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may be substituted, either with atoms other than hydrogen atoms and fluorine atoms, or with groups.

Examples of substituents which the alkylene group or fluorinated alkylene group may have include an alkyl group of 1 to 4 carbon atoms, an alkoxy group of 1 to 4 carbon atoms, and a hydroxyl group.

As the divalent linking group for the "divalent linking group containing a hetero atom", divalent linking groups containing at least an oxygen atom as a hetero atom are preferred.

As the examples of divalent linking groups containing at least an oxygen atom, the same as those described above for $Q^2$ in the aforementioned formula (b0-1) can be given, and preferable examples thereof include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate group (—O—C(=O)—O—); and combinations of the aforementioned non-hydrocarbon, oxygen atom-containing linking groups with an alkylene group or fluorinated alkylene group.

Examples of the combinations of the aforementioned non-hydrocarbon, oxygen atom-containing linking groups with an alkylene group or fluorinated alkylene group include —$R^{101}$—O—, —O—$R^{102}$—O—C(=O)—, —C(=O)—O—$R^{103}$—, —C(=O)—O—$R^{104}$—O—, —C(=O)—O—$R^{105}$—O—C(=O)—, —$R^{106}$—C(=O)—O—$R^{107}$—O—, $R^{108}$—C(O)—O—$R^{109}$—O—C(=O)— (in the formulas, each of $R^{101}$ to $R^{109}$ independently represents an alkylene group or an fluorinated alkylene group). In the formulas, as the alkylene group and fluorinated alkylene group for $R^{101}$ to $R^{109}$, the same alkylene groups and fluorinated alkylene groups as those described above for $R^{9a}$ to $R^{9k}$ in connection with $Q^2$ can be used.

As $Z^3$, a single bond, an alkylene group, a fluorinated alkylene group or a divalent linking group containing an ether bond is preferable, and a single bond, an alkylene group or —$R^{101}$—O— is more preferable.

Of these, a fluorinated alkylene group is preferable, and a fluorinated alkylene group in which the carbon atom bonded to the adjacent sulfur atom is fluorinated is particularly desirable. As a result, an acid having a high acid strength is generated from the component (B1) upon exposure. Consequently, a resist pattern with an excellent shape can be formed, and various lithography properties such as EL margin and the like can also be improved.

Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—. Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

Furthermore, the acid strength of the acid generated upon exposure can be controlled by adjusting the number of fluorine atoms within $Z^3$. When the carbon atom is not fluorinated, although the acid strength becomes weak, improvements in roughness and the like can be expected.

In the aforementioned general formula (b0-2), $Z^4$ represents a monovalent organic group.

The organic group is not particularly limited, and examples thereof include a hydrocarbon group which may have a substituent. The hydrocarbon group preferably has 1 to 30 carbon atoms, and more preferably 3 to 30 carbon atoms. The hydrocarbon group may have a divalent linking group containing a hetero atom inserted within the carbon chain at an arbitrary position or may have the hydrogen atom substituted with a substituent.

As the "divalent linking group containing a hetero atom" which may be inserted at an arbitrary position within the carbon chain of the hydrocarbon group, the same groups as those described above in connection with $Z^3$ can be used.

Examples of the substituent which may be substituting the hydrogen atom of the hydrocarbon group include the same substituents as those described above for substituting the hydrogen atom of the aromatic hydrocarbon group in connection with $Q^3$ in formula (b0-1). More specific examples include an alkyl group, a halogen atom, an alkoxy group, a hydroxyl group, —C(=O)—$R^{80}$ [$R^{80}$ represents an alkyl group], —COOR$^{81}$ [$R^{81}$ represents a hydrogen atom or an alkyl group], —OC(=O)—$R^{82}$ [$R^{82}$ represents a hydrogen atom or an alkyl group], a halogenated alkyl group, a halogenated alkoxy group, a hydroxyalkyl group, an oxygen atom (=O), a sulfur atom, a sulfonyl group (SO$_2$), a nitrogen-containing hydrocarbon group and other nitrogen-containing substituents.

The hydrocarbon group may be either an aliphatic hydrocarbon group or an aromatic hydrocarbon group.

As the aromatic hydrocarbon group, a hydrocarbon group having an aromatic hydrocarbon ring can be used.

Specific examples of the aromatic hydrocarbon group include the same aromatic hydrocarbon groups as those described above in connection with $Q^3$ in formula (b0-1).

The aliphatic hydrocarbon group may be either a saturated aliphatic hydrocarbon group, or an unsaturated aliphatic hydrocarbon group. Further, the aliphatic hydrocarbon group may be any one of linear, branched or cyclic group, or may be a combination of these groups.

As the aliphatic hydrocarbon group for $Z^4$, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group. Among the above-mentioned examples, as the unsaturated hydrocarbon group, a propenyl group is particularly desirable.

As the aliphatic cyclic group, the same aliphatic cyclic groups as those described above in connection with $Q^3$ in formula (b0-1) can be used.

Of the various possibilities described above, as $Z^4$, a cyclic group which may have a substituent or a linear or branched aliphatic hydrocarbon group which may have a substituent is preferable, and a cyclic group which may have a substituent is more preferable. The cyclic group may be either an aromatic cyclic group or an aliphatic cyclic group, and an aliphatic cyclic group is preferable.

As the aromatic cyclic group, a naphthyl group which may have a substituent, or a phenyl group which may have a substituent is preferable.

The aliphatic cyclic group may be either a monocyclic group or a polycyclic group, but is preferably a polycyclic group.

Preferable examples of the anion ($Z^4$—$Z^3$—$Z^2$—$SO^2$—N—$SO^2$—$Z^1$) for the compound represented by the aforementioned general formula (b0-2) are shown below.

Each of w11 to w16 independently represents an integer of 0 to 3, preferably 0 or 1, and most preferably 0.

Each of v11 to v18 independently represents an integer of 0 to 3, and preferably 0 or 1.

Each u independently represents an integer of 0 to 4, and preferably 0 to 2.

Each g independently represents an integer of 1 to 4, preferably 1 or 2, and most preferably 1.

t represents an integer of 3 to 20, preferably an integer of 3 to 15, and more preferably an integer of 3 to 12.

[Cation Moiety]

In the aforementioned formula (b0-2), $M^+$ is the same as defined for $M^+$ in the aforementioned formula (b0-1).

As the component (B1), one type may be used alone, or two or more types may be used in combination.

In the component (B), the amount of the component (B1) based on the total weight of the component (B) is preferably 1% by weight or more, more preferably 3% by weight or more, still more preferably 5% by weight or more, and may be even 100% by weight. When the amount of the component (B1) is 5% by weight or more, various lithography properties such as the resolution and EL margin are improved satisfactorily, and favorable resist patterns with reduced roughness can also be formed.

The resist composition of the present invention may also contain an acid generator (B2) (hereafter, referred to as

[Chemical Formula 65]

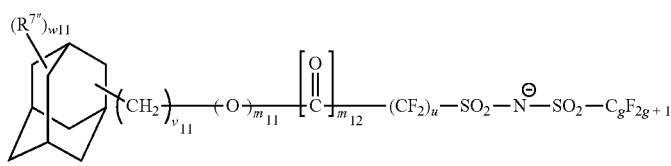

(3a)

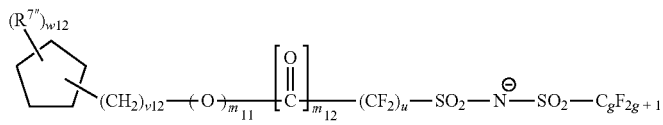

(3b)

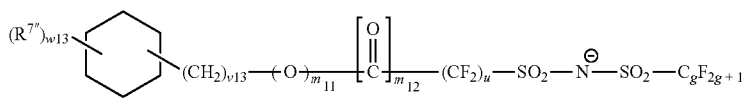

(3c)

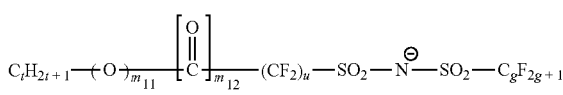

(3d)

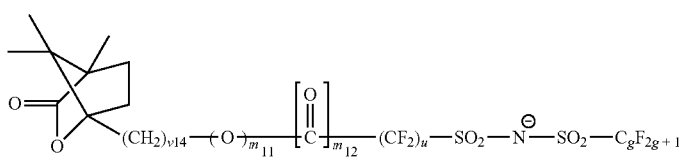

(3e)

In formulas (3a) to (3j), as the substituent for $R^{7''}$, the same substituents as those described above which may substitute the hydrogen atom of the hydrocarbon group in connection with $Z^4$ in formula (b0-2) can be used. If there are two or more of the $R^{7''}$ group, as indicated by the values w11 to w16, then the two or more of the $R^{7''}$ groups may be the same or different from each other.

"component (B2)") which generates acid upon exposure, other than the component (B1), as long as the effects of the present invention are not impaired.

As the component (B2), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; imino sulfonate-based acid generators; and disulfone-based acid generators.

As an onium salt-based acid generator, a compound represented by general formula (b-1) or (b-2) shown below (excluding the compounds represented by the aforementioned general formula (b0-1)) can be used.

[Chemical Formula 67]

In the formulas, each of $R^{1''}$ to $R^{3''}$ independently represents an aryl group which may have a substituent, an alkyl group or an alkenyl group, wherein two of $R^{1''}$ to $R^{3''}$ may be bonded to each other to form a ring with the sulfur atom in the formula; each of $R^{5''}$ and $R^{6''}$ independently represents an aryl group which may have a substituent, an alkyl group or an alkenyl group; and $R^{4''}$ represents an alkyl group, a halogenated alkyl group, an aryl group or an alkenyl group which may have a substituent.

In formula (b-1), $R^{1''}$ to $R^{3''}$ are the same as defined above for $R^{1''}$ to $R^{3''}$ in general formula (b-1') described in connection with the component (B1).

In formula (b-2), $R^{5''}$ and $R^{6''}$ are the same as defined above for $R^{5''}$ and $R^{6''}$ in general formula (b-2') described in connection with the component (B1).

$R^{4''}$ represents an alkyl group, a halogenated alkyl group, an aryl group or an alkenyl group which may have a substituent.

The alkyl group for $R^{4''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratios are preferable, as they result in increased acid strength.

The aryl group for $R^{4''}$ is preferably an aryl group of 6 to 20 carbon atoms.

The alkenyl group for $R^{4''}$ is preferably an alkenyl group of 2 to 10 carbon atoms.

With respect to $R^{4''}$, the expression "may have a substituent" means that part of or all of the hydrogen atoms within the aforementioned alkyl group, halogenated alkyl group, aryl group or alkenyl group may be substituted with substituents (atoms other than hydrogen atoms, or groups).

Examples of substituents include a halogen atom, a hetero atom and an alkyl group.

Examples of halogen atoms and alkyl groups as substituents for $R^{4''}$ include the same halogen atoms and alkyl groups as those described above with respect to the halogenated alkyl group for $R^{4''}$.

Examples of the hetero atom include an oxygen atom, a nitrogen atom, and a sulfur atom.

$R^{4''}$ may have one substituent, or two or more substituents.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalen-1-yl)tetrahydrothiophenium trifluoromethanesulfonate, heptafluoropropanesulfonate or nonafluorobutanesulfonate; 1-(4-ethoxynaphthalen-1-yl)tetrahydrothiophenium trifluoromethanesulfonate, heptafluoropropanesulfonate or nonafluorobutanesulfonate; 1-(4-n-butoxynaphthalen-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has been replaced by an alkylsulfonate such as methanesulfonate, n-propanesulfonate, n-butanesulfonate, n-octanesulfonate, 1-adamantanesulfonate and 2-norbornanesulfonate; a substituted alkylsulfonate such as d-camphor-10-sulfonate; or an aromatic sulfonate such as benzenesulfonate, perfluorobenzenesulfonate or p-toluenesulfonate.

Further, onium salt-based acid generators in which the anion moiety in general formula (b-1) or (b-2) ($R^{4"}SO_3^-$) is replaced by an anion represented by general formula (b-3) or (b-4) shown below (the cation moiety is the same as the cation moiety in the aforementioned formula (b-1) or (b-2)) may also be used (excluding the compounds represented by the aforementioned formula (b0-2)).

[Chemical Formula 68]

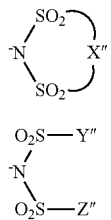

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all the hydrogen atoms are substituted with fluorine atoms.

Further, an onium salt-based acid generator in which the anion moiety ($R^{4"}SO_3^-$) in general formula (b-1) or (b-2) has been replaced with $R^a$—COO⁻ (in the formula, $R^a$ represents an alkyl group or a fluorinated alkyl group) can also be used (the cation moiety is the same as that in general formula (b-1) or (b-2)).

In the formula above, as $R^a$, the same groups as those described above for $R^{4"}$ can be used.

Specific examples of the group represented by the formula "$R^a$—COO⁻" include a trifluoroacetic acid ion, an acetic acid ion, and a 1-adamantanecarboxylic acid ion.

In the present description, an oxime sulfonate-based acid generator is a compound having at least one group represented by general formula (B-1) shown below, and has a feature of generating acid by irradiation (exposure). Such oxime sulfonate-based acid generators are widely used for a chemically amplified resist composition, and can be appropriately selected.

[Chemical Formula 69]

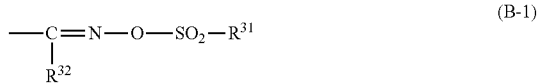

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable.

Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 70]

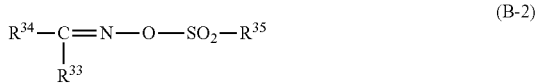

(B-2)

In formula (B-2), $R^{33}$ represents a cyano group, an alkyl group having no substituent, or a halogenated alkyl group; $R^{34}$ represents an aryl group; and $R^{35}$ represents an alkyl group having no substituent, or a halogenated alkyl group.

[Chemical Formula 71]

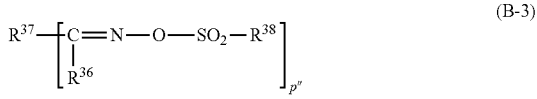

(B-3)

In formula (B-3), $R^{36}$ represents a cyano group, an alkyl group having no substituent, or a halogenated alkyl group; $R^{37}$ represents a divalent or trivalent aromatic hydrocarbon group; $R^{38}$ represents an alkyl group having no substituent, or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

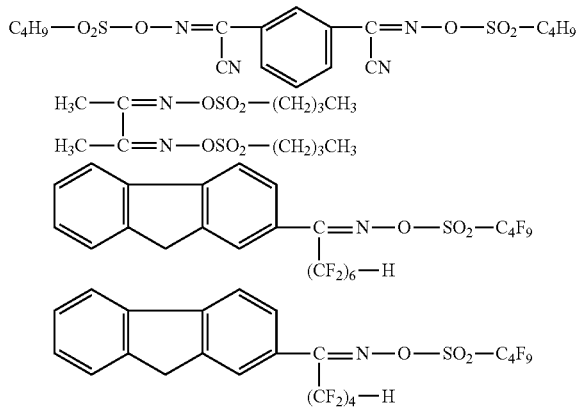

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis (cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

The amount of the component (B) within the resist composition is preferably 0.5 to 80 parts by weight, more preferably 1 to 60 parts by weight, and still more preferably 1 to 50 parts by weight, relative to 100 parts by weight of the component (A). When the amount of the component (B) is within the above-mentioned range, formation of a resist pattern can be satisfactorily performed. Further, by virtue of the above-mentioned range, when each component of the resist composition is dissolved in an organic solvent, a uniform solution can be obtained and the storage stability tends to improve, which is desirable.

<Optional Components>

The resist composition of the present invention may also contain an nitrogen-containing organic compound component (D) (hereafter referred to as the component (D)), other than the aforementioned components (A) and (B).

As the component (D), there is no particular limitation as long as it functions as an acid diffusion control agent, i.e., a quencher which traps the acid generated from the component (B) upon exposure. A multitude of these components (D) have already been proposed, and any of these known compounds may be used. Examples thereof include an aliphatic amine and an aromatic amine. Among these, an aliphatic amine is preferable, and a secondary aliphatic amine or tertiary aliphatic amine is particularly desirable.

An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkyl alcohol amines), and cyclic amines.

The alkyl group present in the alkylamine may be any of linear, branched or cyclic.

When the alkyl group is linear or branched, the number of carbon atoms thereof is preferably 2 to 20, and more preferably 2 to 8.

When the alkyl group is cyclic (i.e., a cycloalkyl group), the number of carbon atoms is preferably 3 to 30, more preferably 3 to 20, still more preferably 3 to 15, still more preferably 4 to 12, and most preferably 5 to 10. The alkyl group may be either a monocyclic group or a polycyclic group. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Further, specific examples of the polycycloalkane include adamantane, norbornane, isobornane, tricyclodecane and tetracyclododecane.

Specific examples of the alkylamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine.

As the alkyl group within the hydroxyalkyl group present in the alkyl alcohol amine, the same alkyl groups as those described above that are present in the alkylamine can be used.

Specific examples of the alkyl alcohol amines include diethanolamine, triethanolamine, diisopropanolamine, triisopropanolamine, di-n-octanolamine, tri-n-octanolamine, stearyldiethanolamine and lauryldiethanolamine.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]—S-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)

ethyl}amine, tris[2-{2-(2-hydroxyethoxy)ethoxy}ethyl] amine and triethanolamine triacetate.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonyl pyrrolidine.

As the component (D), any one of the compounds may be used alone, or two or more types thereof may be used in combination.

In general, the amount of the component (D) in the resist composition is within a range from 0.01 to 10 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added as an optional component.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid, and among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), salicylic acid is particularly desirable.

As the component (E), one type may be used alone, or two or more types may be used in combination.

In general, the amount of the component (E) in the resist composition is within a range from 0.01 to 10 parts by weight, relative to 100 parts by weight of the component (A).

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone;

ketones such as acetone, methyl ethyl ketone, cyclohexanone, methyl-n-pentyl ketone, methyl isopentyl ketone, and 2-heptanone;

polyhydric alcohols, such as ethylene glycol, diethylene glycol, propylene glycol and dipropylene glycol;

compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable);

cyclic ethers such as dioxane;

esters such as methyl lactate, ethyl lactate (EL), methyl acetate, ethyl acetate, butyl acetate, methyl pyruvate, ethyl pyruvate, methyl methoxypropionate and ethyl ethoxypropionate;

and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or as a mixed solvent containing two or more different solvents.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in a range from 1:9 to 9:1, and more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Alternatively, when PGME and cyclohexanone are mixed as the polar solvents, the PGMEA:(PGME+cyclohexanone) weight ratio is preferably from 1:9 to 9:1, more preferably from 2:8 to 8:2, and still more preferably from 3:7 to 7:3.

Further, as the component (S), a mixed solvent of γ-butyrolactone is also preferable, which is obtained by mixing with PGMEA, EL or the aforementioned mixed solvent of PGMEA and a polar solvent. The mixing ratio (former: latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

The above-mentioned resist composition of the present invention exhibits excellent lithography properties such as resolution and exposure latitude (EL margin). Further, resist patterns having an excellent shape with reduced roughness can also be formed.

The reason why these effects can be achieved has not been elucidated yet, but is presumed as follows. By introducing a functional group with appropriate acid strength into the polymer in the component (A), the proton-donating ability can be enhanced, and the counter anion of the component (B) which decomposes upon exposure can be made to function efficiently as an acid. Furthermore, by virtue of the appropriate acid strength, swelling of the resist pattern can also be suppressed. Due to these effects, high resolution patterns with reduced roughness can be obtained while maintaining a high sensitivity.

<<Method of Forming a Resist Pattern>>

The method of forming a resist pattern according to the present invention includes: forming a resist film on a substrate using a resist composition of the present invention; conducting exposure of the resist film; and developing the resist film to form a resist pattern.

The method of forming a resist pattern according to the present invention can be performed, for example, as follows.

Firstly, a resist composition of the present invention is applied onto a substrate using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment.

The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse solution remaining on the pattern can be removed by a treatment using a supercritical fluid.

After the developing treatment or the rinse treatment, drying is conducted. If desired, bake treatment (post bake) can be conducted following the developing. In this manner, a resist pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may also be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used for the developing treatment in a solvent developing process, any of the conventional organic solvents can be used which are capable of dissolving the component (A) (prior to exposure). Specific examples of the organic solvent include polar solvents such as ketone-based solvents, ester-based solvents, alcohol-based solvents, amide-based solvents and ether-based solvents, and hydrocarbon-based solvents.

If required, known additives can be added to the organic developing solution. Examples of the additive include surfactants. The surfactant is not particularly limited, and for example, an ionic or non-ionic fluorine-based and/or silicon-based surfactant can be used.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be conducted using a known developing method. Examples of these methods include a method in which the substrate is immersed in the developing solution for a certain period of time (dipping method), a method in which the developing solution is accumulated by surface tension to remain still at the surface of the substrate for a certain period of time (puddle method), a method in which the developing solution is sprayed onto the surface of the substrate (spraying method), and a method in which the substrate rotating at a constant speed is scanned with a developing-solution ejecting nozzle at a constant speed while the developing solution is continuously ejected therefrom (dynamic dispensing method).

As the organic solvent contained in the rinsing solution used for the rinsing treatment following the developing treatment in a solvent developing process, for example, an organic solvent which hardly dissolves the resist pattern can be appropriately selected for use from amongst the organic solvents listed above as the organic solvents contained in the organic developing solution. In general, at least one type of solvent selected from the group consisting of hydrocarbon-based solvents, ketone-based solvents, ester-based solvents, alcohol-based solvents, amide-based solvents and ether-based solvents is used. Of these, at least one type of solvent selected from the group consisting of hydrocarbon-based solvents, ketone-based solvents, ester-based solvents, alcohol-based solvents and amide-based solvents is preferable; at least one type of solvent selected from the group consist-ing of alcohol-based solvents and ester-based solvents is more preferable; and an alcohol-based solvent is particularly desirable.

The rinse treatment (washing treatment) using a rinse solution can be conducted using a known rinsing method. Examples of these methods include a method in which the rinse solution is continuously applied onto the substrate rotating at a constant speed (rotational coating method), a method in which the substrate is immersed in the rinse solution for a certain period of time (dipping method), and a method in which the rinse solution is sprayed onto the surface of the substrate (spraying method).

EXAMPLES

As follows is a more detailed description of the present invention based on a series of examples, although the scope of the present invention is in no way limited by these examples.

In the following examples, a compound indicated as "(1-3)" in the chemical formula will be designated as "compound (1-3)", and the same applies for compounds represented by other formulas.

In the NMR analysis, the internal standard for $^1$H-NMR and $^{13}$C-NMR was tetramethylsilane (TMS). The internal standard for $^{19}$F-NMR was hexafluorobenzene (provided that the peak of hexafluorobenzene was regarded as −160 ppm).

Monomer Synthesis Example 1

Synthesis of Compound (1-3)

20 g (0.107 mol) of 1-hydroxy-1-methyl-1-naphthylethane and 16.9 g (0.25 mol) of pyridine were added to and stirred in tetrahydrofuran (THF) (300 ml), and 25.8 g (0.215 mol) of methacrylic acid chloride was then dropwise added thereto under ice cooling. After stirring the resulting mixture at room temperature for 10 hours, the resultant was filtered, and the obtained product was separated and purified, thereby yielding a compound (1-3).

The results of instrumental analysis of the obtained compound were as follows.

$^1$H-NMR (400 MHz, CDCl$_3$): δ (ppm)=7.8-7.9 (m, 4H, Hd1, Hd$_2$), 7.53-7.55 (d, 1H, Hd$_1$), 7.48-7.51 (m, 2H, Hd$_3$), 6.2 (s, 1H, Ha), 5.6 (s, 1H, Ha), 1.98 (s, 3H, Hb), 1.96 (s, 6H, Hc).

[Chemical Formula 73]

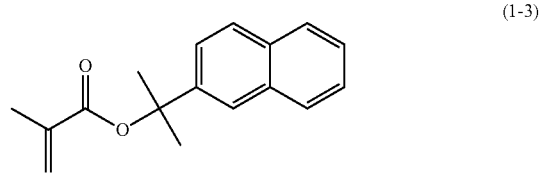

(1-3)

-continued

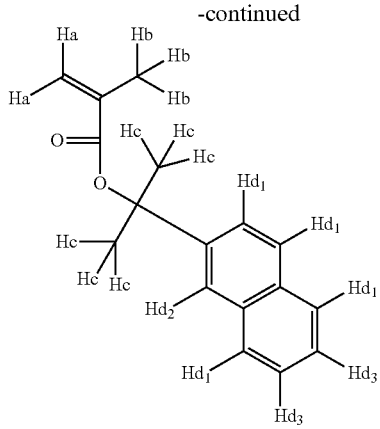

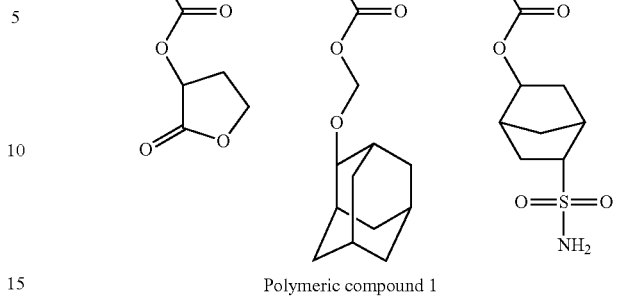

Polymeric compound 1

Polymer Synthesis Examples 1 to 15

Polymeric compounds 1 to 12 and 21 to 23 were synthesized in the same manner as described in the polymer synthesis examples disclosed in Japanese Unexamined Patent Application, First Publication No. 2008-223000 by adjusting the type and charging ratio of monomers. Of these compounds, the synthesis flow of the polymeric compound 1 is shown below. The term "V601" in the formula denotes an initiator manufactured by Wako Pure Chemical Industries, Ltd., and the term "THF" denotes tetrahydrofuran.

With respect to the obtained polymeric compounds, the weight average molecular weight (Mw) and the dispersity (Mw/Mn) were determined by the polystyrene equivalent value as measured by gel permeation chromatography (GPC). Further, the composition of the copolymer as determined by carbon 13 nuclear magnetic resonance spectroscopy (600 MHz, $^{13}$C-NMR) is shown in Table 1.

[Chemical Formula 74]

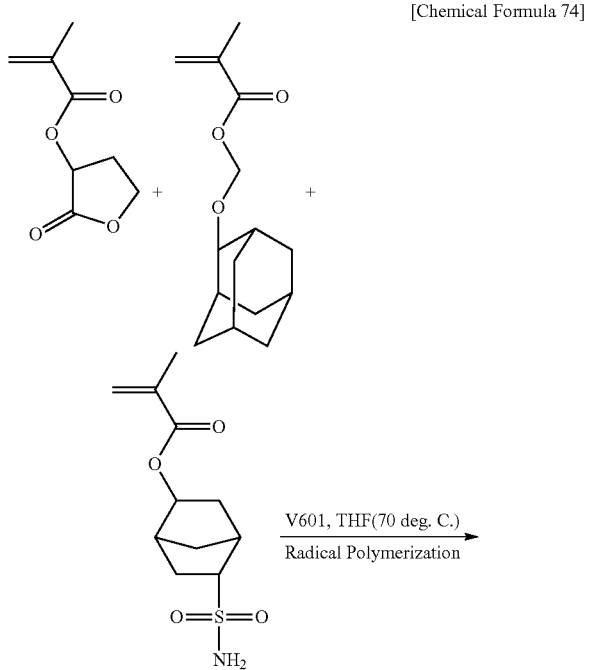

V601, THF(70 deg. C.)
Radical Polymerization

TABLE 1

| Polymer compound | Copolymer composition (molar ratio) | Mw | Mw/Mn |
|---|---|---|---|
| 1 | (2-1)/(1-1)/(0-1) = 40.1/39.9/20.0 | 7,200 | 1.70 |
| 2 | (0-1)/(1-2) = 50.2/49.8 | 11,600 | 2.01 |
| 3 | (2-1)/(1-3)/(0-2) = 40.0/39.9/20.1 | 6,900 | 1.90 |
| 4 | (2-1)/(2-2)/(1-4)/(1-5)/(0-1) = 31.0/26.0/17.8/13.0/12.2 | 7,000 | 1.60 |
| 5 | (2-1)/(2-2)/(1-1)/(0-1) = 35.5/21.0/30.5/13.0 | 7,500 | 1.62 |
| 6 | (2-3)/(1-6)/(1-2)/(0-3) = 50.3/10.0/28.5/11.2 | 6,500 | 1.70 |
| 7 | (2-4)/(1-7)/(1-8)/(0-1) = 39.8/30.1/19.9/10.2 | 6,000 | 1.75 |
| 8 | (2-5)/(1-9)/(0-1) = 39.9/50.1/10.0 | 6,200 | 1.70 |
| 9 | (2-1)/(1-3)/(0-1) = 40.0/39.9/20.1 | 6,900 | 1.90 |
| 10 | (2-1)/(1-10)/(4-1)/(0-1) = 34.9/34.8/12.7/5.6 | 8,000 | 1.82 |
| 11 | (2-2)/(1-11)/(1-4)/(0-1) = 32.5/11.0/45.1/11.4 | 5,600 | 1.65 |
| 12 | (2-6)/(1-12)/(0-1) = 46.3/33.7/20.0 | 7,200 | 1.60 |
| 21 | (2-1)/(1-1)/(3-1) = 40.0/39.6/20.4 | 7,500 | 1.72 |
| 22 | (3-1)/(1-2) = 50.6/49.4 | 10,500 | 2.10 |
| 23 | (2-1)/(1-2) = 51.1/48.9 | 12,100 | 2.04 |

In Table 1, each reference numeral with respect to the copolymer composition indicate the following structural units.

[Chemical Formula 75]

(2-1)

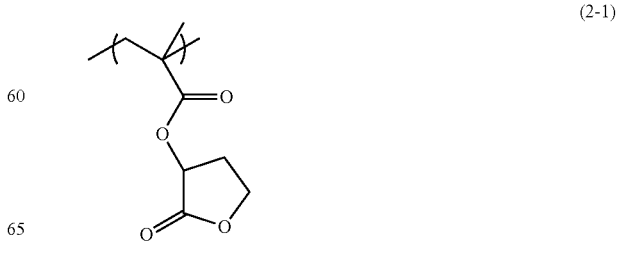

(2-2) 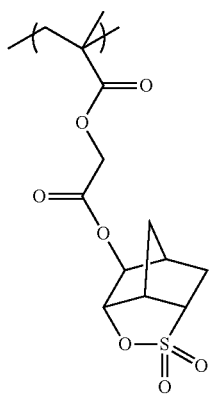
(2-3) 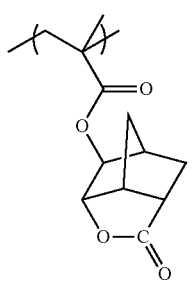
(2-4) 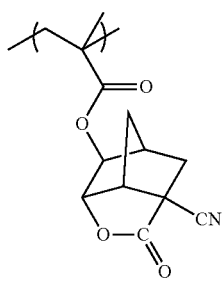
(2-5) 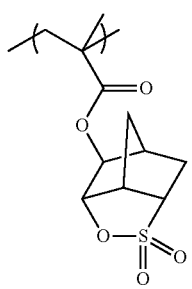
(2-6) 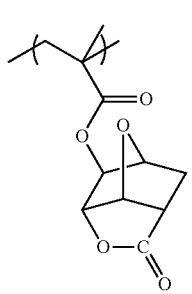
(1-1) 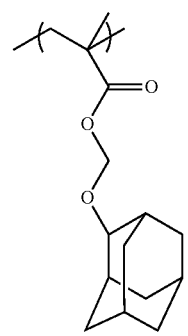
(1-2) 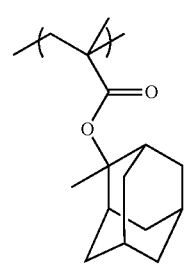
(1-3) 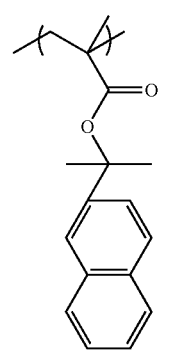
(1-4) 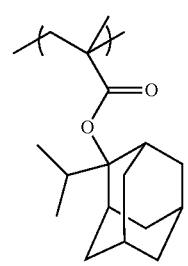
(1-5) 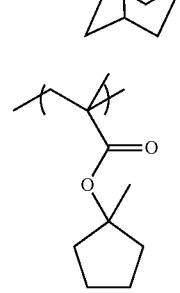

(1-6)
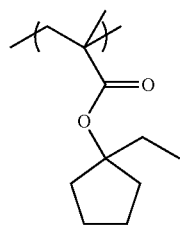
[Chemical Formula 76]
(1-7)
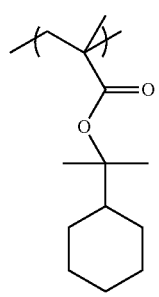
(1-8)
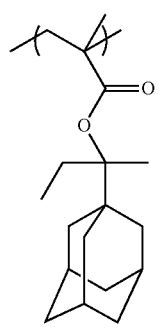
(1-9)
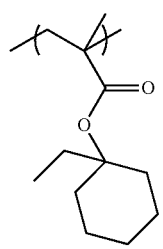
(1-10)
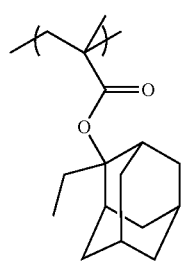
(1-11)
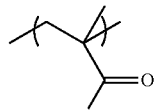
(1-12)
(0-1)
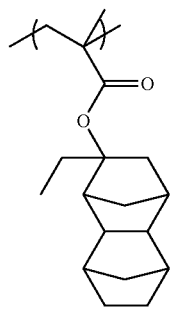
(0-2)
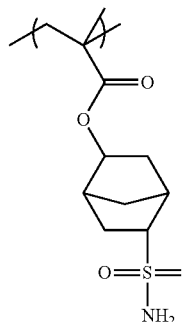
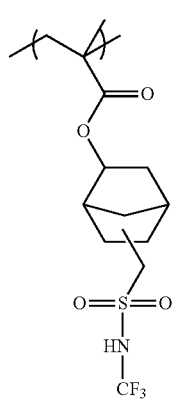

-continued (0-3)

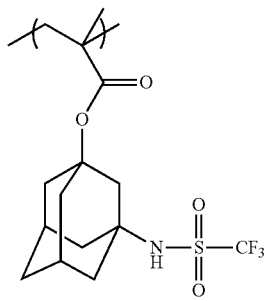

(3-1)

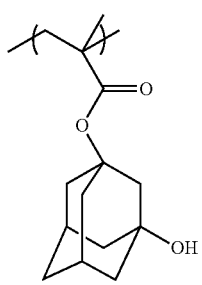

(4-1)

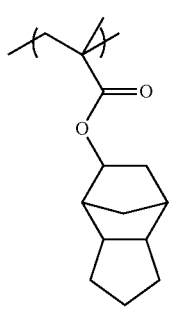

Examples 1 to 15

Comparative Examples 1 to 4

The components shown in Table 4 were mixed together and dissolved to prepare a resist composition.

TABLE 4

| | Component (A) | Component (B) | Other Component (B) | Component (D) | Component (E) | Component (S) | |
|---|---|---|---|---|---|---|---|
| Ex. 1 | (A)-1 [100] | (B)-1 [27.7] | — | (D)-1 [1.5] | (E)-1 [0.6] | (S)-1 [50] | (S)-2 [5,000] |
| Ex. 2 | (A)-2 [100] | (B)-2 [28.0] | — | (D)-1 [1.5] | (E)-1 [0.6] | (S)-1 [50] | (S)-2 [5,000] |
| Ex. 3 | (A)-3 [100] | (B)-1 [27.7] | — | (D)-1 [1.5] | (E)-1 [0.75] | (S)-1 [50] | (S)-2 [5,000] |
| Ex. 4 | (A)-4 [100] | (B)-3 [38.2] | — | (D)-1 [1.5] | (E)-1 [0.6] | (S)-1 [50] | (S)-3 [5,000] |
| Ex. 5 | (A)-5 [100] | (B)-4 [38.6] | — | (D)-1 [1.5] | (E)-1 [0.6] | (S)-1 [50] | (S)-3 [5,000] |
| Ex. 6 | (A)-6 [100] | (B)-5 [30.0] | — | (D)-1 [1.5] | (E)-1 [0.6] | (S)-1 [50] | (S)-3 [5,000] |
| Ex. 7 | (A)-7 [100] | (B)-6 [36.2] | — | (D)-1 [1.5] | (E)-1 [0.6] | (S)-1 [50] | (S)-2 [5,000] |
| Ex. 8 | (A)-8 [100] | (B)-7 [12.0] | (B)-22 [1.4] | — | — | (S)-1 [50] | (S)-3 [5,000] |
| Ex. 9 | (A)-9 [100] | (B)-8 [29.5] | — | (D)-1 [1.5] | (E)-1 [0.6] | (S)-1 [50] | (S)-2 [5,000] |

TABLE 4-continued

| | Component (A) | Component (B) | Other Component (B) | Component (D) | Component (E) | Component (S) | |
|---|---|---|---|---|---|---|---|
| Ex. 10 | (A)-9 [100] | (B)-9 [27.5] | — | (D)-1 [1.5] | (E)-1 [0.6] | (S)-1 [50] | (S)-2 [5,000] |
| Ex. 11 | (A)-9 [100] | (B)-10 [27.6] | (B)-22 [1.4] | — | — | (S)-1 [50] | (S)-2 [5,000] |
| Ex. 12 | (A)-10 [100] | (B)-11 [10.0] | (B)-22 [1.4] | — | — | (S)-1 [50] | (S)-2 [5,000] |
| Ex. 13 | (A)-11 [100] | (B)-2 [28.0] | — | (D)-1 [1.5] | (E)-1 [0.6] | (S)-1 [50] | (S)-2 [5,000] |
| Ex. 14 | (A)-12 [100] | (B)-2 [28.0] | — | (D)-1 [1.5] | (E)-1 [0.6] | (S)-1 [50] | (S)-2 [5,000] |
| Ex. 15 | (A)-1 [100] | (B)-12 [30.0] | — | (D)-1 [1.5] | (E)-1 [0.6] | (S)-1 [50] | (S)-2 [5,000] |
| Comp. Ex. 1 | (A)-21 [100] | (B)-1 [27.7] | — | (D)-1 [1.5] | (E)-1 [0.6] | (S)-1 [50] | (S)-2 [5,000] |
| Comp. Ex. 2 | (A)-1 [100] | — | (B)-21 [25.8] | (D)-1 [1.5] | (E)-1 [0.6] | (S)-1 [50] | (S)-2 [5,000] |
| Comp. Ex. 3 | (A)-22 [100] | (B)-2 [28.0] | — | (D)-1 [1.5] | (E)-1 [0.6] | (S)-1 [50] | (S)-2 [5,000] |
| Comp. Ex. 4 | (A)-23 [100] | (B)-2 [28.0] | — | (D)-1 [1.5] | (E)-1 [0.6] | (S)-1 [50] | (S)-2 [5,000] |

In Table 4, the reference characters indicate the following. Further, the values in brackets [ ] indicate the amount (in terms of parts by weight) of the component added.

(A)-1 to (A)-12: the aforementioned polymeric compounds 1 to 12

(A)-21 to (A)-23: the aforementioned polymeric compounds 21 to 23

(B)-1 to (B)-12: compounds represented by structural formulas (B)-1 to (B)-12 shown below (B)-21: triphenylsulfonium nonafluorobutanesulfonate (B)-22: triphenylsulfonium d-camphor-10-sulfonate (D)-1: tri-n-octylamine (E)-1: salicylic acid (S)-1: γ-butyrolactone (S)-2: a mixed solvent of PGMEA/PGME=3,000/2,000 (weight ratio)

(S)-3: a mixed solvent of PGMEA/PGME/cyclohexanone=2,250/1,500/1,250 (weight ratio)

[Chemical Formula 77]

(B)-1

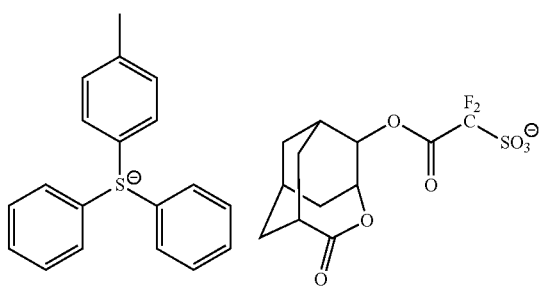

(B)-2
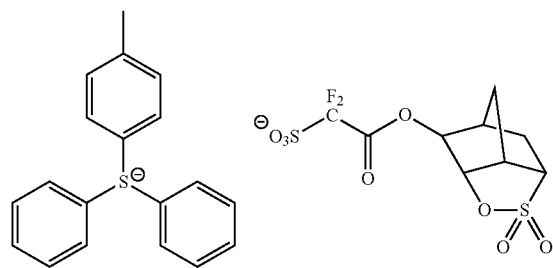
(B)-3
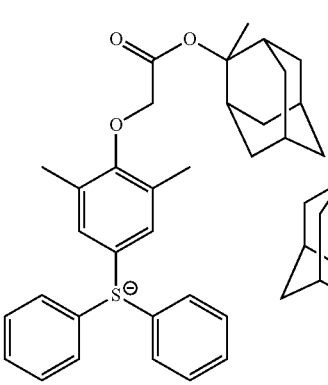
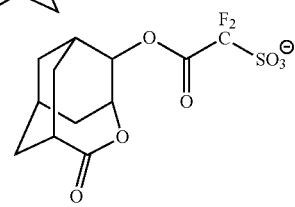
[Chemical Formula 78]
(B)-4
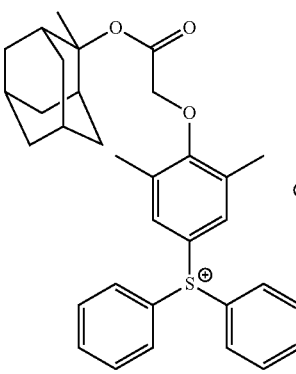
(B)-5
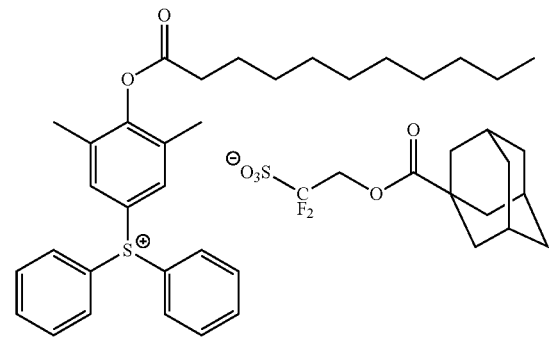
(B)-6
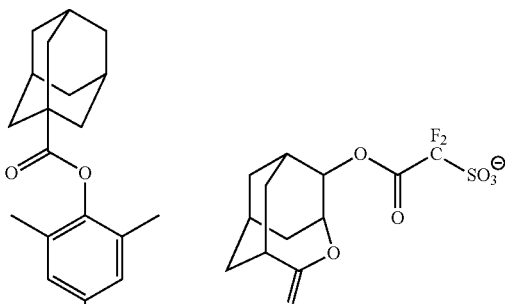
[Chemical Formula 79]
(B)-7
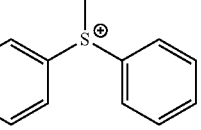
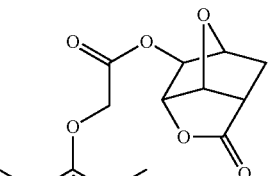
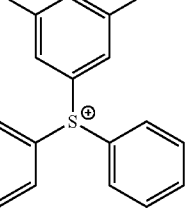
(B)-8
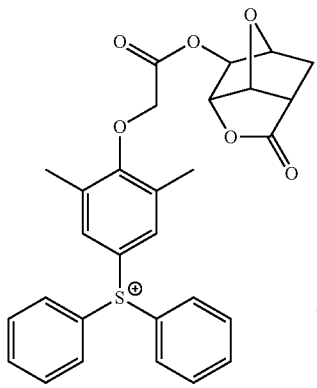
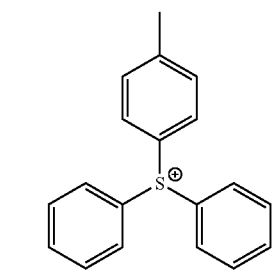
(B)-9
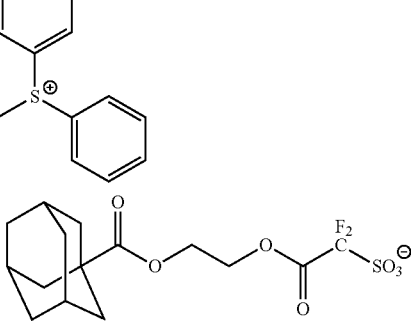
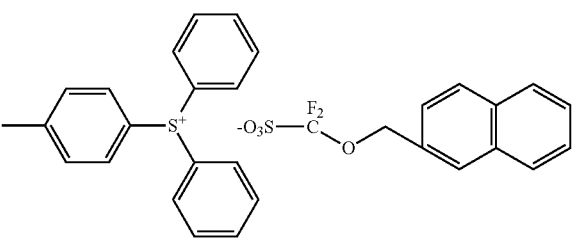

[Chemical Formula 80]

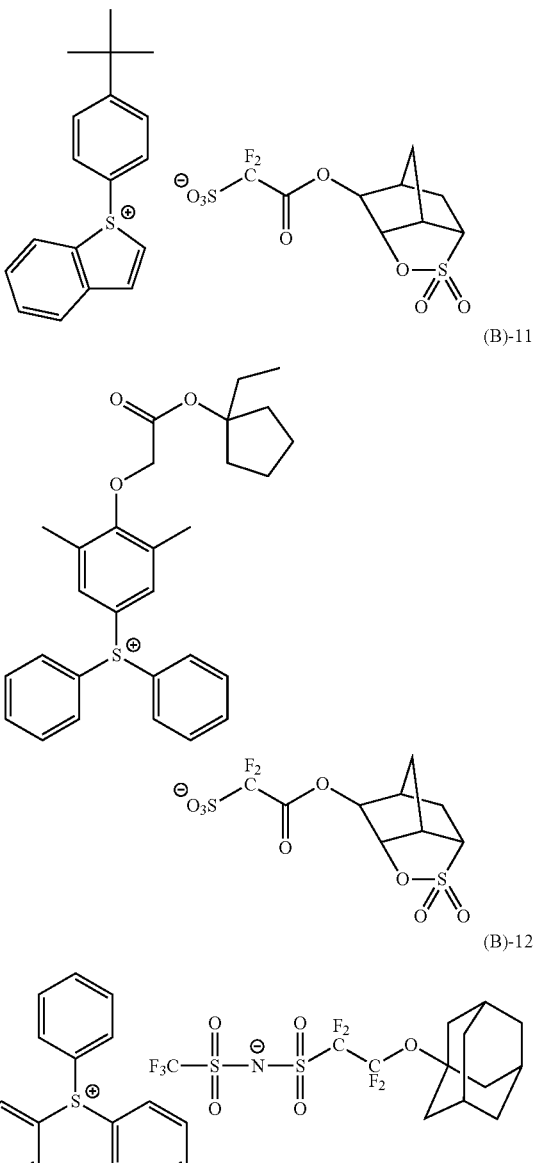

Using the obtained resist compositions, the following evaluations were conducted. The results are shown in Table 5.

[Formation of Resist Pattern]

Using a spinner, each of the resist compositions was uniformly applied onto an 8-inch silicon substrate that had been treated with hexamethyldisilazane (HMDS) at 90° C. for 36 seconds, followed by a bake treatment (PAB) under the PAB conditions (temperature (° C.), time (sec)) indicated in Table 5, thereby forming a resist film with a film thickness of 60 nm. The thus obtained resist film was then subjected to direct patterning (exposure) with an electron beam lithography apparatus HL-800D (VSB) (manufactured by Hitachi, Ltd.) at an acceleration voltage of 70 keV, followed by a bake treatment (PEB) under the PEB conditions (temperature (° C.), time (sec)) indicated in Table 5. The resultant was then developed for 60 seconds at 23° C. in a 2.38% by weight aqueous tetramethylammonium hydroxide (TMAH) solution (product name: NMD-3, manufactured by Tokyo Ohka Kogyo Co., Ltd.).

As a result, in each of the examples, a space and line resist pattern (hereafter, referred to as "SL pattern") with a space width of 100 nm and a pitch of 200 nm was formed.

[Evaluation of Resolving Power]

The optimum exposure dose Eop ($\mu C/cm^2$) at which an SL pattern having a space width of 100 nm and a pitch of 200 nm was formed in the aforementioned "Formation of resist pattern" was determined, and the critical resolution at the above Eop value was also determined.

[Evaluation of Line Width Roughness (LWR)]

With respect to the SL pattern having a space width of 100 nm and a pitch of 200 nm that was formed at the above Eop, the line width was measured at 400 points in the lengthwise direction of the line using a scanning electron microscope (SEM) (product name: S-9220, manufactured by Hitachi High-Technologies Corporation; acceleration voltage: 800V). From the results, the value of 3 times the standard deviation ($\sigma$) (i.e., 3 s) (units: nm) was determined. The smaller this 3 s value is, the lower the level of roughness of the line width, indicating that an SL pattern with a uniform width was obtained.

[Evaluation of Exposure Latitude (EL Margin)]

With respect to the above Eop, the exposure dose that enables formation of an SL pattern with a line width within a range of ±10% from the target dimension of 100 nm (namely, a line width within a range from 90 to 110 nm) was determined, and the exposure latitude (EL) (unit: %) was determined using the following formula.

$$EL\ (\%) = (|E1-E2|/Eop) \times 100$$

[E1 indicates the exposure dose ($\mu/cm^2$) at which an SL pattern with a space width of 110 nm was formed, and E2 indicates the exposure dose ($\mu C/cm^2$) at which an SL pattern with a space width of 90 nm was formed]

The larger the EL value, the smaller the fluctuation in the pattern size accompanied by the variation in the exposure dose.

TABLE 5

|  | PAB/PEB | Eop [$\mu C/cm^2$] | LWR (nm) | EL ± 10% [%] | Resolving power (nm) |
| --- | --- | --- | --- | --- | --- |
| Ex. 1 | 100° C. 60 sec/ 90° C. 60 sec | 50 | 8.9 | 20 | 50 |
| Ex. 2 | 110° C. 60 sec/ 110° C. 60 sec | 54 | 9.5 | 21 | 50 |
| Ex. 3 | 100° C. 60 sec/ 90° C. 60 sec | 48 | 8.0 | 22.5 | 50 |
| Ex. 4 | 110° C. 60 sec/ 90° C. 60 sec | 56 | 6.8 | 26.4 | 50 |
| Ex. 5 | 100° C. 60 sec/ 90° C. 60 sec | 56 | 7.0 | 21.1 | 50 |
| Ex. 6 | 110° C. 60 sec/ 100° C. 60 sec | 42 | 7.5 | 24 | 50 |
| Ex. 7 | 110° C. 60 sec/ 90° C. 60 sec | 60 | 8.2 | 20.8 | 50 |
| Ex. 8 | 110° C. 60 sec/ 90° C. 60 sec | 54 | 7.6 | 23.2 | 50 |
| Ex. 9 | 100° C. 60 sec/ 90° C. 60 sec | 45 | 8.5 | 19.8 | 50 |
| Ex. 10 | 100° C. 60 sec/ 90° C. 60 sec | 44 | 8.6 | 19.6 | 50 |
| Ex. 11 | 100° C. 60 sec/ 90° C. 60 sec | 54 | 8.2 | 23.4 | 50 |
| Ex. 12 | 110° C. 60 sec/ 90° C. 60 sec | 56 | 6.5 | 23.8 | 50 |

TABLE 5-continued

| | PAB/PEB | Eop [μC/cm²] | LWR (nm) | EL ± 10% [%] | Resolving power (nm) |
|---|---|---|---|---|---|
| Ex. 13 | 90° C. 60 sec/ 80° C. 60 sec | 48 | 6 | 22.2 | 50 |
| Ex. 14 | 110° C. 60 sec/ 95° C. 60 sec | 58\ | 7.2 | 24.5 | 50 |
| Ex. 15 | 100° C. 60 sec/ 90° C. 60 sec | 50 | 8.0 | 20.2 | 50 |
| Comp. Ex. 1 | 110° C. 60 sec/ 90° C. 60 sec | 50 | 12 | 16.0 | 70 |
| Comp. Ex. 2 | 110° C. 60 sec/ 90° C. 60 sec | 46 | 10.1 | 15.6 | 500 |
| Comp. Ex. 3 | 110° C. 60 sec/ 110° C. 60 sec | 90 | — | — | 200 |
| Comp. Ex. 4 | 110° C. 60 sec/ 110° C. 60 sec | 46 | 11 | 15.6 | 60 |

As is evident from the results shown above, the resist compositions of Examples 1 to 15 which contained a combination of the components (A1) and (B1) exhibited excellent lithography properties in terms of the resolution and EL values, and the shape of the formed resist pattern was also favorable with minimal roughness.

In contrast, Comparative Examples 1, 3 and 4 which did not contain the component (A1) as the component (A), as well as Comparative Example 2 which did not contain the component (B1) as the component (B), exhibited smaller EL values, inferior resolution, and higher roughness.

What is claimed is:

1. A resist composition comprising:
    a base component (A) that exhibits changed solubility in a developing solution by action of acid; and
    an acid generator component (B) that generates acid upon exposure,
    said base component (A) comprising a resin component (A1) containing a structural unit (a0) represented by general formula (a0-1) shown below; and
    said acid generator component (B) comprises an acid generator (B1) including a compound represented by general formula (b0-1) or (b0-2) shown below:

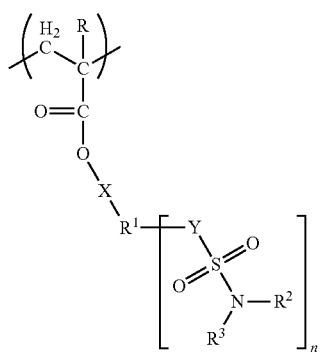
(a0-1)

wherein R represents a hydrogen atom, an alkyl group of 1 to 5 carbon atoms or a halogenated alkyl group of 1 to 5 carbon atoms; X represents a single bond or a divalent linking group; $R^1$ represents a cyclic aliphatic hydrocarbon group with a valency of (n+1) which may contain an oxygen atom or sulfur atom at an arbitrary position, wherein the oxygen atom or the sulfur atom is inserted within the ring skeleton; n represents an integer of 1 to 3; Y represents an alkylene group; and each of $R^2$ and $R^3$ independently represents a hydrogen atom,

(b0-1)

(b0-2)

wherein $Q^1$ represents a fluorinated alkylene group of 1 to 4 carbon atoms which may have a substituent; $Q^2$ represents —O—, —C(=O)—NH—, —C(=O)—, —O—C(=O)—O—, $R^{9a}$—O—, —$R^{9b}$—O—C(=O)—, —O—C(=O)—$R^{9c}$—, —O—$R^{9d}$—O—C(=O)—, —O—$R^{9e}$—O—C(=O)—$R^{9f}$—, —$R^{9g}$—O—C(=O)—$R^{9h}$—, or —C(=O)—O—$R^{9j}$—O—C(=O)—$R^{9k}$—, wherein each of $R^{9a}$ to $R^{9k}$ independently represents an alkylene group; $Q^3$ represents a ring structure-containing hydrocarbon group of 3 to 30 carbon atoms which may have a substituent; $M^+$ represents an organic cation; $Z^1$ represents an alkyl group of 1 to 10 carbon atoms which may have a substituent or a fluorinated alkyl group of 1 to 10 carbon atoms which may have a substituent; $Z^2$ represents a fluorinated alkylene group of 1 to 4 carbon atoms which may have a substituent; $Z^3$ represents a single bond, an alkylene group, a fluorinated alkylene group, —$R^{101}$—O—, —O—$R^{102}$—O—C(=O)—, —C(=O)—O—$R^{103}$—, —C(=O)—O—$R^{104}$—O—, —C(=O)—O—$R^{105}$—O—C(=O)—, —$R^{106}$—C(=O)—O—$R^{107}$—O—, or —$R^{108}$—C(=O)—O—$R^{109}$—O—C(=O)—, wherein each of $R^{101}$ to $R^{109}$ independently represents an alkylene group or an fluorinated alkylene group; and $Z^4$ represents a cyclic group which may have a substituent.

2. The resist composition according to claim 1, wherein said base component (A) is a base component which exhibits increased polarity by action of acid.

3. The resist composition according to claim 1,
    wherein said resin component (A1) further comprises at least one structural unit (a2) selected from the group consisting of a structural unit that contains a —SO₂— containing cyclic group and a structural unit that contains a lactone-containing cyclic group or cyclic carbonate skeleton, and
    said structural unit (a2) may have a hydrogen atom bonded to a carbon atom on the α-position substituted with a substituent.

4. A method of forming a resist pattern, comprising:
    forming a resist film on a substrate using the resist composition of any one of claims 1 to 3;
    conducting exposure of said resist film; and
    developing said resist film to form a resist pattern.

5. The resist composition according to claim 1,
    wherein said resin component (A1) further comprises a structural unit (a1) containing an acid decomposable group that exhibits increased polarity by the action of acid.

6. The resist composition according to claim 5,
    wherein said acid decomposable group is an aromatic polycyclic group-containing tertiary alkyl ester-type acid dissociable group.

* * * * *